US009318707B2

(12) United States Patent
Hattori et al.

(10) Patent No.: US 9,318,707 B2
(45) Date of Patent: Apr. 19, 2016

(54) ORGANIC PHOTOELECTRIC CONVERSION ELEMENT, AND SOLAR CELL AND OPTICAL SENSOR ARRAY EACH USING SAME

(71) Applicant: Konica Minolta, Inc., Tokyo (JP)

(72) Inventors: Takamune Hattori, Tokyo (JP); Yasushi Okubo, Tokyo (JP)

(73) Assignee: KONICA MINOLTA, INC. (JP)

( * ) Notice: Subject to any disclaimer, the term of this patent is extended or adjusted under 35 U.S.C. 154(b) by 9 days.

(21) Appl. No.: 14/358,333

(22) PCT Filed: Nov. 14, 2012

(86) PCT No.: PCT/JP2012/079527
§ 371 (c)(1),
(2) Date: May 15, 2014

(87) PCT Pub. No.: WO2013/073581
PCT Pub. Date: May 23, 2013

(65) Prior Publication Data
US 2014/0319509 A1    Oct. 30, 2014

(30) Foreign Application Priority Data

Nov. 15, 2011    (JP) .................................. 2011-250144

(51) Int. Cl.
*C08G 75/00*       (2006.01)
*H01L 51/00*       (2006.01)
(Continued)

(52) U.S. Cl.
CPC .......... *H01L 51/0043* (2013.01); *C08G 61/123* (2013.01); *C08G 61/126* (2013.01); *H01L 51/0035* (2013.01); *H01L 51/0036* (2013.01); *H01L 51/0094* (2013.01); *C08G 2261/1412* (2013.01); *C08G 2261/3241* (2013.01); (Continued)

(58) Field of Classification Search
CPC ..... H01L 51/0069; H01L 51/43; H01L 51/36; H01L 51/558; C08G 2261/3243; C08G 2261/124; C08G 2261/414; C08G 2261/92; C08G 2261/95; C08G 2261/91; Y02E 10/549
USPC ............ 528/377, 378, 380; 136/263; 257/40, 257/E51.005, E51.024; 313/504; 977/734, 977/948
See application file for complete search history.

(56) References Cited

U.S. PATENT DOCUMENTS

2008/0093985 A1    4/2008    Morishita et al.
2009/0108255 A1    4/2009    Bazan et al.

FOREIGN PATENT DOCUMENTS

EP    2692760 A1    2/2014
JP    2000-282024 A    10/2000
(Continued)

OTHER PUBLICATIONS

International Preliminary Report on Patentability for international patent application No. PCT/JP2012/079527, dated Nov. 14, 2012. English translation attached.
(Continued)

*Primary Examiner* — Shane Fang
(74) *Attorney, Agent, or Firm* — Cantor Colburn LLP

(57) ABSTRACT

An organic photoelectric conversion element which sequentially comprises a transparent first electrode, a photoelectric conversion layer that contains a p-type organic semiconductor material and an n-type organic semiconductor material, and a second electrode in this order on a transparent substrate.

14 Claims, 3 Drawing Sheets

(51) Int. Cl.
*C08G 61/12* (2006.01)
*H01L 51/42* (2006.01)

(52) U.S. Cl.
CPC *C08G2261/3243* (2013.01); *C08G 2261/3246* (2013.01); *C08G 2261/344* (2013.01); *C08G 2261/354* (2013.01); *C08G 2261/414* (2013.01); *C08G 2261/91* (2013.01); *H01L 51/4253* (2013.01); *Y02E 10/549* (2013.01)

(56) References Cited

FOREIGN PATENT DOCUMENTS

| | | |
|---|---|---|
| JP | 2009-146981 | 7/2009 |
| JP | 2011-502363 A | 1/2011 |
| WO | 2007/116750 A1 | 10/2007 |
| WO | 2010/114116 A1 | 10/2010 |
| WO | 2012/133793 A1 | 4/2012 |
| WO | 2012/111811 A1 | 8/2012 |

OTHER PUBLICATIONS

A.J. Heeger et al., "Efficiency enhancement in low-bandgap polymer solar cells by processing with alkane dithiols"; Nature Mat., vol. 6 (2007), p. 497.
C.J. Brabec et al., "Design Rules for Donors in Bulk-Heterojunction Solar Cells—Towards 10% Engergy-Conversion Efficiency"; Advanced Materials 2006, vol. 18, p. 789.
International Search Report for International Application No. PCT/JP2012/079527, date of mailing, Feb. 19, 2013 with English Translation.
Wang et al "Donor-Acceptor Conjugated Polymer Based on Naphtho [1, 2-c:5, 6-c]bis[1,2,5]thiadiazole for High-Performance Polymer Solar Cells; Journal of the American Chemical Society", 2011, 133 (25), pp. 9638-9641.

MEASURED SECTION
(LIGHT RECEPTION SECTION)

ORGANIC PHOTOELECTRIC CONVERSION ELEMENT, AND SOLAR CELL AND OPTICAL SENSOR ARRAY EACH USING SAME

This is the U.S. national stage of application No. PCT/JP2012/079527, filed on 14 Nov. 2012. Priority under 35 U.S.C. §119(a) and 35 U.S.C. §365(b) is claimed from Japanese Application No. 2011-250144, filed 15 Nov. 2011, the disclosure of which is also incorporated herein by reference.

TECHNICAL FIELD

The present invention relates to an organic photoelectric conversion element, and a solar cell and an optical sensor array each using thereof. More particularly, the present invention relates to a bulk heterojunction type organic photoelectric conversion element, and a solar cell and an optical sensor array each using this organic photoelectric conversion element.

BACKGROUND ART

As a result of the steep price rise of fossil energy in recent years, there is a demand for systems that can generate electric power directly from natural energy. Thus, solar cells that use single crystal, polycrystalline or amorphous Si; solar cells of compound systems such as GaAs or CIGS (a semiconductor material comprising copper (Cu), indium (In), gallium (Ga) and selenium (Se)); dye-sensitized photoelectric conversion elements (Graetzel cells), and the like have been proposed and put to practical use.

However, the cost of generating electric power using these solar cells is still higher than the price of electricity generated and transmitted using fossil fuels, and this high cost has been a hindrance to wide distribution of the solar cells. Furthermore, since heavy glass must be used in the substrate, reinforcing works are required at the time of installation, and these also constitute a factor of increasing the power generation cost.

Under such circumstances, a bulk heterojunction type photoelectric conversion element having a photoelectric conversion layer as a mixture of an electron donor layer (p-type semiconductor layer) and an electron receptor layer (n-type semiconductor layer) between a transparent electrode and a counter electrode has been proposed as a solar cell which is capable of achieving a power generation cost that is lower than the power generation cost made by fossil fuels, and it has been reported that the photoelectric conversion element exhibits an efficiency of higher than 5% (see, for example, Non-Patent Literature 1).

In regard to solar cells using these bulk heterojunction type photoelectric conversion elements, since members other than an anode and a cathode can be formed by coating, rapid production at low cost is enabled, and there is a possibility that the problems of power generation cost described above may be solved. Furthermore, unlike the Si-based solar cells, semiconductor-based solar cells, dye-sensitized solar cells and the like, since there is no need for a production process at a temperature higher than 160° C., it is expected that forming a solar cell on an inexpensive and lightweight plastic substrate is also feasible.

However, in addition to the increase of efficiency directed to practicalization, there is also a demand for an enhancement of durability. In regard to such a problem, since it is known that durability is enhanced in a solar cell of a type in which a metal that does not easily cause deterioration of electrodes and the like and has a high work function is used as a counter electrode, and the solar light incident side is used as a cathode (so-called inversion layer solar cell) (see, for example, Patent Literature 1), there is a demand for a material that can exhibit high photoelectric conversion efficiency in an inversion layer configuration.

However, an inversion layer solar cell has a configuration that is disadvantageous from the viewpoint of light utilization, in connection with the fact that a conductive polymer layer having poor light transmissibility is present between a metal electrode and an electricity generating layer. Therefore, it is required from a simulation that the optimal film thickness be larger compared to an ordered layer solar cell (see, for example, Non-Patent Literature 2). Accordingly, there is a demand for a material which generates electricity even in the form of a thick film (approximately 150 nm or more). Many materials exhibit satisfactory efficiency when fabricated into electricity generating layers of thin films (100 nm or less); however, when fabricated into electricity generating layers of thick films (100 nm or more), many materials have decreased fill factors (FF), so that there is a problem that there are very few materials that can achieve high efficiency.

Recently, in Non-Patent Literature 3, it has been reported that power generation can be achieved with an efficiency of 6% by a polymer having a naphthobisthiadiazole group. This report concerns an ordered layer configuration, but it is expected that when an organic thin film solar cell having an inversion layer configuration is produced, a solar cell having a good balance between high photoelectric conversion efficiency and durability would be obtained.

CITATION LIST

Patent Literature

Patent Literature 1: Japanese Patent Application Laid-Open (JP-A) No. 2009-146981

Non-Patent Literature

Non-Patent Literature 1: Nature Mat., Vol. 6 (2007), p. 497, A. Heeger et al.
Non-Patent Literature 2: Adv. Mater. 2006, Vol. 18, p. 789 (C. J. Brabec et al.)
Non-Patent Literature 3: J. Am. Chem. Soc., 2011, 133 (25), pp. 9638-9641

SUMMARY OF INVENTION

Technical Problem

However, durability in an organic thin film solar cell is not determined only by the work function of the electrode material, but the photo-oxidative stability of the electricity generating layer material itself is also involved. Thus, there has been a problem that if the material does not have a HOMO level that is sufficiently deeper than the level of oxygen (−5.3 eV to −5.4 eV), similarly to conventional organic dyes, the material is subjected to photo-oxidative deterioration as a result of being irradiated with light in the presence of oxygen, and the photoelectric conversion efficiency is decreased over time. From this point of view, the naphthobisthiadiazole group-containing polymer described in Non-Patent Literature 3 has a HOMO level of −5.19 eV that is still not sufficiently deep, and durability against photo-oxidation is insufficient.

Another object of the present invention is to provide an organic thin film solar cell having at least one of a high fill factor, a high open circuit voltage and high photoelectric conversion efficiency, and having durability, and an organic semiconductor material that constitutes the organic thin film solar cell.

Solution to Problem

The above-described objects of the present invention can be achieved by the following constitutions.

An organic photoelectric conversion element comprising, on a transparent substrate, a transparent first electrode; a photoelectric conversion layer containing a p-type organic semiconductor material and an n-type organic semiconductor material; and a second electrode in this sequence, wherein the photoelectric conversion layer contains a conjugated polymer compound having a partial structure represented by the following formula (1) as the p-type organic semiconductor material:

[Chemical Formula 1]

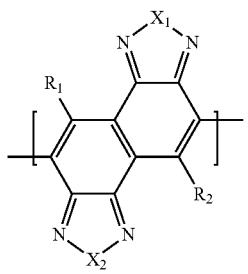

Formula (1)

At this time, $R_1$ and $R_2$ each independently represent a hydrogen atom, an alkyl group having 1 to 30 carbon atoms which may be substituted, an alkoxy group having 1 to 30 carbon atoms which may be substituted, an alkyl ester group having 2 to 30 carbon atoms which may be substituted, a halogen atom, an alkoxycarbonyl group having 2 to 30 carbon atoms which may be substituted, an alkylaminocarbonyl group having 2 to 40 carbon atoms which may be substituted, an acyl group having 2 to 30 carbon atoms which may be substituted, an amino group which may be substituted, an acylamino group having 2 to 30 carbon atoms which may be substituted, an aryl group having 6 to 30 carbon atoms which may be substituted, or a heterocyclic group having 3 to 30 carbon atoms which may be substituted;

$X_1$ and $X_2$ each independently represent:

[Chemical Formula 2]

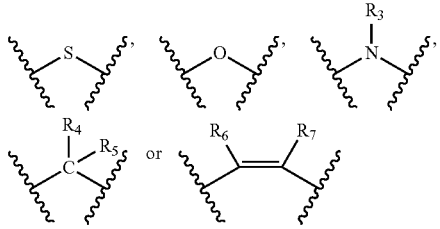

At this time, $R_3$ to $R_7$ each independently represent a hydrogen atom, an alkyl group having 1 to 30 carbon atoms which may be substituted, an alkoxy group having 1 to 30 carbon atoms which may be substituted, an alkyl ester group having 2 to 30 carbon atoms which may be substituted, a halogen atom, an alkoxycarbonyl group having 2 to 30 carbon atoms which may be substituted, an alkylaminocarbonyl group having 2 to 40 carbon atoms which may be substituted, an acyl group having 2 to 30 carbon atoms which may be substituted, an amino group which may be substituted, an acylamino group having 2 to 30 carbon atoms which may be substituted, an aryl group having 6 to 30 carbon atoms which may be substituted, or a heterocyclic group having 3 to 30 carbon atoms which may be substituted; and when $R_6$ and $R_7$ are aryl groups, they may be bonded to each other and form a ring; provided that $X_1$ and $X_2$ do not simultaneously represent:

[Chemical Formula 3]

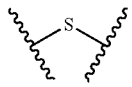

DESCRIPTION OF EMBODIMENTS

Figure 1:
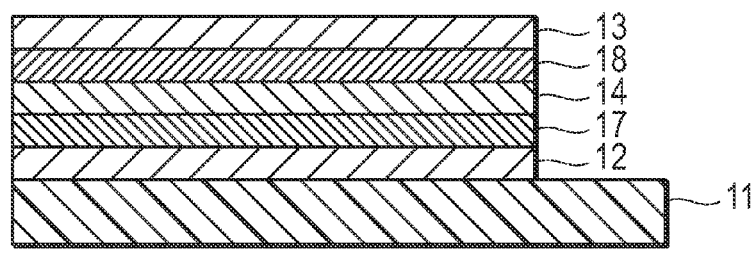
FIG. 1 is a schematic cross-sectional diagram illustrating an example of the configuration of the organic photoelectric conversion element of the present invention.

Hereinbelow, preferred embodiments of the present invention will be described.

The organic photoelectric conversion element of the present invention is such that the photoelectric conversion layer contains a conjugated polymer compound having a partial structure represented by the following formula (1) as a p-type organic semiconductor material. By employing such a configuration, an organic photoelectric conversion element which can achieve high conversion efficiency, has high durability, and can cope with coating processes that enable production at low cost, can be provided.

First, the conjugated polymer compound having a partial structure represented by formula (1) in the present invention will be explained.

Meanwhile, the conjugated polymer compound contains one or two or more of the partial structure represented by formula (1), but when there are two or more of the relevant partial structure, $X_1$, $X_2$, and $R_1$ to $R_7$ in the partial structure may be identical with or different from each other.

In the formula (1), $R_1$ and $R_2$ each independently represent a hydrogen atom, an alkyl group having 1 to 30 carbon atoms which may be substituted, an alkoxy group having 1 to 30 carbon atoms which may be substituted, an alkyl ester group having 2 to 30 carbon atoms which may be substituted, a halogen atom, an alkoxycarbonyl group having 2 to 30 carbon atoms which may be substituted, an alkylaminocarbonyl group having 2 to 40 carbon atoms which may be substituted, an acyl group having 2 to 30 carbon atoms which may be substituted, an amino group which may be substituted, an acylamino group having 2 to 30 carbon atoms which may be substituted, an aryl group having 6 to 30 carbon atoms which may be substituted, or a heterocyclic group having 3 to 30 carbon atoms which may be substituted.

The alkyl group having 1 to 30 carbon atoms is a linear, branched or cyclic alkyl group. There are no particular limitations on the alkyl group having 1 to 30 carbon atoms, but examples include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, a neopentyl group, a 1,2-dimethylpropyl group, an n-hexyl group, an isohexyl group, a 1,3-dimethylbutyl group, a 1-isopropylpropyl group, a 1,2-dimethylbutyl group, an n-heptyl group, a 1,4-dimethylpentyl group, a 3-ethylpentyl group, a 2-methyl-1-isopropylpropyl group, a 1-ethyl-3-methylbutyl group, an n-octyl group, a 2-ethylhexyl group, a 3-methyl-1-isopropylbutyl group, a 2-methyl-1-isopropyl group, a 1-t-butyl-2-methylpropyl group, an n-nonyl group, a 3,5,5-trimethylhexyl group, an n-decyl group, an isodecyl group, an n-undecyl group, a 1-methyldecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, an n-eicosyl group, an n-heneicosyl group, an n-docosyl group, an n-tricosyl group, an n-tetracosyl group, an n-pentacosyl group, an n-hexacosyl group, an n-heptacosyl group, an n-octacosyl group, an n-triacontyl group, a cyclopropyl group, a cyclopentyl group, a cyclohexyl group, a norbornyl group, and an adamantyl group. From the viewpoint of not disrupting the arrangement between polymers while imparting high solubility, a linear or branched alkyl group having 4 to 30 carbon atoms is preferred, and a linear or branched alkyl group having 6 to 20 carbon atoms is more preferred.

Examples of the alkoxy group having 1 to 30 carbon atoms include a methoxy group, an ethoxy group, a propoxy group, an isopropoxy group, a butoxy group, a pentyloxy group, a hexyloxy group, a 2-ethylhexyloxy group, an octyloxy group, a nonyloxy group, a decyloxy group, an undecyloxy group, a dodecyloxy group, a tridecyloxy group, a tetradecyloxy group, a pentadecyloxy group, a hexadecyloxy group, a heptadecyloxy group, an octadecyloxy group, a nonadecyloxy group, an eicosyloxy group, a cyclopentyloxy group, and a cyclohexyloxy group. From the viewpoint of not disrupting the arrangement between polymers while imparting high solubility, an alkoxy group having 4 to 30 carbon atoms is preferred, and an alkoxy group having 6 to 20 carbon atoms is more preferred.

There are no particular limitations on the above alkyl ester group (—OCOR) having 2 to 30 carbon atoms, but examples include a methyl ester group, an ethyl ester group, an n-propyl ester group, an i-propyl ester group, an n-butyl ester group, a 2-methylpropyl ester group, a 1-methylpropyl group, a t-butyl ester group, a pentyl ester group, a hexyl ester group, a heptyl ester group, an octyl ester group, a nonyl ester group, a decyl ester group, an undecyl ester group, and a dodecyl ester group. From the viewpoint of not disrupting the arrangement between polymers while imparting high solubility, an alkyl ester group having 5 to 30 carbon atoms is preferred, and an alkyl ester group having 7 to 20 carbon atoms is more preferred.

There are no particular limitations on the halogen atom, but examples include a fluorine atom, a chlorine atom, a bromine atom, and an iodine atom. From the viewpoint of retaining the planarity of the polymer, a fluorine atom, a chlorine atom and a bromine atom, all of them having small atomic radii, are preferred; a fluorine atom and a chlorine atom are more preferred; and a fluorine atom is even more preferred.

There are no particular limitations on the alkoxycarbonyl group (—COOR) having 2 to 30 carbon atoms, but examples include a methoxycarbonyl group, an ethoxycarbonyl group, an isopropoxycarbonyl group, a tert-butoxycarbonyl group, an n-hexyloxycarbonyl group, an n-octyloxycarbonyl group, an n-decyloxycarbonyl group, an n-hexadecyloxycarbonyl group, a 2-ethylhexyloxycarbonyl group, and a 2-hexyldecyloxycarbonyl group. From the viewpoint of not disrupting the arrangement between polymers while imparting high solubility, an alkoxycarbonyl group having 2 to 30 carbon atoms is preferred; an alkoxycarbonyl group having 2 to 20 carbon atoms is more preferred; and an alkoxycarbonyl group having 6 to 20 carbon atoms is particularly preferred.

There are no particular limitations on the alkylaminocarbonyl group (—CONHR or —CONRR') having 2 to 40 carbon atoms, but examples include a dimethylaminocarbonyl group, a diethylaminocarbonyl group, a diisopropylaminocarbonyl group, a methyl-tert-butylaminocarbonyl group, a dihexylaminocarbonyl group, a dioctylaminocarbonyl group, a didecylaminocarbonyl group, a dihexadecylaminocarbonyl group, a di-2-ethylhexylaminocarbonyl group, and a di-2-hexyldecylaminocarbonyl group. From the viewpoint of not disrupting the arrangement between polymers while imparting high solubility, an alkylaminocarbonyl group having 9 to 40 carbon atoms is preferred, and an alkoxycarbonyl group having 13 to 20 carbon atoms is more preferred.

There are no particular limitations on the acyl group (—COR) having 2 to 30 carbon atoms, but examples include, for example, an acetyl group, a propionyl group, a butyryl group, an isobutyryl group, a tert-butyryl group, a pentanoyl group, a valeryl group, an isovaleryl group, a pivaloyl group, a hexanoyl group, a heptanoyl group, an octanoyl group, a decanoyl group, a dodecanoyl group, a hexadecanoyl group, an octadecanoyl group, a cyclohexanecarbonyl group, a benzoyl group, a 2-ethylhexylcarbonyl group, and a 2-hexyldecylcarbonyl group. From the viewpoint of not disrupting the arrangement between polymers while imparting high solubility, a linear or branched acyl group having 5 to 30 carbon atoms is preferred, and an acyl group having 7 to 30 carbon atoms is more preferred.

There are no particular limitations on the acylamino group (—NHCOR) having 2 to 30 carbon atoms, but examples include an acetamide group, an ethylamide group, and a propylamide group.

There are no particular limitations on the aryl group having 6 to 30 carbon atoms, but examples include non-condensed hydrocarbon groups such as a phenyl group, a biphenyl group, and a terphenyl group; and condensed polycyclic hydrocarbon groups such as a pentalenyl group, an indenyl group, a naphthyl group, an azulenyl group, a heptalenyl group, a biphenylenyl group, a fluorenyl group, an acenaphthylenyl group, a pleiadenyl group, an acenaphthenyl group, a phenalenyl group, a phenanthryl group, an anthryl group, a fluoranthenyl group, an acephenanthrylenyl group, an aceanthrylenyl group, a triphenylenyl group, a pyrenyl group, a chrysenyl group, and a naphthacenyl group.

There are no particular limitations on the heterocyclic group having 3 to 30 carbon atoms, but examples include pyrrolyl, imidazolyl, imidazolidinyl, benzimidazolyl, pyrazolyl, thiazolyl, isothiazolyl, oxazolyl, isoxazolyl, furazanyl, pyridinyl, pyrazinyl, pyrimidinyl, pyridazinyl, furanyl, pyranyl, thienyl, benzothiophenyl, thiopyranyl, isothiochromenyl, thiochromenyl, thioxanthrenyl, thianthrenyl, phenoxathiinyl, pyrrolidinyl, 1H-1-pyrindinyl, indonidinyl, isoindolyl, indolyl, indazolyl, purinyl, quinolidinyl, isoquinolinyl, quinolinyl, naphthyridinyl, phthalazinyl, quinoxalinyl, quinazolinyl, cinnolinyl, pteridinyl, carbazolyl, β-carbolinyl, phenanthridinyl, acridinyl, perimidinyl, phenanthrolinyl, phenazinyl, phenothiazinyl, phenoxazinyl, antidinyl, isobenzofuranyl, benzofuranyl, isochromenyl, chromenyl, xanthenyl, para-thiazinyl, triazolyl, and tetrazolyl.

$R_1$ and $R_2$ are preferably a hydrogen atom, an alkyl group, an alkoxy group, an alkyl ester group, a halogen atom, an alkoxycarbonyl group, an alkylaminocarbonyl group, or an acyl group. These alkyl group, alkoxy group, alkyl ester group, halogen atom, alkoxycarbonyl group, alkylaminocarbonyl group and acyl group may be substituted.

When $R_1$ and $R_2$ represent an alkyl group having 1 to 30 carbon atoms, an alkoxy group having 1 to 30 carbon atoms, an alkyl ester group having 2 to 30 carbon atoms, an alkoxycarbonyl group having 2 to 30 carbon atoms, an alkylaminocarbonyl group having 2 to 40 carbon atoms, an acyl group having 2 to 30 carbon atoms, an amino group, an acylamino group having 2 to 30 carbon atoms, an aryl group having 6 to 30 carbon atoms, or a heterocyclic group having 3 to 30 carbon atoms, examples of the substituent that may be optionally present include an alkyl group, a halogenated alkyl group, an alkenyl group, an alkynyl group, an aryl group, a heteroaryl group, an acyl group, an alkoxycarbonyl group, an (alkyl)amino group, an alkoxy group, a cycloalkyloxy group, an aryloxy group, an aryloxycarbonyl group, an alkyl ester group, an acylamino group, an alkoxycarbonylamino group, an aryloxycarbonylamino group, a sulfonylamino group, a sulfamoyl group, a carbamoyl group, an alkylthio group, an arylthio group, a silyl group, a sulfonyl group, a sulfinyl group, a ureido group, a phosphoric acid amide group, a halogen atom, a hydroxyl group, a mercapto group, a cyano group, a sulfo group, a carboxyl group, a nitro group, a hydroxamic acid group, a sulfino group, a hydrazine group, and an imino group.

Meanwhile, the substituent that is optionally present does not necessarily need to be the same as $R_1$ and $R_2$ to be substituted. For example, when $R_1$ or $R_2$ is an alkyl group, it is not necessary that this alkyl group be further substituted with an alkyl group.

The alkyl group preferably has 1 to 20 carbon atoms, more preferably 1 to 12 carbon atoms, and particularly preferably 1 to 8 carbon atoms, and specific examples include the alkyl groups described above.

The halogenated alkyl group preferably has 1 to 20 carbon atoms, more preferably 1 to 12 carbon atoms, and particularly preferably 1 to 8 carbon atoms, and specific examples include a chloromethyl group, a bromomethyl group, a trifluoromethyl group, a chloroethyl group, a 2,2,2-trichloroethyl group, a bromoethyl group, a chloropropyl group, and a bromopropyl group.

The alkenyl group preferably has 2 to 20 carbon atoms, more preferably 2 to 12 carbon atoms, and particularly preferably 2 to 8 carbon atoms, and examples include vinyl, allyl, 2-butenyl, and 3-pentenyl.

The alkynyl group preferably has 2 to 20 carbon atoms, more preferably 2 to 12 carbon atoms, and particularly preferably 2 to 8 carbon atoms, and examples include propargyl and 3-pentenyl.

The aryl group preferably has 6 to 30 carbon atoms, more preferably 6 to 20 carbon atoms, and particularly preferably 6 to 12 carbon atoms, and specific examples include the aryl groups described above.

The heteroaryl group preferably has 1 to 20 carbon atoms, and more preferably 1 to 12 carbon atoms, and examples of heteroatoms include a nitrogen atom, an oxygen atom, and a sulfur atom. Specific examples include imidazolyl, pyridyl, quinolyl, furyl, piperidyl, benzoxazolyl, benzimidazolyl, benzothiazolyl, and thienyl.

The acyl group preferably has 1 to 20 carbon atoms, more preferably 1 to 16 carbon atoms, and particularly preferably 1 to 12 carbon atoms, and specific examples include the acyl groups described above.

The alkoxycarbonyl group preferably has 2 to 20 carbon atoms, more preferably 2 to 16 carbon atoms, and particularly preferably 2 to 12 carbon atoms, and specific examples include the alkoxycarbonyl groups described above.

The (alkyl)amino group preferably has 0 to 20 carbon atoms, more preferably 0 to 10 carbon atoms, and particularly preferably 0 to 6 carbon atoms, and examples include amino, methylamino, dimethylamino, diethylamino, and dibenzylamino.

The alkoxy group preferably has 1 to 20 carbon atoms, more preferably 1 to 12 carbon atoms, and particularly preferably 1 to 8 carbon atoms, and specific examples include the alkoxy groups described above.

The cycloalkyloxy group preferably has 4 to 8 carbon atoms, and examples include cyclopentyloxy and cyclohexyloxy.

The aryloxy group preferably has 6 to 20 carbon atoms, more preferably 6 to 16 carbon atoms, and particularly preferably 6 to 12 carbon atoms, and examples include phenyloxy and 2-naphthyloxy.

The aryloxycarbonyl group preferably has 7 to 20 carbon atoms, more preferably 7 to 16 carbon atoms, and particularly preferably 7 to 10 carbon atoms, and examples include phenyloxycarbonyl.

The alkyl ester group preferably has 2 to 20 carbon atoms, more preferably 2 to 16 carbon atoms, and particularly preferably 2 to 10 carbon atoms, and specific examples include the alkyl ester groups described above.

The acylamino group preferably has 2 to 20 carbon atoms, more preferably 2 to 16 carbon atoms, and particularly preferably 2 to 10 carbon atoms, and specific examples include the acylamino groups described above.

The alkoxycarbonylamino group preferably has 2 to 20 carbon atoms, more preferably 2 to 16 carbon atoms, and particularly preferably 2 to 12 carbon atoms, and examples include methoxycarbonylamino.

The aryloxycarbonylamino group preferably has 7 to 20 carbon atoms, more preferably 7 to 16 carbon atoms, and particularly preferably 7 to 12 carbon atoms, and examples include phenyloxycarbonylamino.

The sulfonylamino group preferably has 1 to 20 carbon atoms, more preferably 1 to 16 carbon atoms, and particularly preferably 1 to 12 carbon atoms, and examples include methanesulfonylamino and benzenesulfonylamino.

The sulfamoyl group preferably has 0 to 20 carbon atoms, more preferably 0 to 16 carbon atoms, and particularly preferably 0 to 12 carbon atoms, and examples include sulfamoyl, methylsulfamoyl, dimethylsulfamoyl, and phenylsulfamoyl.

The carbamoyl group preferably has 1 to 20 carbon atoms, more preferably 1 to 16 carbon atoms, and particularly preferably 1 to 12 carbon atoms, and examples include carbamoyl, methylcarbamoyl, diethylcarbamoyl, and phenylcarbamoyl.

The alkylthio group preferably has 1 to 20 carbon atoms, more preferably 1 to 16 carbon atoms, and particularly preferably 1 to 12 carbon atoms, and examples include methylthio and ethylthio.

The arylthio group preferably has 6 to 20 carbon atoms, more preferably 6 to 16 carbon atoms, and particularly preferably 6 to 12 carbon atoms, and examples include phenylthio.

The sulfonyl group preferably has 1 to 20 carbon atoms, more preferably 1 to 16 carbon atoms, and particularly preferably 1 to 12 carbon atoms, and examples include mesyl and tosyl.

The sulfinyl group preferably has 1 to 20 carbon atoms, more preferably has 1 to 16 carbon atoms, and particularly preferably 1 to 12 carbon atoms, and examples include methanesulfinyl and benzenesulfinyl.

The ureido group preferably has 1 to 20 carbon atoms, more preferably has 1 to 16 carbon atoms, and particularly preferably 1 to 12 carbon atoms, and examples include ureido, methylureido, and phenylureido.

The phosphoric acid amide group preferably has 1 to 20 carbon atoms, more preferably 1 to 16 carbon atoms, and particularly preferably 1 to 12 carbon atoms, and examples include diethylphosphoric acid amide and phenylphosphoric acid amide.

Examples of the halogen atom include a fluorine atom, a chlorine atom, a bromine atom and an iodine atom.

Meanwhile, these substituents may also be further substituted.

$R_1$ and $R_2$ that are included in one partial structure may be identical with or different from each other, but in consideration of symmetry of the partial structure, it is preferable that $R_1$ and $R_2$ be identical with each other.

In formula (1), $X_1$ and $X_2$ each independently represent:

[Chemical Formula 4]

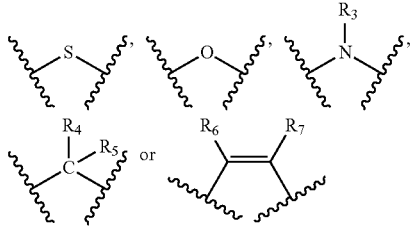

However, $X_1$ and $X_2$ do not simultaneously represent:

[Chemical Formula 5]

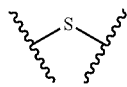

As described above, the naphthobisthiadiazole group-containing polymer described above in Non-Patent Literature 3 has a HOMO level that is still not sufficiently deep such as −5.19 eV, and has insufficient durability against photo-oxidation. The inventors of the present invention found that a naphthobisoxadiazle structure in which oxadiazole is condensed with a naphthalene skeleton represented by the formula (1), a naphthobistriazole structure in which triazole is condensed with the naphthalene skeleton, a naphthobisimidazole structure in which imidazole is condensed with the naphthalene skeleton, a naphthobispyrazine structure in which pyrazine is condensed with the naphthalene skeleton, and the like have deep HOMO levels and narrow band gaps, so that even if these materials are produced into thick films, an element having a high open circuit voltage and a high short circuit current can be obtained. This is thought to be because electron of oxadiazole etc. is more deficient than that of thiadiazole. In addition, when polymer having these structures is used, the inventors found that photoelectric conversion element, and a solar cell of organic thin film having high durability are obtained.

Furthermore, it is preferable that at least one of $X_1$ and $X_2$ represent:

[Chemical Formula 6]

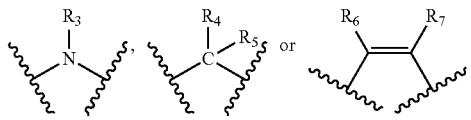

Preferably, $X_1$ and $X_2$ both represent:

[Chemical Formula 7]

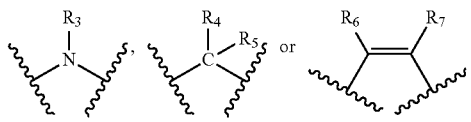

The naphthobisthiadiazole skeleton disclosed in Patent literature 1 is a tetracondensed compound that does not have any functional group, and a polymer containing such a skeleton has problems of having low solubility in organic solvents and exhibiting poor coatability at the time of producing a device. When a polymer has a naphthobistriazole, naphthobisimidazole or naphthobispyrazine skeleton, since the compound has substituents ($R_3$ to $R_7$), solubility in organic solvents is increased. If the solubility in organic solvents is high, when a polymer is synthesized, it is easy to achieve an optimum molecular weight, and it is advantageous in terms of synthesis. Furthermore, since the polymer dissolves in an organic solvent, in a case in which an adjacent layer is an organic solvent-based layer, the polymer can be applied without repelling, and therefore, it is also advantageous in view of device production.

Furthermore, it is more preferable that at least one of $X_1$ and $X_2$ represent:

[Chemical Formula 8]

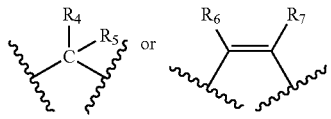

Preferably, $X_1$ and $X_2$ both represent:

[Chemical Formula 9]

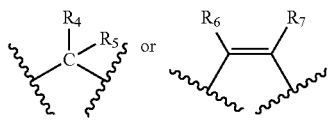

Since the naphthobisimidazole or naphthobispyrazine skeleton can have two substituents ($R_4$ and $R_5$, or $R_6$ and $R_7$), it is preferable because the solubility in organic solvents is increased. When $X_1$ and $X_2$ both have the naphthobisimidazole or naphthobispyrazine skeleton, this effect is exhibited more effectively.

Furthermore, it is preferable that at least one of $X_1$ and $X_2$ represent:

[Chemical Formula 10]

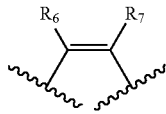

Preferably, $X_1$ and $X_2$ both represent:

[Chemical Formula 11]

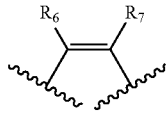

When at least one of $X_1$ and $X_2$ has the naphthobispyrazine skeleton, even higher photoelectric conversion efficiency is obtained. Furthermore, durability is also enhanced. When $X_1$ and $X_2$ both have the naphthobispyrazine skeleton, this effect is exhibited more effectively. It is contemplated that it is because since a pyrazine skeleton does not have sp3 carbon atoms (the carbon atom to which a substituent is bonded is an sp2 carbon atom), the polymer compound can have high planarity, and thereby the polymer compound can acquire high mobility.

$R_3$ to $R_7$ each represent a hydrogen atom, an alkyl group having 1 to 30 carbon atoms which may be substituted, an alkoxy group having 1 to 30 carbon atoms which may be substituted, an alkyl ester group having 2 to 30 carbon atoms which may be substituted, a halogen atom, an alkoxycarbonyl group having 2 to 30 carbon atoms which may be substituted, an alkylaminocarbonyl group having 2 to 40 carbon atoms which may be substituted, an acyl group having 2 to 30 carbon atoms which may be substituted, an amino group which may be substituted, an acylamino group having 2 to 30 carbon atoms which may be substituted, an aryl group having 6 to 30 carbon atoms which may be substituted, or a heterocyclic group having 3 to 30 carbon atoms which may be substituted.

Here, specific examples and suitable ranges of the alkyl group, alkoxy group, alkyl ester group, halogen atom, alkoxycarbonyl group, alkylaminocarbonyl group, acyl group, amino group, acylamino group, aryl group or heterocyclic group, and the substituents that are optionally present in these substituents, are the same as those described in the section concerning $R_1$ and $R_2$.

$R_3$ to $R_7$ are each preferably a hydrogen atom, or an alkyl group, an alkyl ester group or an aryl group, each of which may be substituted, from the viewpoint of the photoelectric conversion efficiency. From the viewpoint of solubility, $R_3$ to $R_7$ are each more preferably an alkyl group, an alkyl ester group, or an aryl group. Even more preferred examples include a linear or branched alkyl group having 4 to 30 carbon atoms, an alkyl ester group having 5 to 30 carbon atoms, and an aryl group having 6 to 12 carbon atoms, each of which may be substituted. Furthermore, from the viewpoint of solubility, $R_3$ to $R_5$ are each particularly preferably a linear or branched alkyl group having 6 to 20 carbon atoms which may be substituted.

Meanwhile, $R_4$ and $R_5$ that are included in one partial structure may be identical with or different from each other, but in consideration of symmetry of the partial structure, it is preferable that $R_4$ and $R_5$ be identical with each other.

Furthermore, from the viewpoint of the photoelectric conversion efficiency, it is preferable that at least one of $R_6$ and $R_7$ be an aryl group having 6 to 30 carbon atoms which may be substituted, or a branched alkyl group having 4 to 30 carbon atoms which may be substituted, and it is more preferable that $R_6$ and $R_7$ be both an aryl group having 6 to 30 carbon atoms which may be substituted, or a branched alkyl group having 4 to 30 carbon atoms which may be substituted. It is speculated that this is because one unit has two soluble groups, and thus the polymer has high solubility. The alkyl group which may be substituted is more preferably a branched alkyl group having 6 to 20 carbon atoms.

Suitable examples of the aryl group in a case where at least one of $R_6$ and $R_7$ is an aryl group having 6 to 30 carbon atoms which may be substituted, include non-condensed hydrocarbon groups such as a phenyl group, a biphenyl group, and a terphenyl group; a pentalenyl group, an indenyl group, a naphthyl group, an azulenyl group, a heptalenyl group, a biphenylenyl group, a fluorenyl group, an acenaphthylenyl group, a pleiadenyl group, an acenaphthenyl group, a phenalenyl group, a phenanthryl group, an anthryl group, a fluoranthenyl group, an acephenanthrylenyl group, an aceanthrylenyl group, a triphenylenyl group, a pyrenyl group, a chrysenyl group, and a naphthacenyl group, and a phenyl group is more preferred. Furthermore, when $R_6$ and $R_7$ represent aryl groups, the aryl groups may be bonded to each other and form a ring. For instance, as in the case of A412 described below, a form in which $R_6$ and $R_7$ represent biphenyl-2,2'-diyl groups may be mentioned. As such, when $R_6$ and $R_7$ are bonded to each other and form a ring, the conjugated polymer compound as a whole can retain high planarity.

Furthermore, from the viewpoint of increasing the open circuit voltage, it is preferable that $R_6$ and $R_7$ both preferably represent a substituent substituted with a halogen atom, a halogenated alkyl group having 1 to 20 carbon atoms, a cyano group, an acyl group having 2 to 20 carbon atoms or a nitro group; more preferably an aryl group substituted with a halogen atom, a halogenated alkyl group, a cyano group, an acyl group having 2 to 20 carbon atoms or a nitro group; and more preferably a phenyl group substituted with a halogen atom, a halogenated alkyl group, a cyano group, an acyl group having 2 to 20 carbon atoms or a nitro group. It is speculated that when an electron-withdrawing group such as a halogen atom, a halogenated alkyl group, a cyano group, an acyl group or a nitro group is introduced, the HOMO level of the compound is deepened, and also, as the band gap is narrowed, the open circuit voltage is increased.

When the phenyl group is substituted with a halogen atom, a halogenated alkyl group, a cyano group, an acyl group or a nitro group, the number of substituents is not particularly limited, and is 1 to 5; however, the number of substituents is preferably 1 to 3, more preferably 1 or 2, and even more preferably 1. Furthermore, the position of substitution of the substituent is not particularly limited, but it is preferable that the relevant substituent be present at least at the para-position.

Examples of the halogen atom, halogenated alkyl group or acyl group include the specific examples of the halogen atom, halogenated alkyl group or acyl group described in the section concerning $R_1$ and $R_2$.

Meanwhile, $R_6$ and $R_7$ included in one partial structure may be identical with or different from each other, but in consideration of symmetry of the partial structure, it is preferable that $R_6$ and $R_7$ be identical with each other.

Specific examples of the partial structure represented by formula (1) of the present invention will be listed below, but not limited to these.

[Chemical Formula 12]

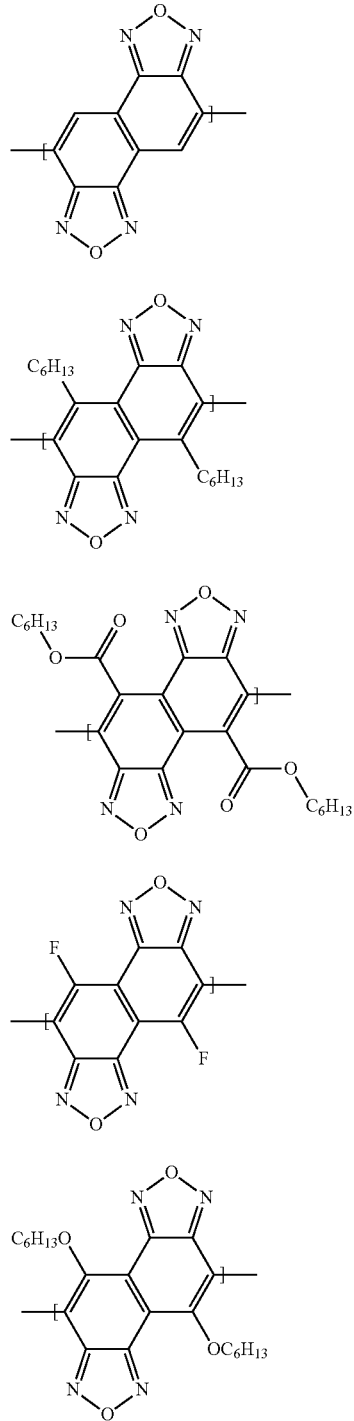

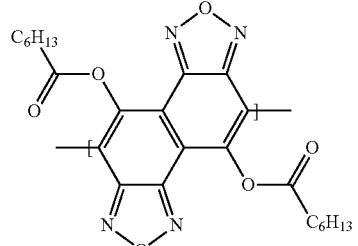

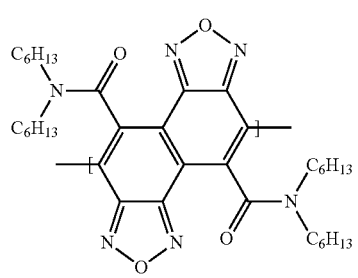

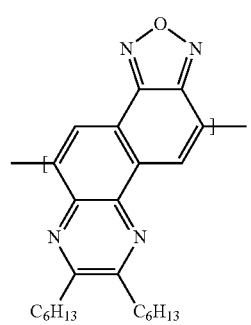

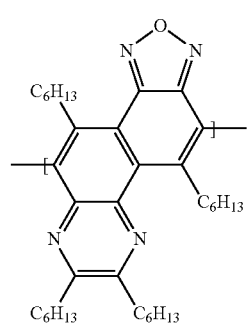

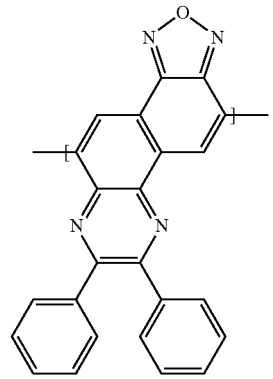

-continued
A104
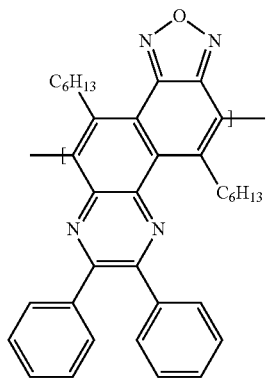
A105
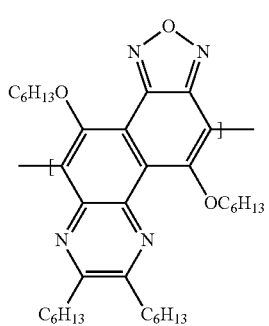
A106
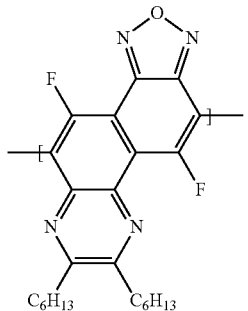
A107
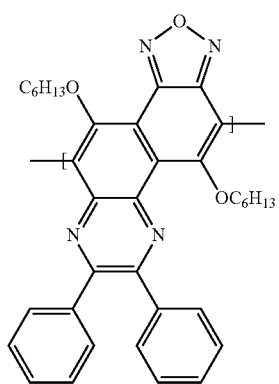
-continued
A108
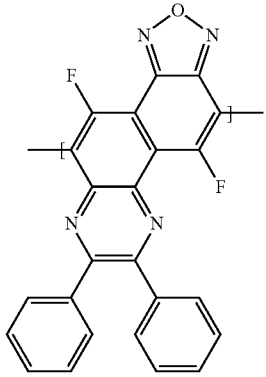
[Chemical Formula 13]
A109
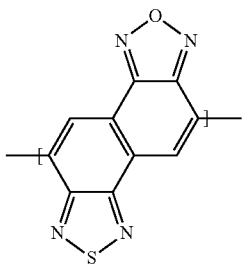
A110
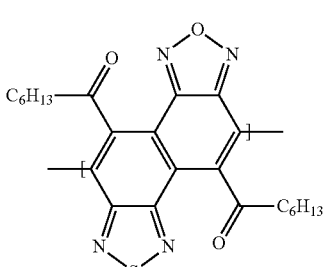
A111
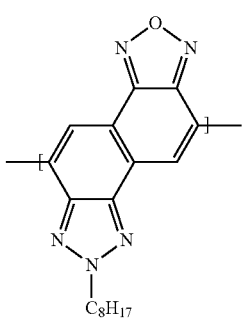
A112
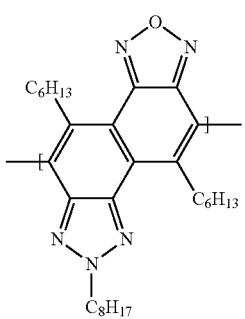

-continued
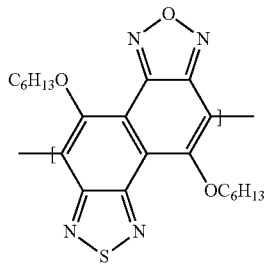
A113
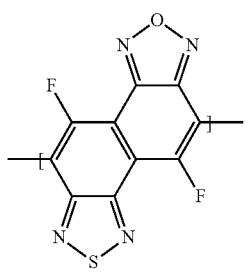
A114
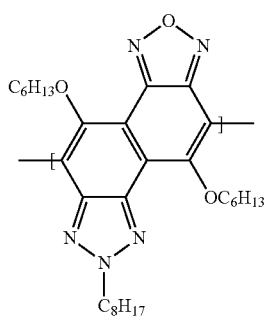
A115
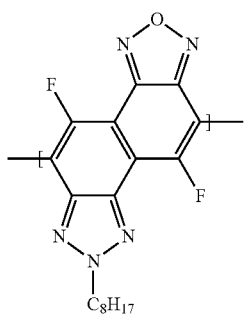
A116
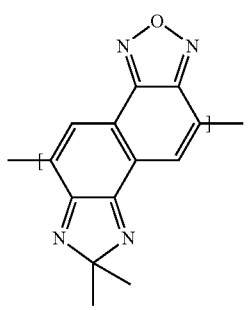
A117
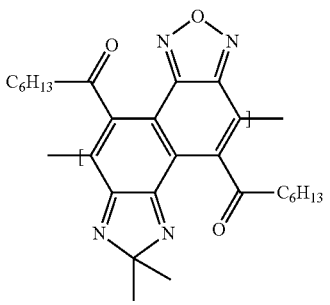
A118
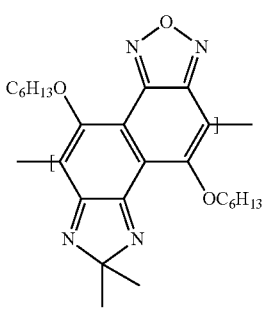
A119
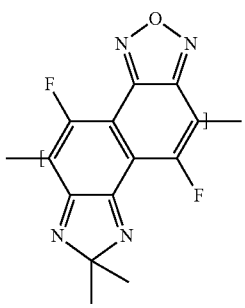
A120
[Chemical Formula 14]
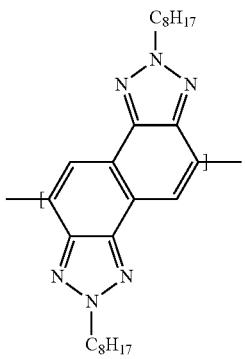
A201

-continued
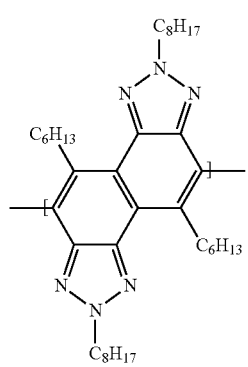
A202
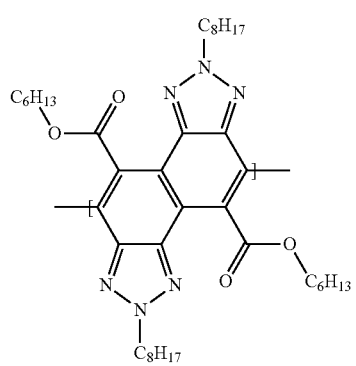
A203
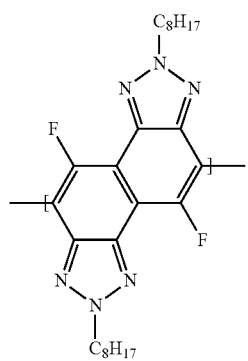
A204
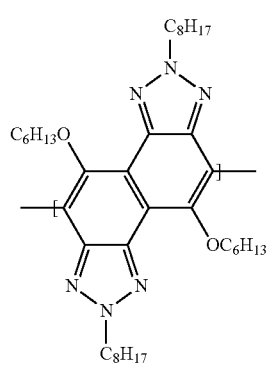
A205
-continued
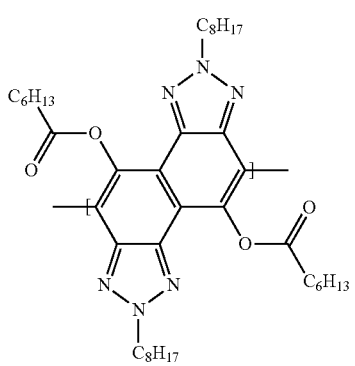
A206
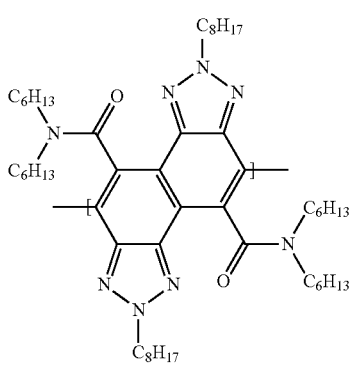
A207
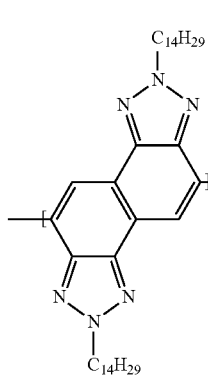
A201'
[Chemical Formula 15]
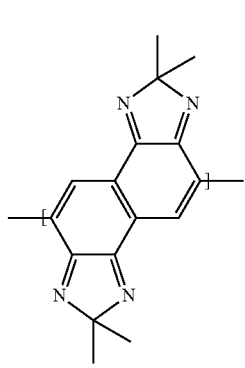
A301

-continued
A302
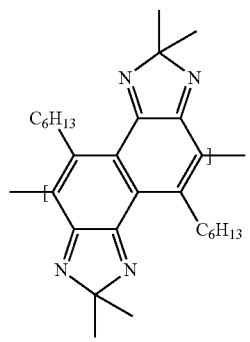
A303
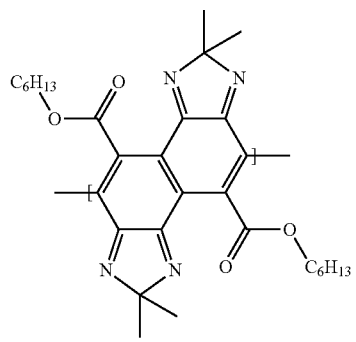
A304
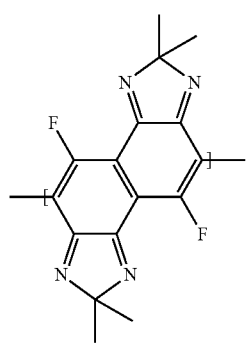
A305
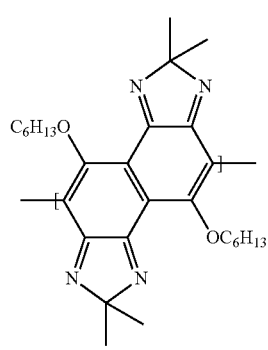
-continued
A306
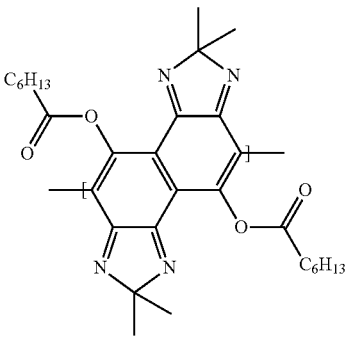
A307
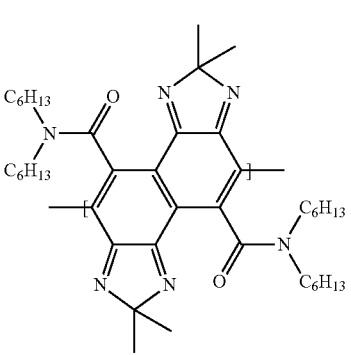
A308
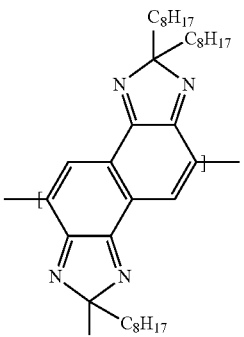
A309
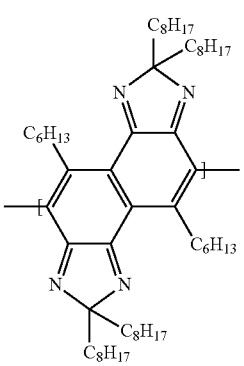

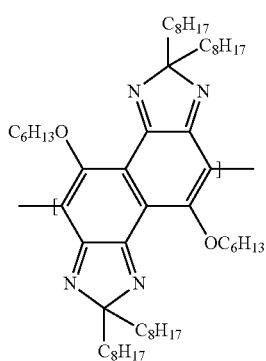 A310
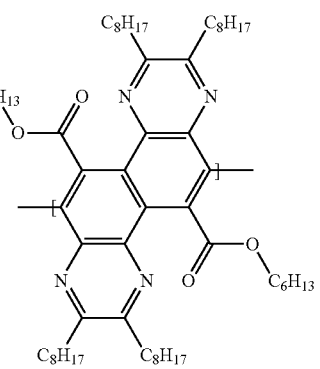 A403
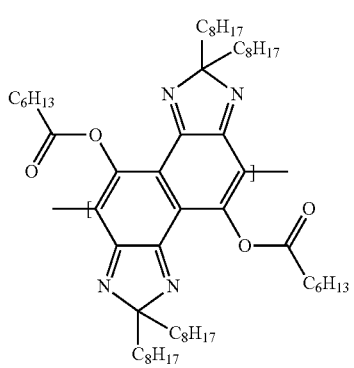 A311
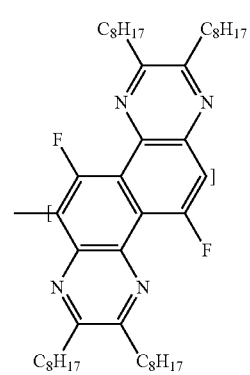 A404
[Chemical Formula 16]
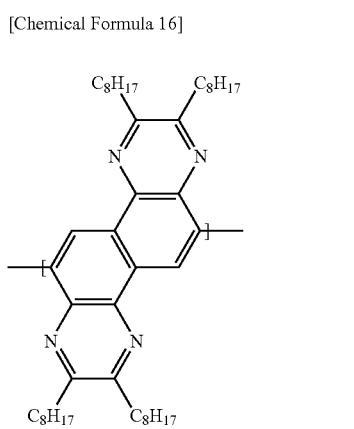 A401
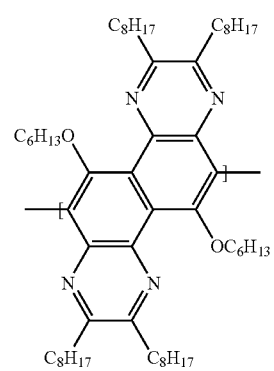 A405
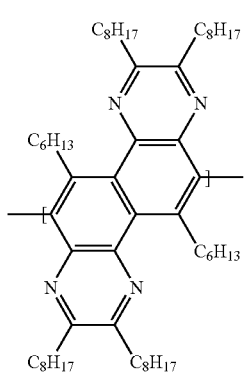 A402
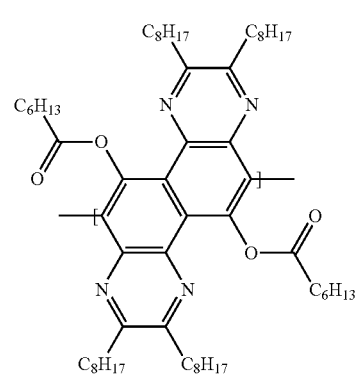 A406

A407 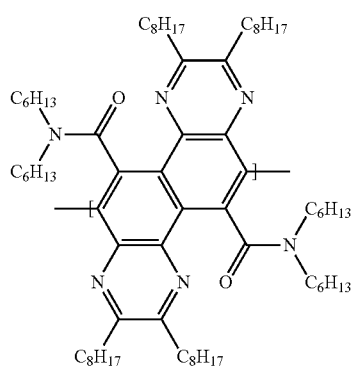
A408 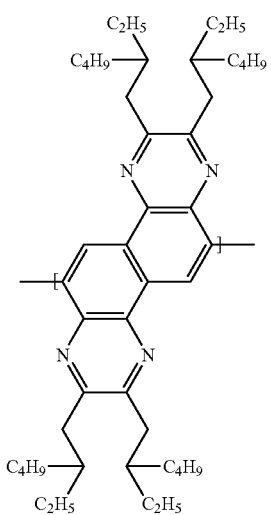
A409 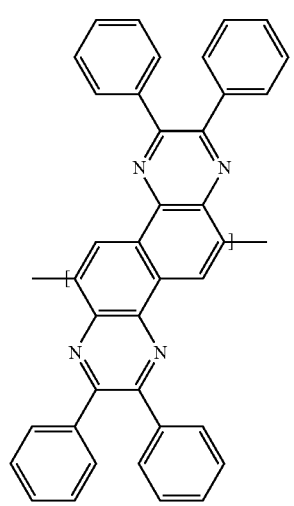
A410 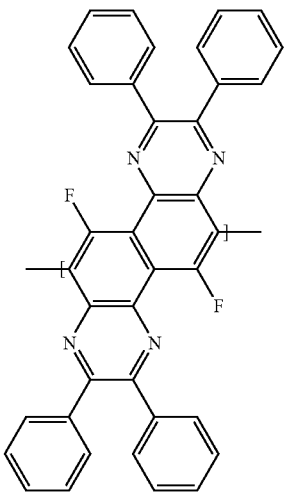
A411 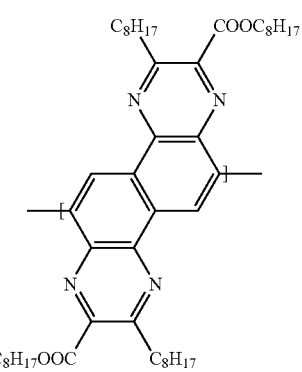
A412 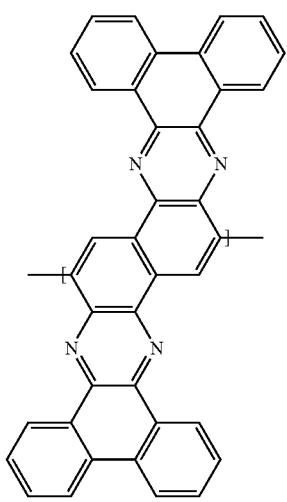

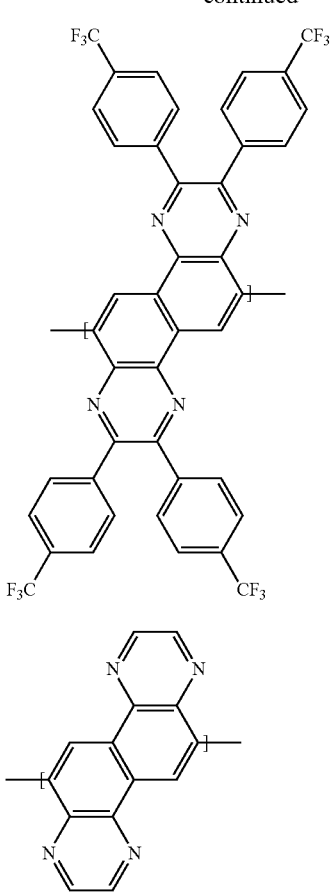

A413

A414

Meanwhile, the structure of formula (1) is a structure that is generally referred to as an acceptor, and when the structure is bound with a unit which functions as a donor, a material having a narrowband gap, that is, a material capable of absorbing sunlight highly efficiently even to longer wavelengths, is obtained.

However, in order to achieve higher photoelectric conversion efficiency, it is preferable that the proportion of the partial structure represented by formula (1) among the acceptor-like units that are included in the conjugated polymer compound be higher. Specifically, it is preferable that the number of the partial structures represented by formula (1) relative to the total number of acceptor-like units included in the conjugated polymer compound be 50% or more, more preferably 70% or more, even more preferably 90% or more, particularly preferably 95% or more, and most preferably 100%.

Regarding the donor-like unit that is included in the donor-like unit group that can be included in the conjugated polymer compound, any unit having a LUMO level or HOMO level that is shallower than that of a hydrocarbon aromatic ring (benzene, naphthalene, anthracene or the like) having the same number of π electrons can be used without any limitations. Examples include units containing 5-membered heterocyclic rings such as a thiophene ring, a furan ring, a pyrrole ring, cyclopentadiene and silacyclopentadiene; and fused rings thereof.

More preferred examples include structures containing 5-membered heterocyclic rings such as a thiophene ring, a furan ring, a pyrrole ring, cyclopentadiene and silacyclopentadiene; and fused rings thereof.

Specific examples include fluorene, silafluorene, carbazole, dithienocyclopentadiene, dithienosilacyclopentadiene, dithienopyrrole, and benzodithiophene.

Preferably, the conjugated polymer compound of the present invention further contains a partial structure represented by the following formula (2) or the following formula (2').

[Chemical Formula 17]

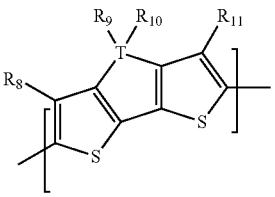

Formula (2)

wherein T represents an atom selected from carbon, silicon and germanium; $R_8$ and $R_{11}$ each independently represent a hydrogen atom, a halogen atom, or an alkyl group having 1 to 20 carbon atoms which may be substituted; and $R_9$ and $R_{10}$ each independently represent an alkyl group having 1 to 20 carbon atoms which may be substituted.

[Chemical Formula 18]

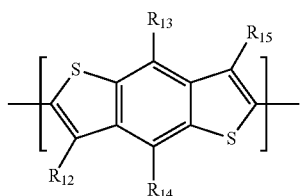

Formula (2')

wherein $R_{12}$ and $R_{15}$ each independently represent a hydrogen atom, a halogen atom or an alkyl group having 1 to 20 carbon atoms which may be substituted; and $R_{13}$ and $R_{14}$ each independently represent an alkyl group having 1 to 20 carbon atoms which may be substituted, or an alkoxy group having 1 to 20 carbon atoms which may be substituted.

Such a structure has a thiophene structure having high mobility condensed therewith and thereby has a larger π-conjugated plane; and, on the other hand, since the structure has a substituent capable of imparting solubility. Therefore, a balance between solubility and high mobility can be achieved, and higher photoelectric conversion efficiency can be expected.

Among others, a structure in which the atom represented by T is a silicon atom is preferred. This is because, as described in Adv. Mater., 2010, p. 367, when T is a silicon atom, there is a tendency that a structure having high crystallinity and high mobility may be obtained.

Specific examples and suitable ranges of the halogen atom, alkyl group having 1 to 20 carbon atoms, alkoxy group having 1 to 20 carbon atoms, and the substituent that is optionally present in the alkyl group or alkoxy group in the formula (2) or (2'), are the same as those described in the section concerning $R_1$ and $R_2$ of the formula (1).

Regarding $R_8$, $R_{11}$, $R_{12}$ and $R_{15}$, if the structure is bulky, the planarity of the polymer is disrupted; therefore, a structure which is not as sterically bulky as possible is preferred. From this point of view, $R_8$, $R_{11}$, $R_{12}$ and $R_{15}$ are each preferably a hydrogen atom, a halogen atom, or a linear alkyl group having 1 to 3 carbon atoms, and more preferably a hydrogen atom or a halogen atom.

$R_9$ and $R_{10}$ are each preferably a linear or branched alkyl group having 1 to 12 carbon atoms, and more preferably a linear or branched alkyl group having 1 to 8 carbon atoms.

$R_{13}$ and $R_{14}$ are each preferably a linear or branched alkyl group or alkoxy group having 1 to 12 carbon atoms, and more preferably a linear or branched alkyl group or alkoxy group having 1 to 8 carbon atoms.

Meanwhile, $R_9$ and $R_{10}$; $R_8$ and $R_{11}$; $R_{13}$ and $R_{14}$; and $R_{12}$ and $R_{15}$ that are included in one partial structure may be respectively identical with or different from each other, but in consideration of symmetry of the partial structure, it is preferable that $R_9$ and $R_{10}$; $R_8$ and $R_{11}$; $R_{13}$ and $R_{14}$; and $R_{12}$ and $R_{15}$ be respectively identical with each other.

Meanwhile, when the conjugated polymer compound contains one or two or more of the partial structure represented by formula (2) or (2'), $R_8$ to $R_{15}$ in the relevant partial structure may be identical with or different from each other.

Furthermore, preferably, the conjugated polymer compound of the present invention further contains a partial structure represented by the following formula (3).

[Chemical Formula 19]

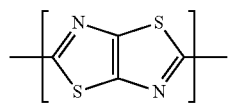

Formula (3)

Such a structure has a thiazole structure having high mobility condensed therewith and thereby has a larger π-conjugated plane, and the structure has higher mobility. Thus, even higher photoelectric conversion efficiency can be expected.

Furthermore, a more suitable exemplary embodiment of the structure represented by formula (3) is a structure represented by the following formula (3').

[Chemical Formula 20]

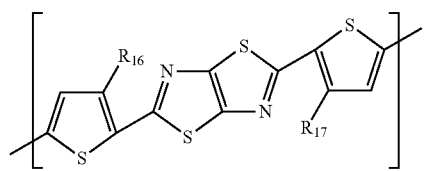

Formula (3')

In formula (3'), $R_{16}$ and $R_{17}$ each independently represent a hydrogen atom, an alkyl group having 1 to 30 carbon atoms which may be substituted, an alkoxy group having 1 to 30 carbon atoms which may be substituted, an alkyl ester group having 2 to 30 carbon atoms which may be substituted, a halogen atom, an alkoxycarbonyl group having 2 to 30 carbon atoms which may be substituted, an alkylaminocarbonyl group having 2 to 40 carbon atoms which may be substituted, an acyl group having 2 to 30 carbon atoms which may be substituted, an amino group which may be substituted, or an acylamino group having 2 to 30 carbon atoms which may be substituted. Specific examples of these substituents include those described in the section concerning $R_1$ and $R_2$. Among these substituents, a hydrogen atom and an alkyl group are preferred, and an alkyl group is more preferred. From the viewpoint of solubility, a linear or branched alkyl group having 4 to 30 carbon atoms is even more preferred.

Preferred embodiments of the donor-like unit will be described below.

[Chemical Formula 21]

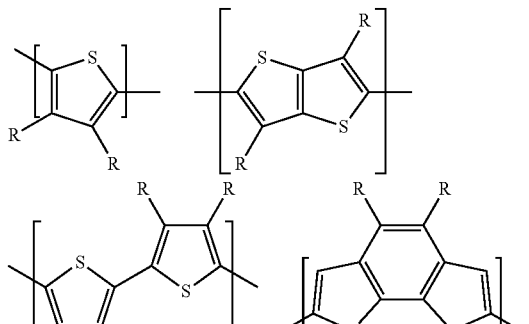

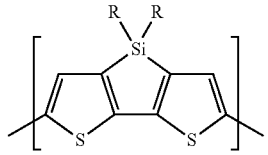

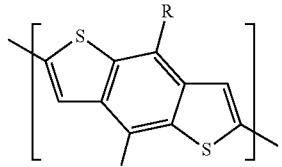

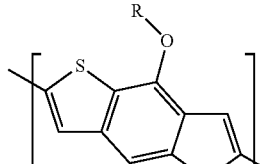

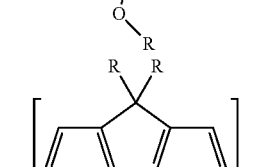

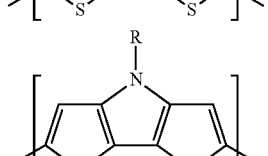

[Chemical Formula 22]

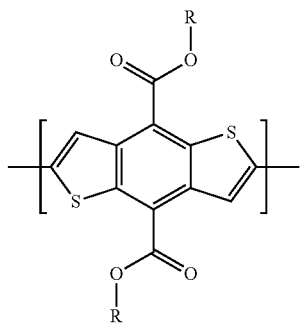

-continued

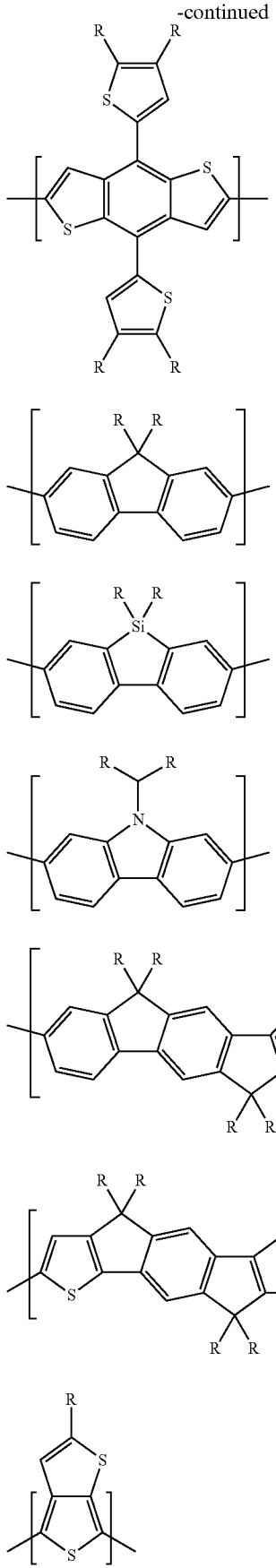

[Chemical Formula 23]

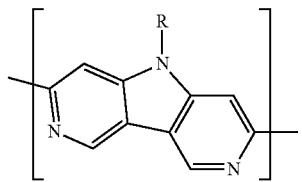

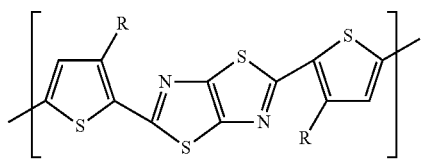

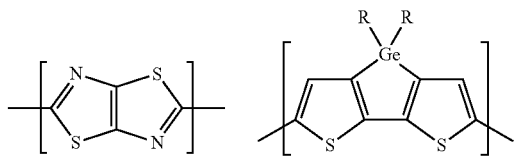

Here, in the donor-like units, R represents a hydrogen atom, a halogen atom, an alkyl group which may be substituted, a halogenated alkyl group which may be substituted, an alkoxy group which may be substituted, an alkoxycarbonyl group which may be substituted, an acyl group which may be substituted, an alkylaminocarbonyl group which may be substituted, or an acylamino group which may be substituted. Among these substituents, a hydrogen atom or an alkyl group which may be substituted are preferred. Specific examples of these substituents include those described in the section concerning $R_1$ and $R_2$. Meanwhile, in the donor-like units described above, when there are more than one R, each R may be identical, or may be different.

[Chemical Formula 24]

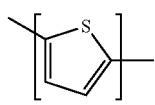
D1

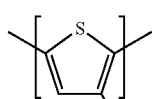
D1'

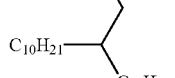
D2

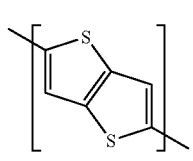

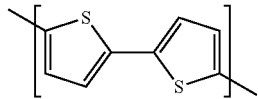
D3

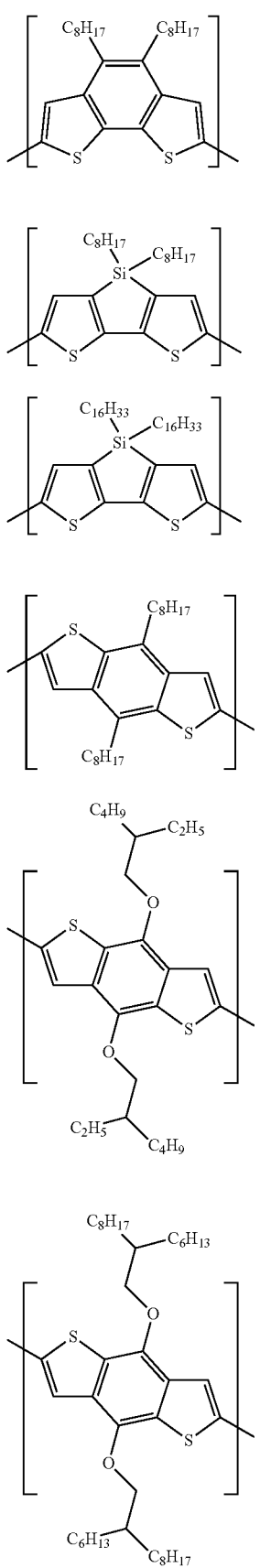

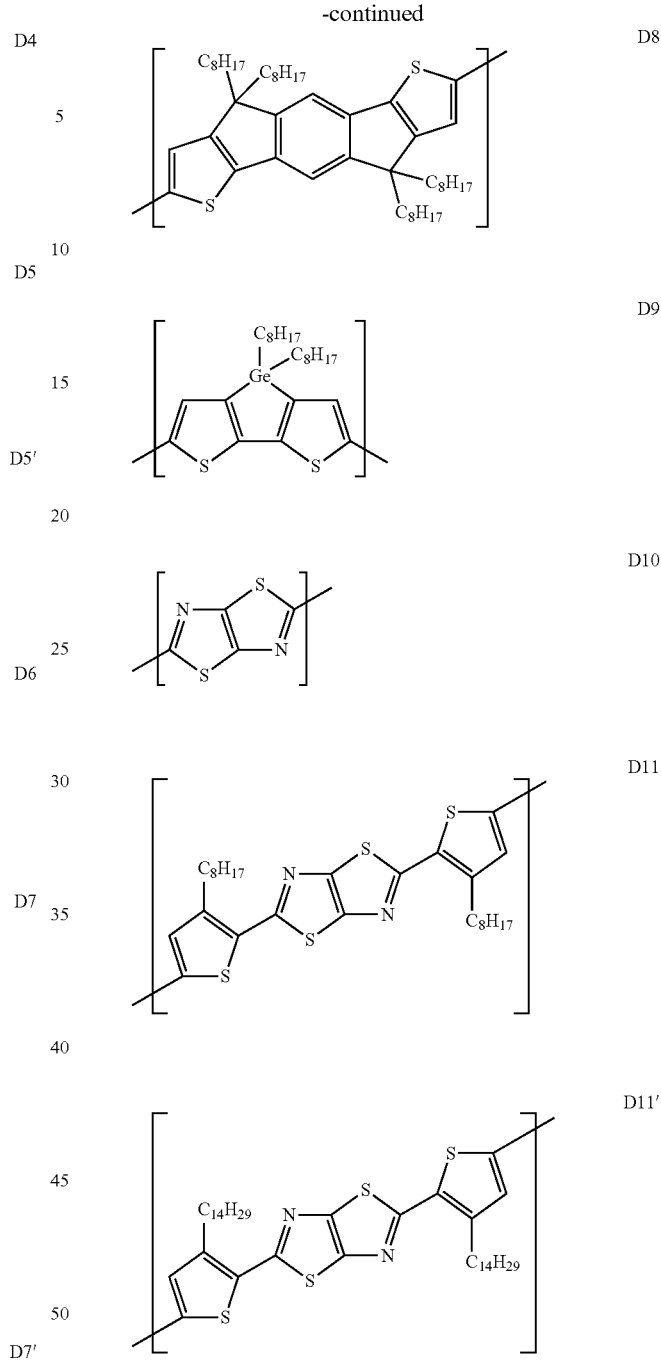

The donor-like unit group is not particularly limited as long as the group includes one or more donor-like units, and may consist of only one donor-like unit, or may consist of two or more donor-like units linked together. Preferably, the donor-like unit group has a structure in which a first donor-like unit, a second donor-like unit, and a third donor-like unit are linked in this sequence in a straight-chained state. At this time, the first donor-like unit and the third donor-like unit positioned at the two ends of the donor-like unit group are adjoining acceptor-like units. In other words, the conjugated polymer compound has a structure in which an acceptor-like unit and a second donor-like unit are linked through a first donor-like unit or a third donor-like unit.

The molecular weight of the conjugated polymer compound of the present embodiment is not particularly limited, but in order to impart morphology to the conjugated polymer compound, it is preferable that the conjugated polymer compound have an appropriate molecular weight. Specifically, the weight average molecular weight of the conjugated polymer compound is preferably 10,000 to 100,000, more preferably 15,000 to 50,000, and even more preferably 15,000 to 30,000. It is because in the case of constructing a bulk heterojunction type photoelectric conversion layer, low molecular weight compounds that are used as n-type organic semiconductors (for example, fullerene derivatives) are widely used; and, when the molecular weight of the conjugated polymer compound that is used as a p-type organic semiconductor is in the above-described range, since a microphase-separated structure is formed satisfactorily, carrier paths that carry the holes and electrons generated at the p-n junction interface can be easily formed. The weight average molecular weight as used in the present specification can be measured by gel permeation chromatography (GPC; reference material: polystyrene).

Meanwhile, in the present embodiment, there are no particular limitations on the combination of the acceptor-like unit and the donor-like unit exemplified above, and a conjugated polymer compound can be synthesized and used by appropriately combining any acceptor-like unit and any donor-like unit. In the Examples described below, conjugated polymer compounds of the combinations indicated in the following Table 1 were synthesized, and functions thereof were evaluated. However, the technical scope of the present invention is not intended to be limited only these examples.

TABLE 1

|  | Acceptor-like units | | Donor-like units |
| --- | --- | --- | --- |
| Compound 101 | P101 | A001 | D5' |
| Compound 102 | P102 | A001 | D7' |
| Compound 103 | P103 | A201 | D5 |
| Compound 104 | P104 | A201 | D7 |
| Compound 105 | P105 | A301 | D5' |
| Compound 106 | P106 | A301 | D7' |
| Compound 107 | P107 | A308 | D5 |
| Compound 108 | P108 | A308 | D7 |
| Compound 109 | P109 | A401 | D5 |
| Compound 110 | P110 | A401 | D7 |
| Compound 111 | P111 | A408 | D5 |
| Compound 112 | P112 | A408 | D7 |
| Compound 113 | P113 | A413 | D5' |
| Compound 114 | P114 | A413 | D7' |
| Compound 115 | P115 | A408 | D5, D10 |
| Compound 116 | P116 | A001 | D1', D11' |
| Compound 117 | P117 | A201' | D11' |
| Compound 118 | P118 | A308 | D11' |

[Chemical Formula 25]

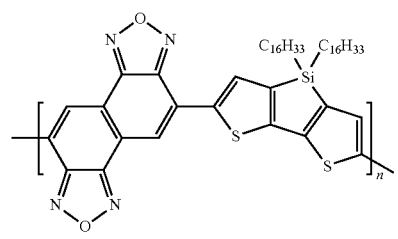

P101

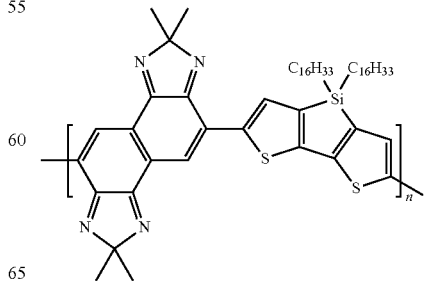

TABLE 1-continued
| Acceptor-like units | Donor-like units |
|---|---|
| 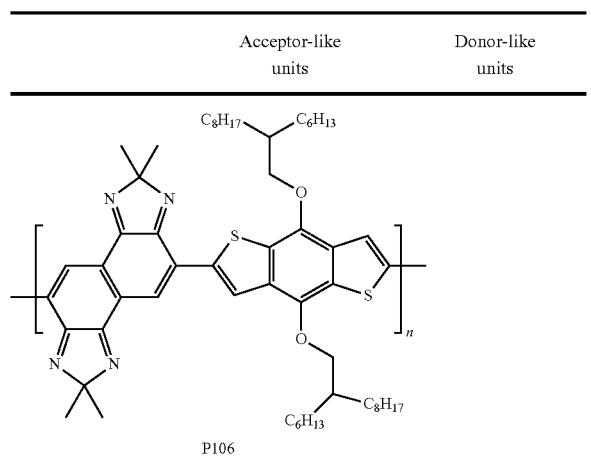 P106 | |
| 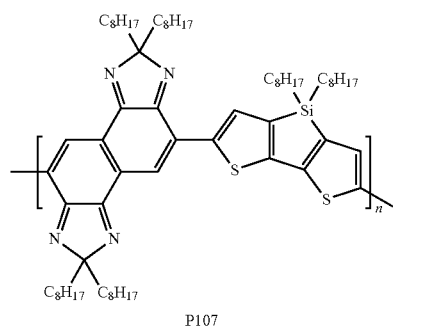 P107 | |
| 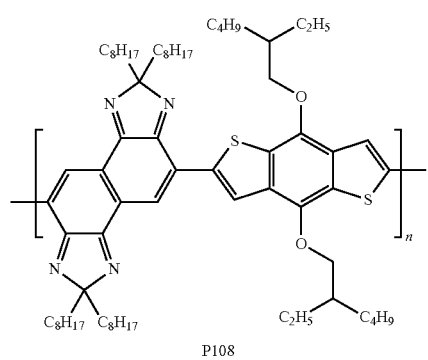 P108 | |
| [Chemical Formula 27]<br>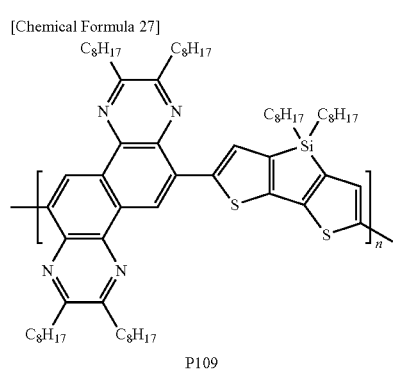 P109 | |
TABLE 1-continued
| Acceptor-like units | Donor-like units |
|---|---|
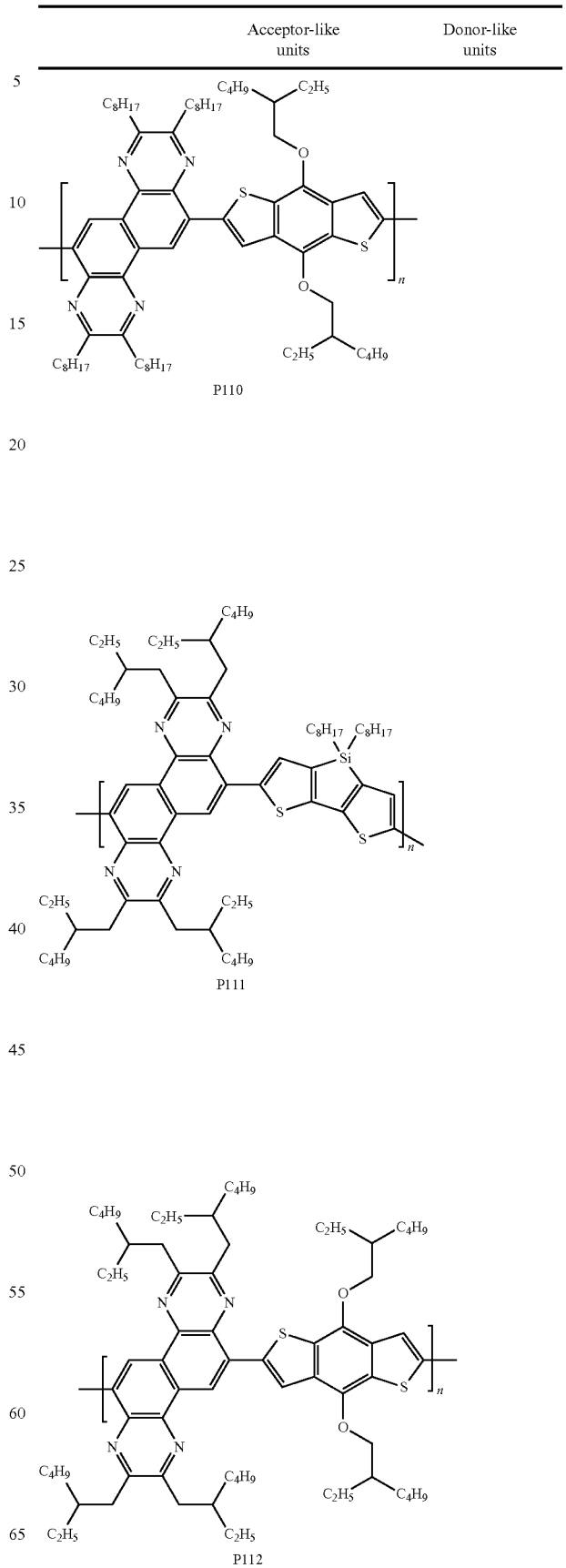

TABLE 1-continued

| Acceptor-like units | Donor-like units |
|---|---|

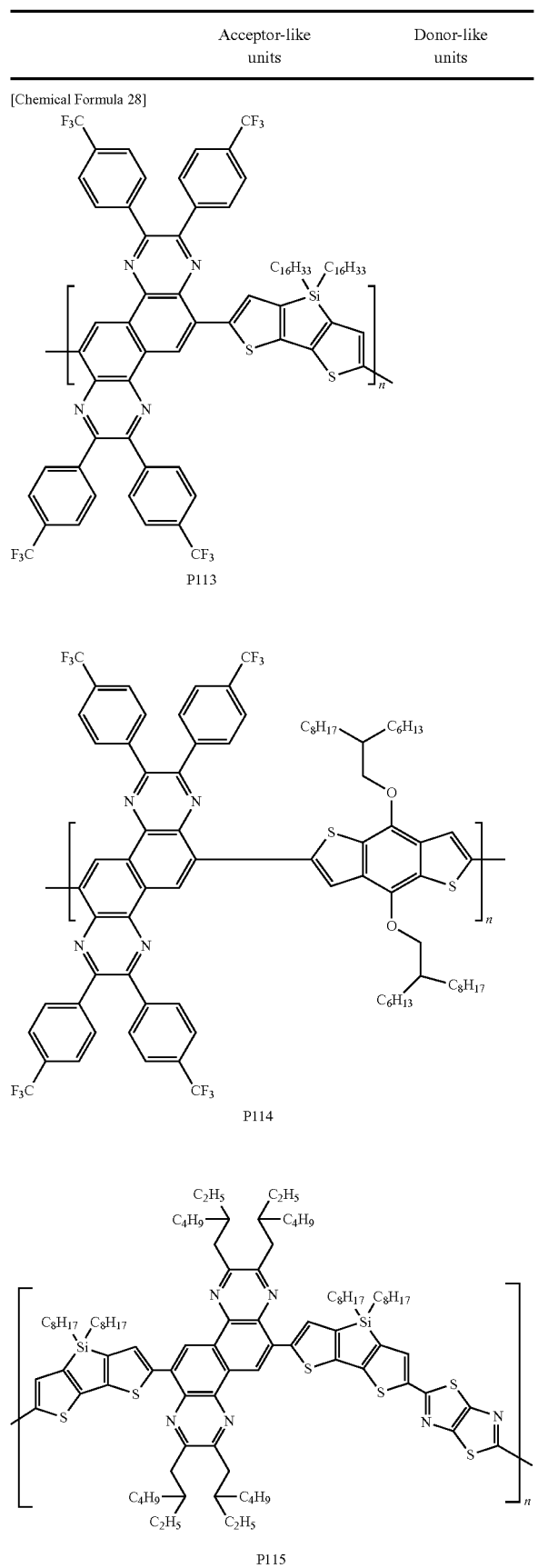

TABLE 1-continued

| Acceptor-like units | Donor-like units |
|---|---|

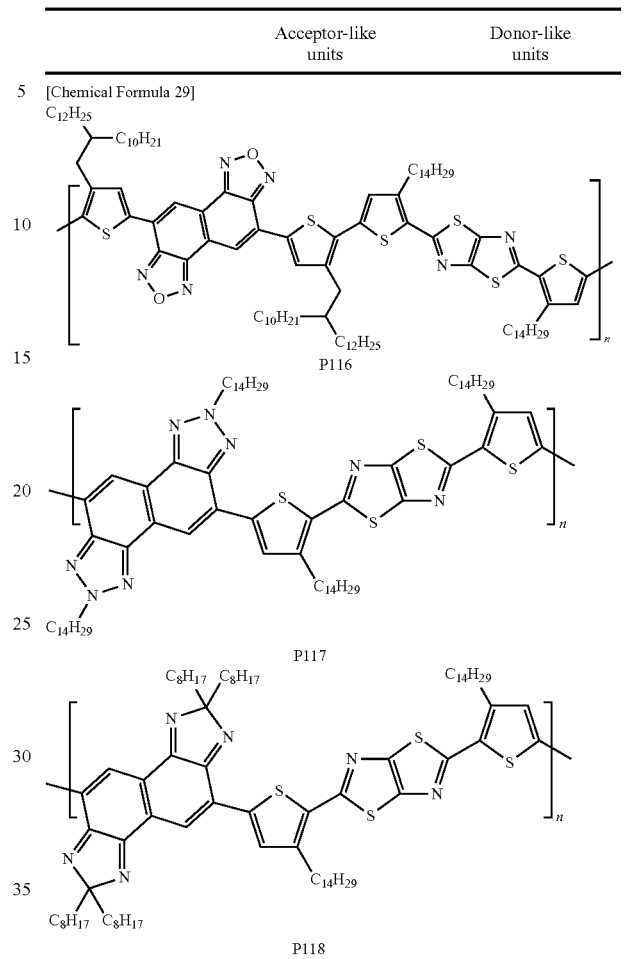

In regard to the compounds described above, it is sufficient as long as the number represented by n has a value falling in the range of the molecular weight described above, but for example, in order to have the number average molecular weight in the range of 10,000 to 100,000, n needs to have a value of approximately 10 to 200.

<Organic Photoelectric Conversion Element>

(Configurations of Organic Photoelectric Conversion Element and Solar Cell)

The organic photoelectric conversion element of the present invention and a solar cell using the element will be explained. Furthermore, the layer configuration of the solar cell of the present invention uses the same layer configuration as the layer configuration of the organic photoelectric conversion element of the present invention.

FIG. 1 is a schematic diagram illustrating an example of an ordered layer organic photoelectric conversion element. In FIG. 1, a bulk heterojunction type organic photoelectric conversion element 10 has, on one surface of a substrate 11, a transparent electrode (generally a positive electrode) 12, a hole transport layer 17, a photoelectric conversion layer 14, an electron transport layer 18, and a counter electrode (generally a negative electrode) 13 laminated in sequence.

The substrate 11 is a member that retains the transparent electrode 12, photoelectric conversion layer 14 and counter electrode 13 sequentially laminated thereon. In the present exemplary embodiment, since light to be photoelectrically converted enters through the side of the substrate 11, the substrate 11 is a transparent member capable of transmitting this light to be photoelectrically converted, that is, a member transparent to the wavelength of this light that should be photoelectrically converted.

Regarding the substrate 11, for example, a glass substrate or a resin substrate is used. This substrate 11 is not essential, and the bulk heterojunction type organic photoelectric conversion element 10 may be constituted by, for example, forming the transparent electrode 12 and the counter electrode 13 on both surfaces of the photoelectric conversion layer 14.

The photoelectric conversion layer 14 is a layer that converts light energy to electrical energy, and is configured to include a photoelectric conversion layer containing a p-type semiconductor material and an n-type semiconductor material as a uniform mixture. The p-type semiconductor material functions as a relative electron donor, and the n-type semiconductor material functions as relative electron acceptor.

Here, the electron donor and the electron acceptor are "an electron donor and an electron acceptor that allow migration of electrons from the electron donor to the electron acceptor when light is absorbed, and formation of pairs of a hole and an electron (charge-separated state)." This electron donor or electron acceptor does not simply donate or accept electrons as an electrode does, but donates or accepts electrons as a result of light reaction.

In FIG. 1, light entering the transparent electrode 12 through the substrate 11 is absorbed by the electron acceptor or electron donor in the photoelectric conversion layer of the photoelectric conversion layer 14, electrons migrate from the electron donor to the electron acceptor, and thus pairs of a hole and an electron (charge-separated state) are formed.

The charges thus generated are respectively carried to different electrodes due to the internal electric field, for example, in the case in which the work functions of the transparent electrode 12 and the counter electrode 13 are different, due to the potential difference between the transparent electrode 12 and the counter electrode 13, such that electrons pass between electron acceptors, and holes pass between electron donors. Thus, a photoelectric current is detected.

Here, since the work function of the transparent electrode 12 is usually larger than the work function of the counter electrode 13, holes are transported to the transparent electrode 12, and electrons are transported to the counter electrode 13. That is, it is necessary to use a metal which exhibits a low work function and is easily oxidizable, for the counter electrode 13. When this metal is oxidized, conductivity may be lost, or on the contrary, the work function is increased, and thereby the interrelated contact resistance is increased to a large extent so that the electric characteristics of the element are deteriorated. This has been a major factor of low durability in ordered layer type elements.

That is, when the organic photoelectric conversion element is designed such that electrons are transported to the transparent electrode 12 and holes are transported to the counter electrode 13, by making the work function of the counter electrode (second electrode) 13 larger than the work function of the transparent electrode (first electrode) 12, a stable, high-work function metal that does not easily oxidize the counter electrode 13 can be used.

Figure 2:
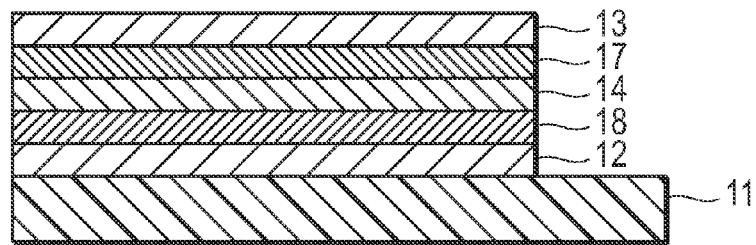
FIG. 2 is a schematic cross-sectional diagram illustrating another example of the configuration of the organic photoelectric conversion element of the present invention.

FIG. 2 is a schematic diagram illustrating an example of an inversion layer organic photoelectric conversion element, and when the element of FIG. 2 is produced into an organic photoelectric conversion element having the inversion layer configuration as illustrated in FIG. 2, in which the relation of work function is reversed as described above, and the positions of the hole transport layer 17 and the electron transport layer 18 in FIG. 1 are reversed, deterioration of the element caused by oxidation of the counter electrode can be suppressed to a large extent, and even higher stability than that of an ordered layer type element can be provided. Therefore, an organic photoelectric conversion element having an inversion layer configuration is preferred.

Meanwhile, although not described in FIG. 1 and FIG. 2, the organic photoelectric conversion element may also include other layers such as a hole blocking layer, an electron blocking layer, an electron injection layer, a hole injection layer, and a planarizing layer.

Figure 3:
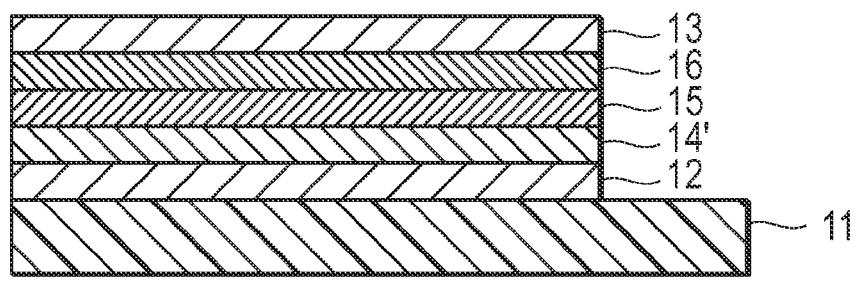
FIG. 3 is a schematic cross-sectional diagram illustrating an example of the organic photoelectric conversion element of the present invention that includes a tandem type photoelectric conversion layer.

Furthermore, in an assumption of the case of using the organic photoelectric conversion element of the present invention as a solar cell, a tandem type configuration in which the photoelectric conversion layer is laminated as described in FIG. 3 may also be employed for the purpose of enhancing the sunlight utilization ratio (photoelectric conversion efficiency). Furthermore, FIG. 3 is a schematic diagram illustrating an example of an organic photoelectric conversion element including a tandem type photoelectric conversion layer.

In the case of the tandem type configuration, a tandem type configuration can be provided by laminating a transparent electrode 12 and a first photoelectric conversion layer 14' sequentially on a substrate 11, subsequently laminating a charge recombination layer 15, and then laminating a second photoelectric conversion layer 16 and then a counter electrode 13.

The second photoelectric conversion layer 16 may be a layer that absorbs the same spectrum as the absorption spectrum of the first photoelectric conversion layer 14', or may be a layer that absorbs a different spectrum. However, the second photoelectric conversion layer is preferably a layer absorbing a different spectrum.

Furthermore, the photoelectric conversion element may have a hole transport layer 17 or an electron transport layer 18 between the first photoelectric conversion layer 14' or the second photoelectric conversion layer 16 and the respective electrodes; and, according to the present invention, even in the tandem configuration, it is preferable that the photoelectric conversion layers 14' and 16 respectively have the inversion layer configuration illustrated in FIG. 2.

Hereinafter, the materials that constitute the layers of an organic photoelectric conversion element and a solar cell, in addition to the compound of the present invention, will be described.

[p-Type Semiconductor Material]

In the present invention, the organic photoelectric conversion element contains, as a p-type organic semiconductor material, a conjugated polymer compound having a partial structure represented by the above formula (1), and preferably contains a conjugated polymer compound having a structure bonded to a donor-like unit.

In addition to the compound having the above-described partial structure, other p-type semiconductor materials may also be added. Examples of the other p-type semiconductor materials that are used in the bulk heterojunction layer include various fused polycyclic aromatic low molecular weight compounds, and conjugated polymers.

Examples of the fused polycyclic aromatic low molecular weight compounds include compounds such as anthracene, tetracene, pentacene, hexacene, heptacene, chrysene, picene, fulminene, pyrene, peropyrene, perylene, terrylene, quaterrylene, coronene, ovalene, circumanthracene, bisanthene, zethrene, heptazethrene, pyranthrene, violanthene, isoviolanthene, circobiphenyl, and anthradithiophene; porphyrin, copper phthalocyanine, a tetrathiafulvalene (TTF)-tetracyanoquinodimethane (TCNQ) complex, a bisethylenetetrathiafulvalene (BEDTTTF)-perchloric acid complex, and derivatives and precursors thereof.

Furthermore, examples of derivatives having the aforementioned fused polycyclic rings include the pentacene derivatives having substituents described in WO 03/16599, WO 03/28125, U.S. Pat. No. 6,690,029, JP-A No. 2004-107216 and the like; pentacene precursors described in US Patent Application Publication No. 2003/136964 and the like; and acene-based compounds substituted with trialkylsilylethynyl groups described in J. Amer. Chem. Soc., Vol. 127, No. 14, 4986; J. Amer. Chem. Soc., Vol. 123, p. 9482; J. Amer. Chem. Soc., Vol. 130 (2008), No. 9, 2706, and the like.

Examples of the conjugated polymers include polymer materials such as polythiophenes such as poly-3-hexylthiophene (P3HT), and oligomers thereof; polythiophenes having polymerizable groups described in Technical Digest of the International PVSEC-17, Fukuoka, Japan, 2007, p. 1225; a polythiophene-thienothiophene copolymer described in Nature Material, (2006), Vol. 5, p. 328; a polythiophene-diketopyrrolopyrrole copolymer described in WO 2008/000664; a polythiophene-thiazolothiazole copolymer described in Adv. Mater., 2007, p. 4160; a polythiophene copolymer such as PCPDTBT described in Nature Mat., Vol. 6 (2007), p. 497; and σ-conjugated polymers such as polypyrrole and oligomers thereof, polyaniline, polyphenylene and oligomers thereof, polyphenylenevinylene and oligomers thereof, polythienylenevinylene and oligomers thereof, polyacetylene, polydiacetylene; polysilane, and polygermane.

Furthermore, examples of oligomer materials, which are not polymer materials, that can be suitably used include oligomers such as α-sexythiophene, which is a thiophene hexamer, α,ω-dihexyl-α-sexythiophene, α,ω-dihexyl-α-quinquethiophene, and α,ω-bis(3-butoxypropyl)-α-sexythiophene.

Furthermore, when an electron transport layer or a hole blocking layer is further formed on the bulk heterojunction layer by a solution process, if further coating can be achieved on a layer once coated, lamination can be carried out easily. However, there has been a problem that, usually, when a layer is further laminated by a solution process on a layer formed of a material having good solubility, and the laminate is used, lamination can be achieved because the laminated layer dissolves the underlayer. Therefore, the layer may include a material that can be insolubilized after being applied by a solution process.

Examples of such a material include a material that can be insolubilized by polymerizing and crosslinking a coating film after coating, such as a polythiophene having a polymerizable group as described in Technical Digest of the International PVSEC-17, Fukuoka, Japan, 2007, p. 1225; and a material that is insolubilized (pigmentized) when a soluble substituent undergoes a reaction as energy such as heat is applied, as described in US Patent Application Publication No. 2003/136964 and JP-A No. 2008-16834.

Meanwhile, regarding the p-type organic semiconductor included in the photoelectric conversion layer of the present embodiment, as long as the p-type organic semiconductor includes the conjugated polymer compound described above, there are no particular limitations on the content of those other p-type organic semiconductor materials. However, in order to achieve higher photoelectric conversion efficiency, it is preferable that the proportion of the aforementioned conjugated polymer compound relative to the total amount of the p-type organic semiconductors included in the photoelectric conversion layer (when two or more photoelectric conversion layers are included, the total amount in all of the layers) be larger. Specifically, the proportion of the conjugated polymer compound relative to the total amount of the p-type organic semiconductors is preferably 50% by mass or more, more preferably 70% by mass or more, even more preferably 90% by mass or more, particularly preferably 95% by mass or more, and most preferably 100% by mass or more.

[n-Type Semiconductor Material]

There are no particular limitations on the n-type semiconductor material that is used in the bulk heterojunction layer of the present invention, but examples include polymer compounds containing perfluoro forms (perfluoropentacene and perfluorophthalocyanine) in which hydrogen atoms of p-type semiconductors such as fullerene and octa-azaporphyrin are substituted with fluorine atoms; or aromatic carboxylic acid anhydrides or imidation products thereof, such as naphthalenetetracarboxylic acid anhydride, naphthalenetetracarboxylic acid diimide, perylenetetracarboxylic acid anhydride and perylenetetracarboxylic acid diimide.

However, fullerene derivatives that can carry out charge separation with various p-type semiconductor materials at high speed (about 50 fs) and efficiently, are preferred. Examples of the fullerene derivatives include fullerene C60, fullerene C70, fullerene C76, fullerene C78, fullerene C84, fullerene C240, fullerene C540, mixed fullerenes, fullerene nanotubes, multilayer nanotubes, single-layer nanotubes, nanohorns (conically shaped); and fullerene derivatives in which portions of these are substituted with a hydrogen atom, a halogen atom, a substituted or unsubstituted alkyl group, an alkenyl group, an alkynyl group, an aryl group, a heteroaryl group, a cycloalkyl group, a silyl group, an ether group, a thioether group, an amino group, a silyl group and the like.

Among them, it is preferable to use fullerene derivatives having substituents and having improved solubility, such as [6,6]-phenyl C61-butyric acid methyl ester (abbreviated as PCBM), [6,6]-phenyl C61-butyric acid n-butyl ester (PCBnB), [6,6]-phenyl C61-butyric acid isobutyl ester (PCBiB), [6,6]-phenyl C61-butyric acid n-hexyl ester (PCBH); bis-PCBM described in Adv. Mater., Vol. 20 (2008), p. 2116 and the like; aminated fullerenes described in JP-A No. 2006-199674 and the like; metallocenated fullerenes described in JP-A No. 2008-130889 and the like; and fullerenes having cyclic ether groups described in U.S. Pat. No. 7,329,709 and the like.

There are no particular limitations on the junction form of the p-type organic semiconductor and the n-type organic semiconductor in the photoelectric conversion layer, and the junction form may be planar heterojunction, or may be bulk heterojunction. Planar heterojunction is a junction form in which a p-type organic semiconductor layer containing a p-type organic semiconductor and an n-type organic semiconductor layer containing an n-type organic semiconductor are laminated, and the surface at which these two layers are brought into contact serves as a p-n junction interface. On the other hand, bulk heterojunction is formed by applying a mixture of a p-type organic semiconductor and an n-type organic semiconductor, and has a structure in which in this single layer, domains of the p-type organic semiconductor and domains of the n-type organic semiconductor are microphase-separated. Therefore, in the bulk heterojunction, there are many p-n junction interfaces over the entire layer, as compared with the planar heterojunction. Accordingly, most of the excitons produced by light absorption can reach the p-n junction interface, and thus the efficiency to achieve charge separation can be increased. From this reason, the junction of the p-type organic semiconductor and the n-type organic semiconductor in the photoelectric conversion layer is preferably bulk heterojunction.

Furthermore, a bulk heterojunction layer is such that, in addition to the conventional case in which the bulk heterojunction layer is composed of a single layer that is formed from a mixture of a p-type organic semiconductor material and an n-type organic semiconductor layer (i-layer), there are occasions in which the bulk heterojunction layer has a three-layer structure (p-i-n structure) in which the i-layer is sandwiched between a p-layer formed of a p-type organic semiconductor and an n-layer formed of an n-type organic semiconductor. Such a p-i-n structure has increased rectification of holes and electrons, and the loss due to the recombination of charge-separated holes and electrons or the like is reduced, so that even higher photoelectric conversion efficiency can be obtained.

According to the present invention, the mixing ratio of the p-type organic semiconductor and the n-type organic semiconductor included in the photoelectric conversion layer is preferably in the range of 2:8 to 8:2 as a mass ratio, and more preferably in the range of 4:6 to 6:4. Furthermore, the film thickness of one photoelectric conversion layer is preferably 50 to 400 nm, more preferably 80 nm to 300 nm, and particularly preferably 100 nm to 200 nm. In general, from the viewpoint of absorbing more light, a larger film thickness of the photoelectric conversion layer is preferred; however, if the film thickness is increased, the extraction efficiency of the carriers (holes and electrons) is decreased, and therefore, the photoelectric conversion efficiency tends to decrease. However, when a photoelectric conversion layer is formed using the conjugated polymer compound described above as the p-type organic semiconductor material, even if the layer is formed to have a film thickness of 100 nm or larger, the extraction efficiency of carriers (holes and electrons) is not easily decreased as compared with a photoelectric conversion layer using a conventional p-type organic semiconductor material. Therefore, high photoelectric conversion efficiency can be maintained.

[Method for Producing Photoelectric Conversion Layer]

Regarding the method for forming a photoelectric conversion layer (in the present invention, a photoelectric conversion layer in which an electron acceptor and an electron donor are mixed, that is, a bulk heterojunction layer, is preferred) of the organic photoelectric conversion element of the present invention, examples include a vapor deposition method and coating methods (including a casting method and a spin coating method). Among these, in order to increase the area of the interface at which holes and electrons undergo charge separation and to produce an element having high photoelectric conversion efficiency, coating methods are preferred. Furthermore, coating methods also have excellent production speed.

There are no particular limitations on the coating method used at this time, and examples include a spin coating method, a casting method using a solution, a dip coating method, a wire bar coating method, a gravure coating method, and a spray coating method. Furthermore, patterning can be achieved by printing methods such as an inkjet method, a screen printing method, a relief printing method, an intaglio printing method, an offset printing method, and a flexographic printing method.

After coating, it is preferable to perform heating in order to induce the removal of residual solvent, moisture and gases, and an increase in mobility and in the absorption wavelength caused by crystallization of the semiconductor materials. During the production process, when an annealing treatment is carried out at a predetermined temperature, microscopic aggregation or crystallization of a portion is accelerated, and the photoelectric conversion layer can be made to have an appropriate phase-separated structure. As a result, the mobility of holes and electrons (carriers) of the photoelectric conversion layer is increased, and high efficiency can be obtained.

The photoelectric conversion layer may be composed of a single layer in which an electron acceptor and an electron donor are uniformly mixed, or may also be composed of plural layers in which the mixing ratios of the electron acceptor and the electron donor are varied. In this case, the photoelectric conversion layer can be formed by using materials that can be insolubilized after coating as described above.

[Electron Transport Layer/Hole Blocking Layer]

In the organic photoelectric conversion element 10 of the present invention, when an electron transport layer 18 is formed between the bulk heterojunction layer and the negative electrode, the charges generated at the bulk heterojunction layer can be extracted more efficiently. Therefore, it is preferable that the organic photoelectric conversion element 10 have these layers.

In the electron transport layer 18, octa-azaporphyrin or a perfluoro form of a p-type semiconductor (perfluoropentacene, perfluorophthalocyanine or the like) can be used. Similarly, an electron transport layer that has a HOMO level deeper than the HOMO level of the p-type semiconductor material used in the bulk heterojunction layer, is imparted with a hole blocking function having a rectifying effect that does not allow the holes generated in the bulk heterojunction layer to flow to the negative electrode side. More preferably, a material having a deeper HOMO level than that of an n-type semiconductor is used as the electron transport layer. Furthermore, in view of the characteristics of transporting electrons, it is preferable to use a compound having high electron mobility.

Such an electron transport layer is also referred to as a hole blocking layer, and it is preferable to use an electron transport layer having such a function. In addition to the compounds described above, n-type semiconductor materials such as a phenanthrene-based compound such as basocuproin, naphthalenetetracarboxylic acid anhydride, naphthalenetetracarboxylic acid diimide, perylenetetracarboxylic acid anhydride and perylenetetracarboxylic acid diimide; n-type inorganic oxides such as titanium oxide, zinc oxide and gallium oxide; and alkali metal compounds such as lithium fluoride, sodium fluoride and cesium fluoride can be used. Furthermore, a layer formed of a simple material of the n-type semiconductor material used in the bulk heterojunction layer can also be used.

The means for forming these layers may be any of a vapor deposition method and a solution coating method, but preferably, a solution coating method is used.

[Hole Transport Layer/Electron Blocking Layer]

In the organic photoelectric conversion element 10 of the present invention, when a hole transport layer 17 is between the bulk heterojunction layer and the positive electrode, the charges generated at the bulk heterojunction layer can be extracted more efficiently. Therefore, it is preferable that the organic photoelectric conversion element 10 have these layers.

Regarding the materials that constitutes these layers, for example, as the hole transport layer 17, PEDOT/PSS such as trade name: BAYTRON P manufactured by Starck Vtech, Ltd.; polyaniline and dope materials thereof; and cyan compounds described in WO 2006/019270 and the like, can be used. Meanwhile, a hole transport layer having a LUMO level shallower than the LUMO level of the n-type semiconductor material used in the bulk heterojunction layer, is imparted with an electron blocking function having a rectifying effect that does not allow the electrons generated in the bulk heterojunction layer to flow to the positive electrode side. Such a hole transport layer is also referred to as an electron blocking layer, and it is preferable to use a hole transport layer having such a function. Regarding such a material, triarylamine-based compounds described in JP-A No. 5-271166, and metal oxides such as molybdenum oxide, nickel oxide and tungsten oxide, and the like can be used. Furthermore, a layer formed of a simple material of the p-type semiconductor material used in the bulk heterojunction layer can also be used.

The means for forming these layers may be any of a vacuum deposition method and a solution coating method, but preferably, a solution coating method is used. Before these layers are formed, when a coating film is formed in the underlayer, the coating film has an effect of leveling the surface to be coated, and reduces the influence of leakage or the like, which is preferable.

[Other Layers]

For the purpose of increasing the energy conversion efficiency or an increase in the element service life, a configuration including various intermediate layers in the element may also be employed. Examples of the intermediate layers include a hole blocking layer, an electron blocking layer, a hole injection layer, an electron injection layer, an exciton blocking layer, a UV absorbing layer, a light reflective layer, and a wavelength conversion layer.

[Electrodes]

The organic photoelectric conversion element of the present invention includes at least a first electrode and a second electrode. Furthermore, in the case of employing a tandem configuration, a tandem configuration can be achieved by using an intermediate electrode. Meanwhile, in the present invention, an electrode in which mainly holes flow is called a positive electrode, and an electrode in which mainly electrons flow is called a negative electrode.

According to the present invention, the first electrode is a transparent electrode. Being transparent means that the light transmittance is 50% or higher. The light transmittance means the total light transmittance in the visible light wavelength region measured by a method according to JIS K 7361-1 (equivalent to ISO 13468-1) "Plastics—Determination of the total luminous transmittance of transparent materials."

Furthermore, in view of the function of whether the electrode has translucency, electrodes may be classified such that an electrode having translucency is referred to as a transparent electrode, and an electrode lacking translucency is referred to as a counter electrode. According to the present invention, an inversion layer configuration is preferred, and in this case, the first electrode is a negative electrode (cathode) having translucency, and the second electrode is a positive electrode (anode).

[Transparent Electrode]

The transparent electrode of the present invention is preferably an electrode which transmits light having a wavelength of 380 nm to 800 nm.

Regarding the material constituting the transparent electrode, for example, a transparent metal oxide such as indium tin oxide (ITO), AZO, FTO, $SnO_2$, ZnO or titanium oxide; a very thin metal layer of Ag, Al, Au, Pt or the like, or a layer containing nanowires or nanoparticles such as metal nanowires and carbon nanotubes; and conductive polymer materials such as PEDOT:PSS and polyaniline, can be used.

Furthermore, conductive polymers selected from the group consisting of various derivatives of polypyrrole, polyaniline, polythiophene, polythienylenevinylene, polyazulene, polyisothianaphthene, polycarbazole, polyacetylene, polyphenylene, polyphenylenevinylene, polyacene, polyphenylacetylene, polydiacetylene, and polynaphthalene can also be used. Furthermore, a plural number of these conductive compounds can also be combined to produce a negative electrode.

[Counter Electrode]

The counter electrode may be a single layer of a conductive material, but in addition to materials having conductivity, a resin for retaining these may also be used in combination.

Since the work function of the transparent electrode which is a cathode is approximately −5.0 eV to −4.0 eV, in order for the carriers produced in the bulk heterojunction layer to diffuse and reach the respective electrodes, it is preferable that the difference in the built-in potential, that is, the work function between the anode and the cathode, be large.

Therefore, as the conductive material for anode, a metal, an alloy, an electrically conductive compound, each having a high work function (4 eV or less), and a mixture of these, is used as an electrode material. Specific examples of such an electrode material include gold, silver, copper, platinum, rhodium, indium, nickel, and palladium.

Among these, from the viewpoints of the performance of hole extraction, light reflectance, and durability to oxidation or the like, silver is most preferred.

The anode can be produced by forming a thin film from such an electrode material by a method such as vapor deposition or sputtering. Furthermore, the film thickness is usually selected in the range of 10 nm to 5 μm, and preferably 50 nm to 200 nm.

Furthermore, when the anode side is made light translucent, for example, a conductive material appropriate for a negative electrode, such as aluminum an aluminum alloy, silver or a silver compound, is produced into a thin film having a film thickness of about 1 nm to 20 nm, and then a film of the conductive translucent material described for the transparent electrode is provided. This can be used as a translucent negative electrode.

[Intermediate Electrode]

Furthermore, as the material for an intermediate electrode required in the case of the tandem configuration such as shown in FIG. 3, a layer using a compound having both transparency and conductivity is preferred, and a material such as that used in the positive electrode (a transparent metal oxide such as ITO, AZO, FTO, $SnO_2$, ZnO or titanium oxide; a very thin metal layer of Ag, Al, Au, Pt or the like; a layer containing nanowires or nanoparticles such as metal nanowires or carbon nanotubes; a conductive polymer material such as PEDOT:PSS or polyaniline; or the like) can be used.

Meanwhile, among the hole transport layers and the electron transport layers described above, there are combinations which work as an intermediate electrode (charge recombination layer) when a hole transport layer and an electron transport layer are appropriately combined and laminated. Therefore, when such a configuration is adopted, a process of forming one layer can be omitted, which is preferable.

[Substrate]

According to the present invention, the substrate is a transparent substrate, and being transparent has the same meaning as described above for the electrode.

Suitable examples of the substrate include a glass substrate and a resin substrate, but from the viewpoint of lightweightness and flexibility, it is preferable to use a transparent resin film. There are no particular limitations on the transparent resin film that can be preferably used as a transparent substrate in the present invention, and the material, shape, structure, thickness and the like of the substrate can be appropriately selected from known materials. Examples include polyester-based resin films such as polyester-based resin films such as polyethylene terephthalate (PET), polyethylene naphthalate (PEN), and modified polyesters; polyethylene (PE) resin films; polypropylene (PP) resin films; polystyrene resin films; polyolefin resin films such as cyclic olefin-based resins; vinyl-based resin films such as polyvinyl chloride and polyvinylidene chloride; polyether ether ketone (PEEK) resin films, polysulfone (PSF) resin films, polyether sulfone (PES) resin films, polycarbonate (PC) resin films, polyamide resin films, polyimide resin films, acrylic resin films, and triacetyl cellulose (TAC) resin films. However, any resin film having a transmittance of 80% or higher to the wavelengths of the visible range (380 nm to 800 nm) can be preferably applied to the transparent resin film related to the present invention.

Among them, from the viewpoints of transparency, heat resistance, easy handleability, strength and cost, the substrate is more preferably a biaxially stretched polyethylene terephthalate film, a biaxially stretched polyethylene naphthalate film, a polyether sulfone film, or a polycarbonate film, and more preferably a biaxially stretched polyethylene terephthalate film or a biaxially stretched polyethylene naphthalate film.

The transparent substrate used in the present invention can be subjected to a surface treatment or can be provided with an easily adhesive layer, in order to secure wettability or adhesiveness of the coating liquid. For the surface treatment or easily adhesive layer, conventionally known technologies can be used. Examples of the surface treatment include surface activation treatments such as a corona discharge treatment, a flame treatment, an ultraviolet treatment, a high frequency treatment, a glow discharge treatment, an active plasma treatment, and a laser treatment. Furthermore, examples of the easily adhesive layer include layers formed from a polyester, a polyamide, a polyurethane, a vinyl-based copolymer, a butadiene-based copolymer, an acrylic copolymer, a vinylidene-based copolymer, and an epoxy-based copolymer.

Furthermore, for the purpose of suppressing permeation of oxygen and water vapor, a barrier coating layer may be formed in advance on the transparent substrate, and a hard coat layer may be formed in advance on the opposite side where a transparent conductive layer is transferred.

[Optical Functional Layers]

The organic photoelectric conversion element of the present invention may have various optical functional layers for the purpose of more efficient light reception of sunlight. Regarding the optical functional layers, for example, an antireflective film, a light collecting layer for a microlens array and the like, a light diffusion layer capable of scattering the light reflected at the negative electrode to enter the electricity generating layer again, or the like may be provided.

Regarding the antireflective layer, various known antireflective layers can be provided, and for example, when the transparent resin film is a biaxially stretched polyethylene terephthalate film, by adjusting the refractive index of the easily adhesive layer that is adjacent to the film to 1.57 to 1.63, reflection at the interface between the film substrate and the easily adhesive layer can be reduced, and thus the transmittance can be increased, which is more preferable. Regarding the method of adjusting the refractive index, the method can be carried out by appropriately adjusting the ratio of an oxide sol having a relatively high refractive index, such as a tin oxide sol or a cerium oxide sol, and a binder resin, and applying the mixture. The easily adhesive layer may be a single layer, but in order to enhance adhesiveness, a configuration of two or more layers may also be employed.

Regarding the light collecting layer, for example, the amount of light reception in a particular direction can be increased, or on the contrary, the dependency of the incident angle of sunlight can be decreased, by processing the light collecting layer so as to provide a microlens array-like structure on the sunlight reception side of a substrate, or by combining the light collecting layer with a so-called light collecting sheet.

Regarding an example of the microlens array, pyramids each measuring 30 μm on each edge and having an apex angle of 90° are arranged two-dimensionally on the light extraction side of the substrate. One edge is preferably 10 μm to 100 μm. If the edge is smaller than this, an effect of diffraction occurs to color the substrate, and if the edge is too large, the thickness becomes large, which is not preferable.

Furthermore, examples of a light scattering layer include various antiglare layers, and layers in which nanoparticles, nanowires and the like of metals or various inorganic oxides are dispersed in a colorless transparent polymer.

[Patterning]

There are no particular limitations on the method or process for patterning the electrode, electricity generating layer, hole transport layer, electron transport layer and the like related to the present invention, and any known technique can be appropriately applied.

Any soluble material of the bulk heterojunction layer, transport layer or the like may be applied over the entire surface by die coating, dip coating or the like, and then unnecessary parts may be wiped off, or patterning may be carried out directly at the time of coating, using a method such as an inkjet method or screen printing.

In the case of an insoluble material such as an electrode material, patterning can be carried out by performing masked vapor deposition at the time of vapor depositing an electrode, or according to a known method such as etching or lifting-off. Furthermore, a pattern may also be formed by transferring a pattern formed on another substrate.

[Solar Cell]

The organic photoelectric conversion element has excellent photoelectric conversion efficiency and durability, and can therefore be suitably used in solar cells.

The solar cell of the present invention includes the organic photoelectric conversion element, and has a structure which has a design and a circuit design optimal to sunlight and undergoes optimal photoelectric conversion when sunlight is used as a light source.

That is, a structure in which sunlight can be irradiated to the photoelectric conversion layer is formed, and when the solar cell of the present invention is constructed, it is preferable to accommodate the photoelectric conversion layer and the respective electrodes in a case and seal the case, or to seal the entirety of those members with a resin.

Regarding the method of sealing, in order to prevent the produced organic photoelectric conversion element from being deteriorated by oxygen, moisture or the like in the environment, it is preferable to perform sealing according to a known technique not only in organic photoelectric conversion elements but also in organic electroluminescent elements and the like.

Examples include a technique of sealing an element by bonding a cap made of aluminum or glass using an adhesive; a technique of pasting a plastic film on which a gas barrier layer of aluminum, silicon oxide, aluminum oxide or the like, and an organic photoelectric conversion element with an adhesive; a method of spin coating an organic polymer material having high gas barrier properties (polyvinyl alcohol or the like); a method of depositing an inorganic thin film having high gas barrier properties (silicon oxide, aluminum oxide or the like) or an organic film having gas barrier properties (parylene or the like) in a vacuum; and a method of laminating these in a complex manner.

[Photosensor Array]

Next, a photosensor array in which the bulk heterojunction type organic photoelectric conversion element 10 described above is applied will be explained in detail. A photosensor array is a sensor which is produced by arraying the photoelectric conversion elements described above finely in a pixel-like form by utilizing the fact that the above-described bulk heterojunction type organic photoelectric conversion element generates a current as a result of light reception, and has an effect of converting an image projected on the photosensor array to electrical signals.

Figure 4A:
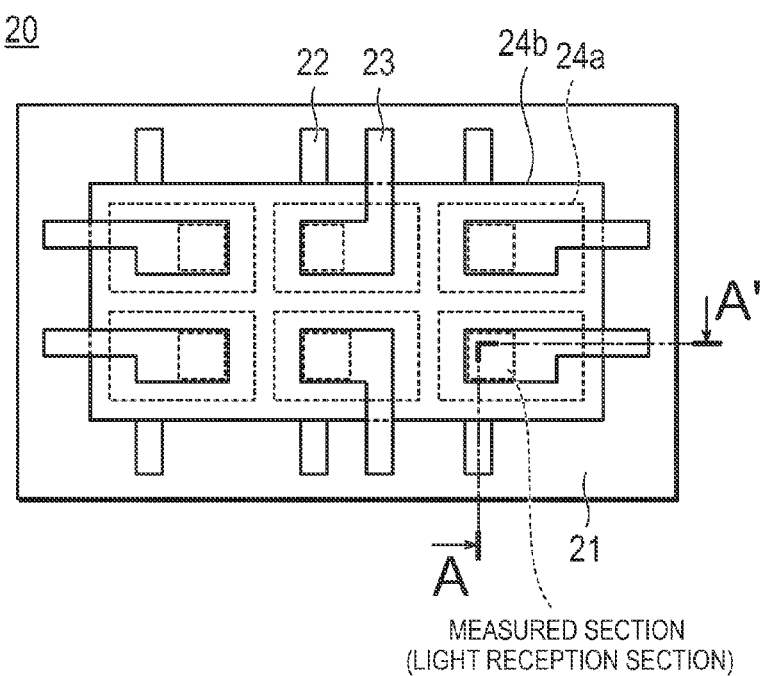
FIGS. 4(A) and 4(B) are diagrams illustrating the configuration of an optical sensor array.
Figure 4B:
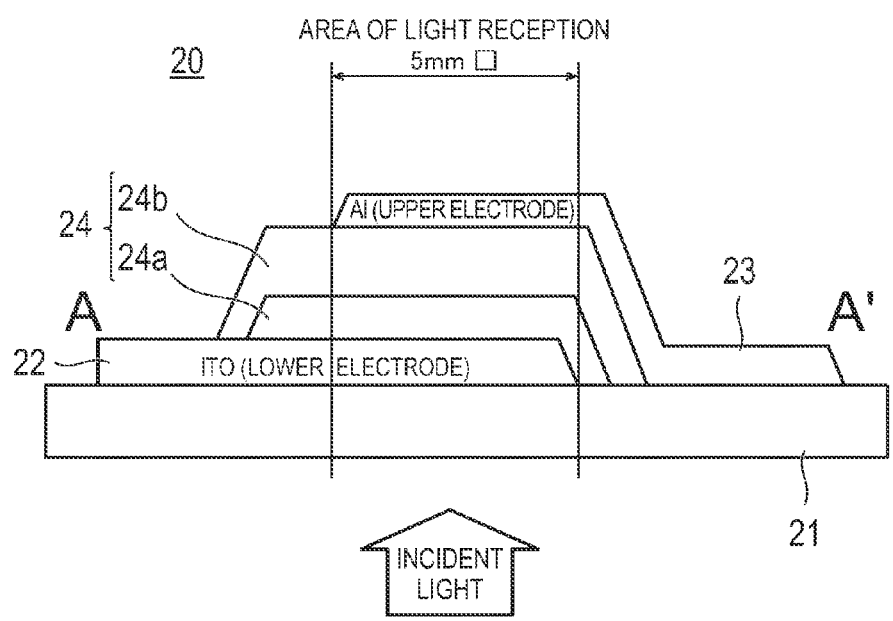

FIGS. 4(A) and 4(B) are diagrams illustrating the configuration of a photosensor array. FIG. 4(A) is a top view diagram, and FIG. 4(B) is a cross-sectional view diagram cut along the A-A' line of FIG. 4(A).

In FIG. 4, the photosensor array 20 includes, on a substrate 21 as a retention member, a positive electrode 22 as a lower electrode, a photoelectric conversion unit 24 converting light energy to electric energy, and a negative electrode 23 as an upper electrode, which constitutes a pair with the positive electrode 22, laminated in sequence. The photoelectric conversion unit 24 is composed of two layers, that is, a photoelectric conversion layer 24b including a bulk heterojunction layer in which a p-type semiconductor material and n-type semiconductor material uniformly mixed, and a buffer layer 24a. In the example illustrated in FIG. 4, six bulk heterojunction type organic photoelectric conversion elements are formed.

These substrate 21, positive electrode 22, photoelectric conversion layer 24b and negative electrode 23 exhibit the configuration and roles equivalent to those of the transparent electrode 12, photoelectric conversion layer 14, and counter electrode 13 in the bulk heterojunction type photoelectric conversion element 10 described above.

In the substrate 21, for example, glass is used; in the positive electrode 22, for example, ITO is used; and in the negative electrode 23, for example, aluminum is used. For the p-type semiconductor material of the photoelectric conversion layer 24b, a conjugated polymer compound having a partial structure represented by formula (1) is used, and for the n-type semiconductor material, for example, PCBM is used. Furthermore, in the buffer layer 24a, a PEDOT (poly-3,4-ethylenedioxythiophene)-PSS (polystyrenesulfonic acid) conductive polymer (manufactured by Starck Vtech, Ltd., trade name: BAYTRON P) is used. Such a photosensor array 20 is produced as follows.

An ITO film is formed by sputtering on a glass substrate, and the ITO film is processed into a predetermined pattern shape by photolithography. The thickness of the glass substrate is 0.7 mm, the thickness of the ITO film is 200 nm, and the area of the measured section (area of light reception) in the ITO film after photolithography is 0.5 mm×0.5 mm. Next, on this glass substrate 21, a PEDOT-PSS film was formed by a spin coating method (conditions; speed of rotation=1000 rpm, filter diameter=1.2 μm). Thereafter, the substrate is heated in an oven at 140° C. for 10 minutes, and dried. The thickness of the PEDOT-PSS film after drying is 30 nm.

Next, on the above-mentioned PEDOT-PSS film, a 1:1 mixed film of a compound having a partial structure represented by formula (1) and PCBM is formed by a spin coating method (conditions; speed of rotation=3300 rpm, filter diameter=0.8 μm). On the occasion of this spin coating, a mixed solution obtained by mixing the compound having a partial structure represented by formula (1) and PCBM at a ratio of 1:1 in chlorobenzene solvent, and stirring this mixture (5 minutes), is used. After the formation of a mixed film of the conjugated polymer compound having a partial structure represented by formula (1) and PCBM, the mixed film is heated in an oven at 180° C. in a nitrogen gas atmosphere for 30 minutes, and is subjected to an annealing treatment. The thickness of the mixed film of the conjugated polymer compound having a partial structure represented by formula (1) and PCBM after the annealing treatment is 70 nm.

Thereafter, the compound of the present invention 16 is vapor deposited to a thickness of 5 nm as an electron transport layer on the mixed film of the conjugated polymer compound having a partial structure represented by formula (1) and PCBM, using a metal mask having predetermined pattern openings, and then an aluminum layer is formed (thickness=10 nm) as a negative electrode by a vapor deposition method. Thereafter, a PVA (polyvinyl alcohol) layer is formed to a thickness of 1 μm by spin coating and is calcined at 150° C., and thus a passivation layer that is not shown in the diagram was produced. Thereby, a photosensor array 20 is produced. When light having a predetermined pattern is irradiated on this photosensor array 20, a photocurrent is detected only from the cells irradiated with light, and it is confirmed that the photosensor array functions as a photosensor.

EXAMPLES

Hereinafter, the present invention will be specifically described by way of Examples, but the present invention is not limited to these.

Meanwhile, the following exemplary compounds 101 to 115 correspond to each compound shown in the above Table 1.

Synthesis Examples 1-1

Synthesis of Exemplary Compound 101 (P101)

[Chemical Formula 30]

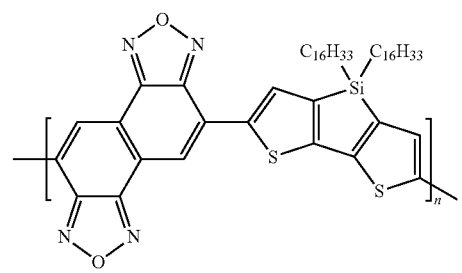

P101

The exemplary compound 101 is obtained by a polymerization reaction of a compound (A) and a compound (B').

[Chemical Formula 31]

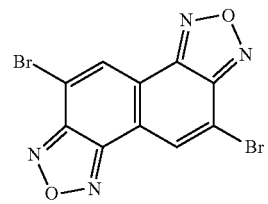

(A)

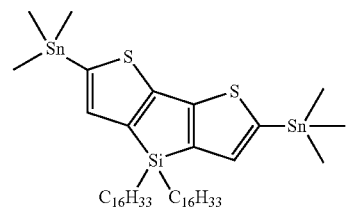

(B')

The compound (A) can be synthesized by the following scheme.

[Chemical Formula 32]

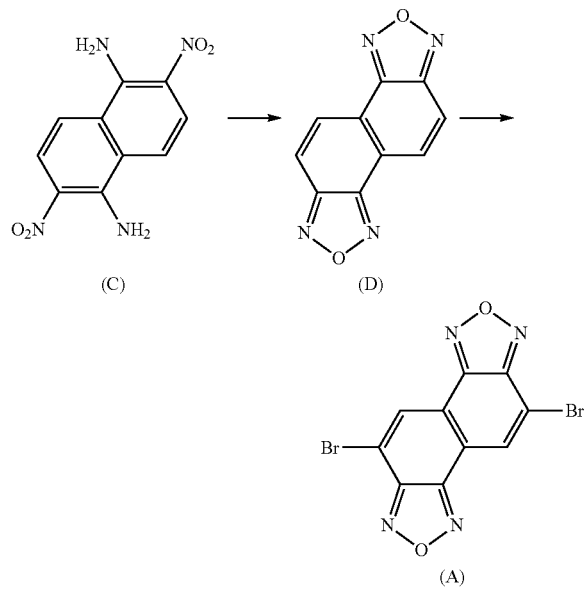

A compound (C) can be synthesized by making reference to Non-Patent literature (Russian Journal of Organic Chemistry Volume 38, Number 5, 699-708).

A compound (D) can be synthesized by making reference to Non-Patent literature (J. Med. Chem., 1968, p. 305).

Synthesis of Compound (D)

In a 100-ml three-necked flask that had been sufficiently purged with nitrogen, 0.25 g of the compound (C) was dissolved in ethanol saturated with 20 ml of KOH. 1.0 g of sodium hypochlorite thus obtained was slowly added thereto, and the mixture as stirred vigorously for one hour. After completion of the reaction, 500 ml of ice-cold water was added thereto, and a precipitate was collected by filtration. A filter cake thus collected was dissolved in 100 ml of ethanol, and 0.3 g of hydroxylamine hydrochloride was added thereto. The solution thus obtained was cooled in ice, and 0.9 g of potassium hydroxide was slowly added. After the addition, the mixture as stirred at room temperature for one hour, and subsequently the solvent was distilled off. Residue was heated for 5 hours at 100° C. The solid thus obtained was washed with water, and a crude compound (D) was obtained.

Synthesis of Compound (A)

In a 100-ml three-necked flask that had been sufficiently purged with nitrogen, 0.2 g of the crude compound (D) was dissolved in 20 ml of concentrated sulfuric acid. 0.4 g of NBS was slowly added to the solution thus obtained, and the mixture was heated and stirred at 100° C. for 8 hours. After completion of the reaction, the reaction liquid was added to 500 ml of ice-cold water. A precipitate was collected by filtration and washed thoroughly with water, and thus the compound (A) was obtained.

Synthesis of Compound (B')

The compound (B') was synthesized by making reference to the synthesis described in Non-Patent literature J. Am. Chem. Soc., 2008, 130, 16144-16145.

Synthesis of Exemplary Compound P101

In a 100-ml three-necked flask that had been sufficiently purged with nitrogen, 0.37 g of the compound (A) and 0.96 g of the compound (B') were introduced and dissolved in 20 ml of toluene that had been degassed in advance by bubbling nitrogen gas. 0.12 g of tetrakis(triphenylphosphine)palladium was added to the solution thus obtained, and the mixture as heated to reflux for 20 hours. After completion of the reaction, the reaction liquid was cooled to near room temperature. The reaction liquid was added to 200 ml of methanol, reprecipitation was carried out, and a precipitate was collected. The precipitate thus collected was treated to extract soluble components by Soxhlet extraction using heptane, chloroform and then ortho-dichlorobenzene, and the ortho-dichlorobenzene extract was reprecipitated in 500 ml of methanol. Thus, 0.53 g of an exemplary compound P101 was obtained.

The molecular weight of the exemplary compound 101 was measured, and the Mw was 40,000, while the polydispersity index (PDI) was 1.8.

Synthesis Example 2-1

Synthesis of Exemplary Compound 102 (P101)

[Chemical Formula 33]

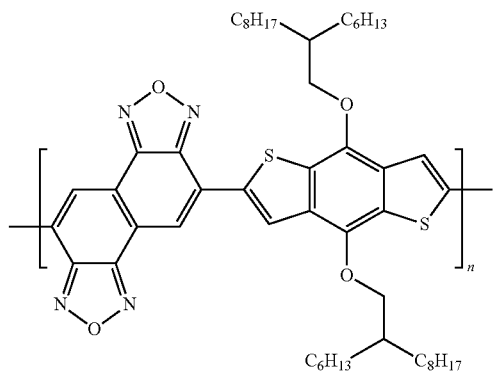

P102

An exemplary compound P102 is obtained by a polymerization reaction of the compound (A) and a compound (E').

[Chemical Formula 34]

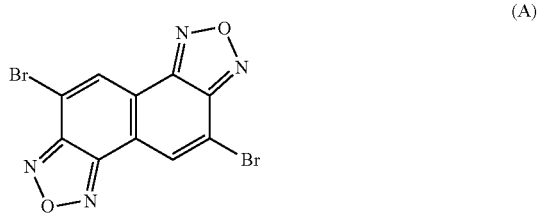

(A)

-continued

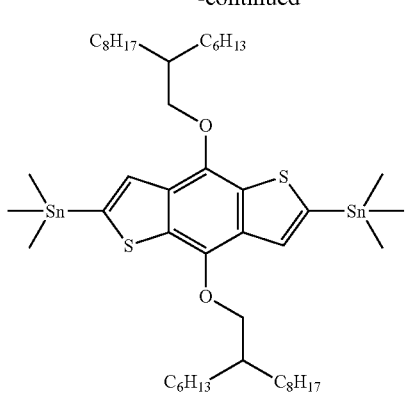

(E')

Synthesis of Compound (E')

The compound (E') was synthesized by making reference to Non-Patent literature J. Am. Chem. Soc., 2009, 131, 7792-7799.

Synthesis of Exemplary Compound 102

In 100-ml three-necked flask that had been sufficiently purged with nitrogen, 0.37 g of the compound (A) and 0.99 g of the compound (E') were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was collected. The precipitate thus collected was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.65 g of an exemplary compound 102 was obtained.

The molecular weight of the exemplary compound 102 was measured, and the Mw was 36,000, while the PDI was 1.7.

Synthesis Example 3-1

Synthesis of Exemplary Compound 103 (P103)

[Chemical Formula 35]

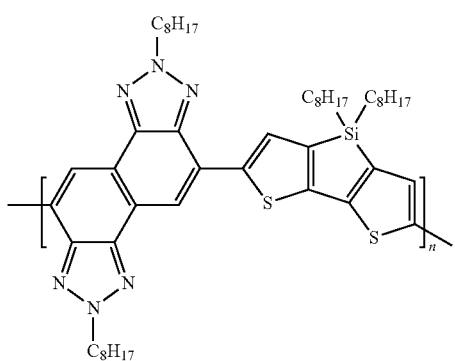

P103

An exemplary compound 103 is obtained by a polymerization reaction of a compound (F) and a compound (B).

[Chemical Formula 36]

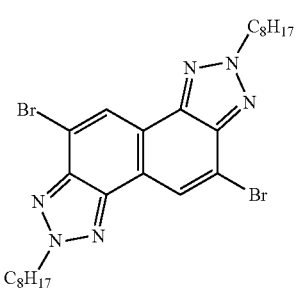

(F)

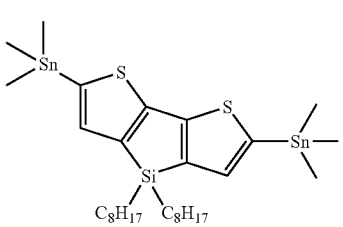

(B)

The compound (F) can be synthesized by the following synthesis route.

[Chemical Formula 37]

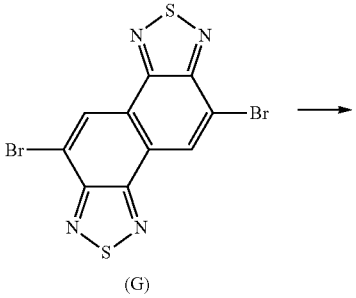

(G)

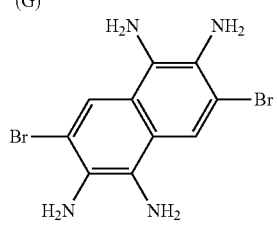

(H)

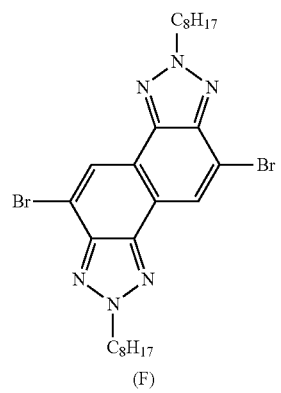

(F)

A compound (G) was synthesized by making reference to Non-Patent literature J. Am. Chem. Soc., 2011, 133(25), pp. 9638-9641.

A compound (H) was synthesized from the compound (G) by making reference to Non-Patent literature Bulletin of the Chem. Soc. of Japan, 1992, p. 2221.

Synthesis of Compound (H)

In a 100-ml three-necked flask that had been sufficiently purged with nitrogen, 0.40 g of the compound (G) was introduced and dissolved in 20 ml of concentrated hydrochloric acid. 2.00 g of tin chloride was slowly added to the solution thus obtained, and after the addition, the mixture was heated to reflux at 70° C. for 3 hours. After completion of the reaction, the reaction mixture was neutralized using sodium hydroxide, and after neutralization, the mixture was extracted with ethyl acetate. The extract was dried over magnesium sulfate, and the solvent was distilled off. A residue thus obtained was purified by silica gel column chromatography, and thus a compound (H) was obtained.

The compound (F) was synthesized from the compound (H) by making reference to Non-Patent literature JACS, 1957, p. 4395.

Synthesis of Compound (F)

In a 100-ml three-necked flask that had been sufficiently purged with nitrogen, 0.34 g of the compound (H) and 0.25 g of sodium nitrate were introduced and dissolved in 20 ml of water. The solution thus obtained was heated to reflux for 3 hours. After completion of the reaction, a precipitate was collected by filtration, a filter cake thus collected was dissolved in 100 ml of 1 Normal sodium hydroxide solution, and 0.50 g of octyl iodide was added thereto. A solution thus obtained was heated to reflux for 3 hours. After completion of the reaction, the solution was extracted with ethyl acetate, the extract was dried over magnesium sulfate, and the solvent was distilled off. A residue thus obtained was purified by silica gel column chromatography, and the compound (F) was obtained.

Synthesis of Exemplary Compound 103

In a 100-ml three-necked flask that had been sufficiently purged with nitrogen, 0.59 g of the compound (F) and 0.75 g of the compound (B) were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was collected. The precipitate thus collected was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.47 g of an exemplary compound 103 was obtained.

The molecular weight of the exemplary compound 103 was measured, and the Mw was 44,000, while the PDI was 2.0.

Synthesis Example 4-1

Synthesis of Exemplary Compound 104 (P104)

[Chemical Formula 38]

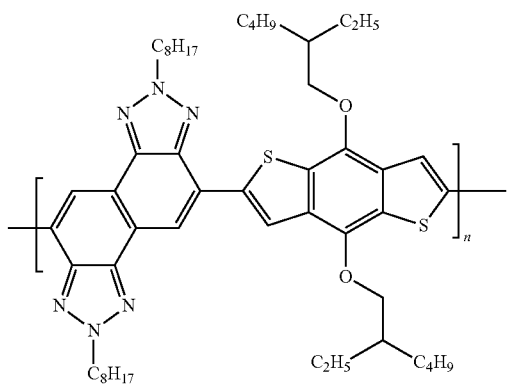

P104

An exemplary compound 104 is obtained by a polymerization reaction of the compound (F) and a compound (E).

[Chemical Formula 39]

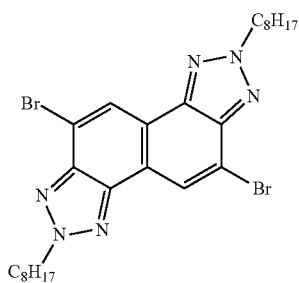

(F)

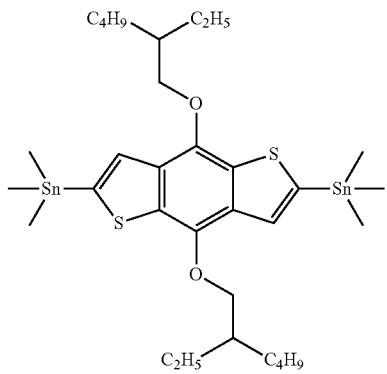

(E)

Synthesis of Exemplary Compound 104

In a 100-ml three-necked flask that had been sufficiently purged with nitrogen, 0.59 g of the compound (F) and 0.77 g of the compound (E) were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was collected. The precipitate thus collected was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.78 g of an exemplary compound 104 was obtained.

The molecular weight of the exemplary compound 104 was measured, and the Mw was 34,000, while the PDI was 1.6.

Synthesis Example 5-1

Synthesis of Exemplary Compound 105 (P105)

[Chemical Formula 40]

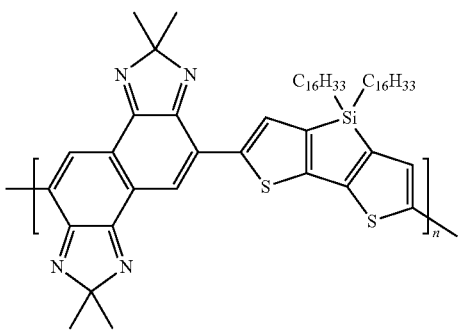

P105

An exemplary compound 105 is obtained by a polymerization reaction of a compound (I) and the compound (B').

[Chemical Formula 41]

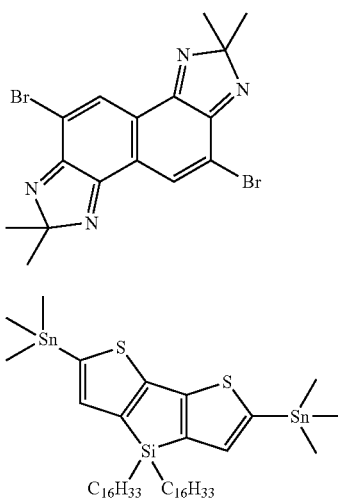

(I)

(B')

The compound (I) can be synthesized by the following conversion.

[Chemical Formula 42]

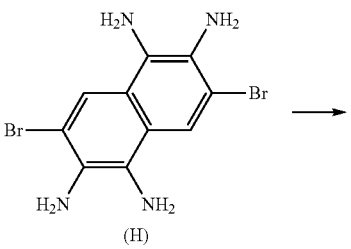

(H)

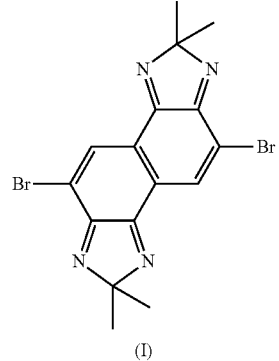

(I)

Synthesis of Compound (I)

The compound (I) was synthesized by making reference to J. Mater. Chem., 2010, 20, p. 6517.

0.35 g of a compound (H), 20 ml of acetone, 2.0 ml of acetic acid, and 20 ml of tetrahydrofuran (THF) were added, and the mixture was heated to reflux at 70° C. for 5 hours. After cooling in ice, ethyl acetate was added thereto, and the mixture was washed with water. An organic layer was extracted and dried over magnesium sulfate, and then the solvent was distilled off. A brown oil component was purified by silica gel column chromatography, and a solid was obtained. 20 ml of THF and 3.5 g of manganese oxide were added to the solid, and the mixture was stirred for 5 hours at room temperature. Manganese oxide was separated by filtration, and then the solvent was distilled off. An obtained orange-colored oil component was purified by silica gel column chromatography, and thus the compound (I) was obtained.

Synthesis of Exemplary Compound 105

In 100-ml three-necked flask that had been sufficiently purged with nitrogen, 0.42 g of the compound (I) and 0.97 g of the compound (B') were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was collected. The precipitate thus collected was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.40 g of an exemplary compound 105 was obtained.

The molecular weight of the exemplary compound 105 was measured, and the Mw was 37,000, while the PDI was 2.1.

Synthesis Example 6-1

Synthesis of Exemplary Compound 106

[Chemical Formula 43]

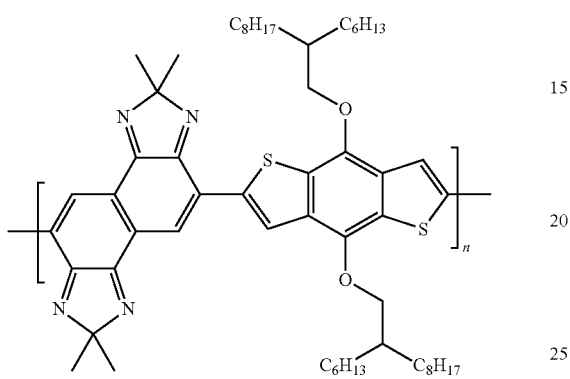

P106

An exemplary compound 106 is obtained by a polymerization reaction of the compound (I) and the compound (E').

[Chemical Formula 44]

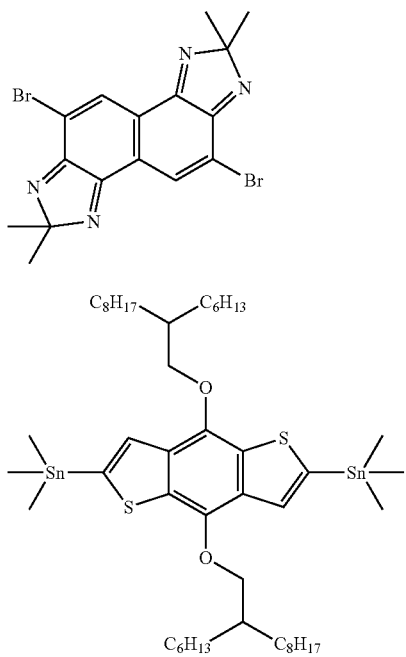

(I)

(E')

Synthesis of Compound 106

In a 100-ml three-necked flask that had been sufficiently purged with nitrogen, 0.42 g of the compound (I) and 0.99 g of the compound (E') were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was collected. The precipitate thus collected was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.61 g of an exemplary compound P106 was obtained.

The molecular weight of the exemplary compound 106 was measured, and the Mw was 30,000, while the PDI was 1.9.

Synthesis Example 7-1

Synthesis of Exemplary Compound 107

[Chemical Formula 45]

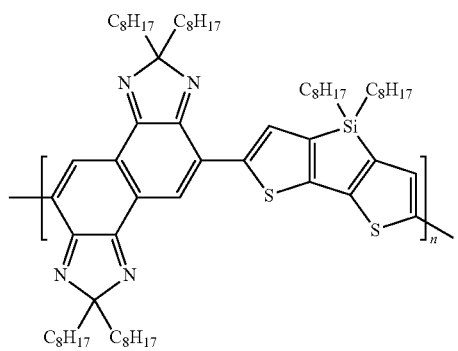

P107

An exemplary compound 107 is obtained by a polymerization reaction of a compound (J) and the compound (B).

[Chemical Formula 46]

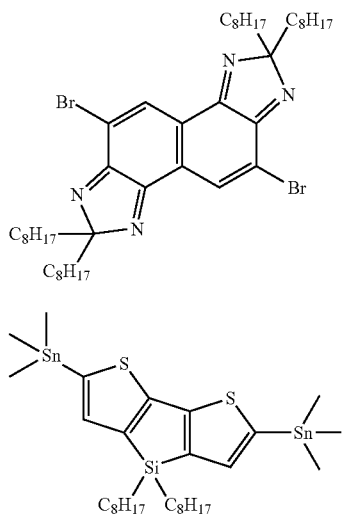

(J)

(B)

The compound (J) was synthesized by changing acetone to 9-heptadecanone in the synthesis of the compound (I).

Synthesis of Compound P107

In a 100-ml three-necked flask that had been sufficiently purged with nitrogen, 0.82 g of the compound (J) and 0.75 g of the compound (B) were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was collected. The precipitate thus collected was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.61 g of an exemplary compound 107 was obtained.

The molecular weight of the exemplary compound 107 was measured, and the Mw was 45,000, while the PDI was 1.8.

Synthesis Example 8-1

Synthesis of Exemplary Compound 108

[Chemical Formula 47]

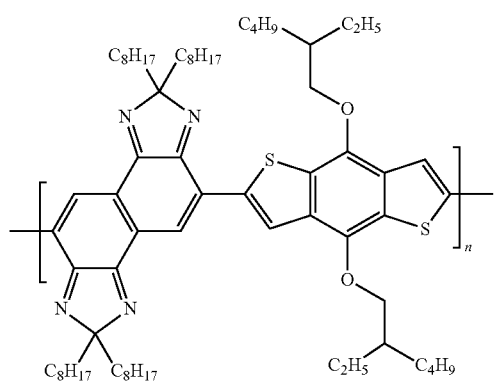

P108

An exemplary compound 108 is obtained by a polymerization reaction of the compound (J) and the compound (E).

[Chemical Formula 48]

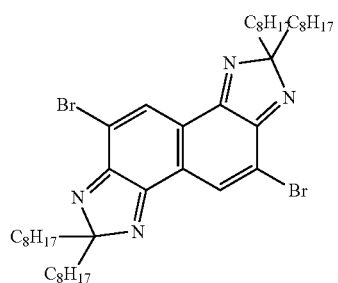

(J)

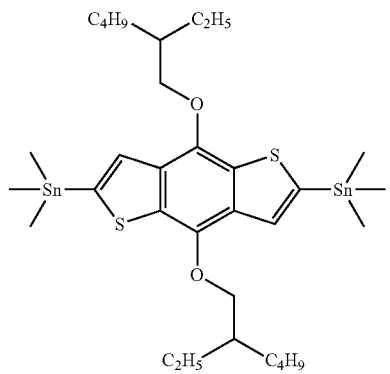

(E)

Synthesis of Compound 108

In a 100-ml three-necked flask that had been sufficiently purged with nitrogen, 0.82 g of the compound (J) and 0.77 g of the compound (E) were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was collected. The precipitate thus collected was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.44 g of an exemplary compound 108 was obtained.

The molecular weight of the exemplary compound 108 was measured, and the Mw was 44,000, while the PDI was 2.2.

Synthesis Example 9-1

Synthesis of Exemplary Compound 109

[Chemical Formula 49]

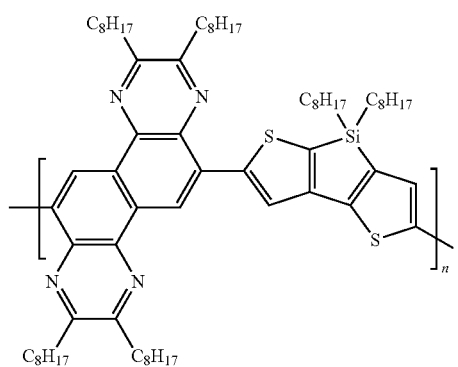

P109

The exemplary compound 109 is obtained by a polymerization reaction of a compound (K) and the compound (B)

[Chemical Formula 50]

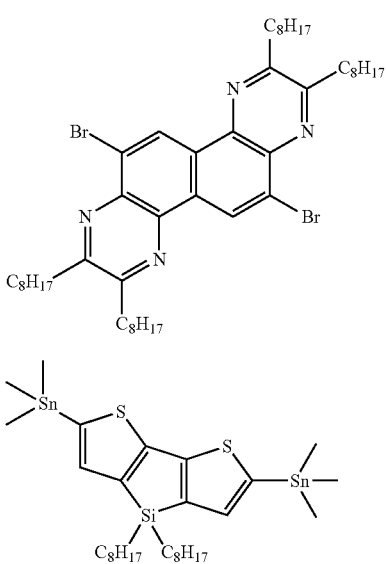

The compound (K) can be synthesized by the following conversion.

[Chemical Formula 51]

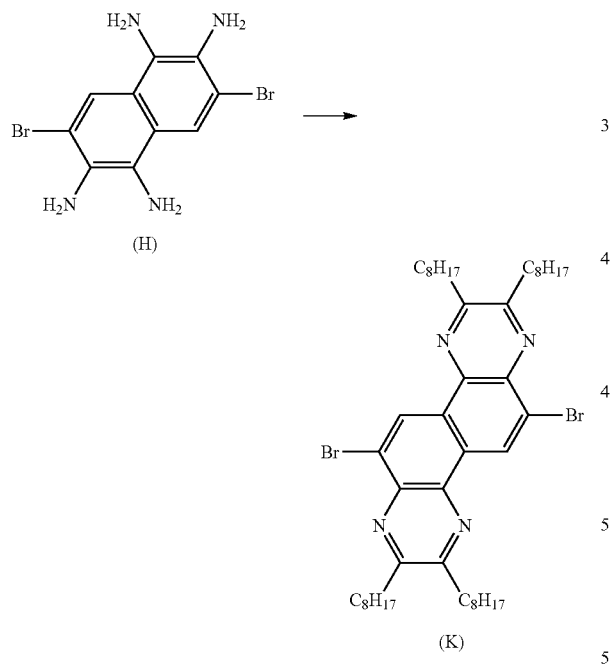

Synthesis of Compound (K)

0.34 g of the compound (H), 0.5 g of 9,10-octadecanedione (synthesized by making reference to Journal of Organic Chemistry, 2002, p. 9073), and 2.0 ml of acetic acid were added, and the mixture was heated to reflux for 12 hours. After cooling in ice, ethyl acetate was added thereto, and the mixture was washed with water. An organic layer was extracted and dried over magnesium sulfate, and the solvent was distilled off. A residue was purified by silica gel column chromatography, and a compound (K) was obtained.

Synthesis of Exemplary Compound 109

In a 100-ml three-necked flask that had been sufficiently purged with nitrogen, 0.84 g of the compound (K) and 0.75 g of the compound (B) were introduced and dissolved in 20 ml of toluene that had been degassed in advance by bubbling nitrogen gas. 0.12 g of tetrakis(triphenylphosphine)palladium was added to the solution thus obtained, and the mixture as heated to reflux for 20 hours. After completion of the reaction, the reaction liquid was cooled to near room temperature. The reaction liquid was added to 200 ml of methanol, reprecipitation was carried out, and a precipitate was collected. The precipitate thus collected was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.66 g of an exemplary compound 109 was obtained.

The molecular weight of the exemplary compound 109 was measured, and the Mw was 39,000, while the PDI was 2.4.

Synthesis Example 10-1

Synthesis of Exemplary Compound 110 (P110)

[Chemical Formula 52]

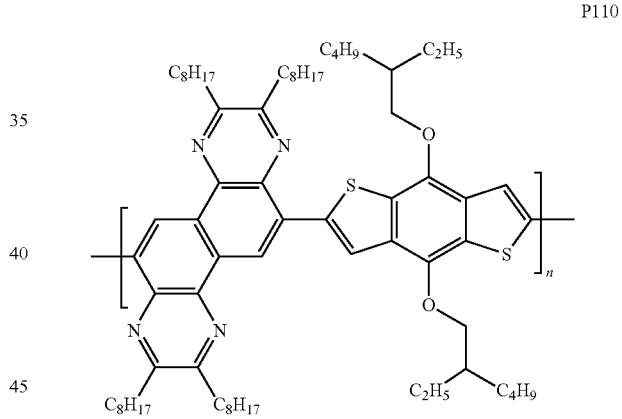

An exemplary compound 110 is obtained by a polymerization reaction of the compound (K) and the compound (E).

[Chemical Formula 53]

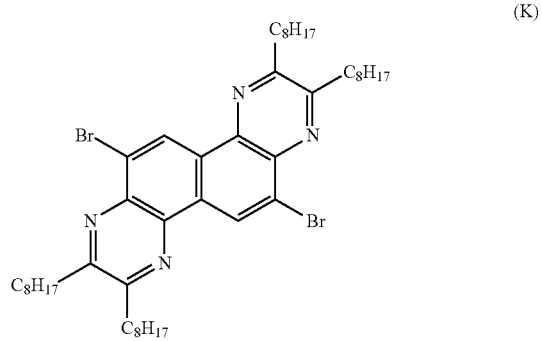

-continued

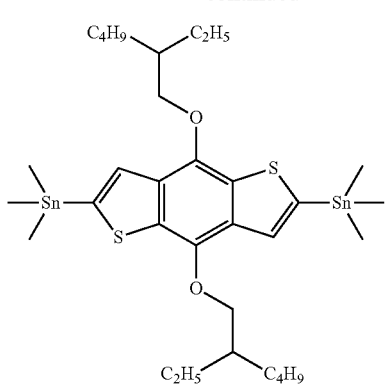

(E)

Synthesis of Exemplary Compound 110

In a 100-ml three-necked flask that had been sufficiently purged with nitrogen, 0.84 g of the compound (K) and 0.77 g of the compound (E) were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was collected. The precipitate thus collected was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.65 g of the exemplary compound 110 was obtained.

The molecular weight of the exemplary compound P110 was measured, and the Mw was 39,000, while the PDI was 2.1.

Synthesis Example 11-1

Synthesis of Exemplary Compound 111 (P111)

[Chemical Formula 54]

P111

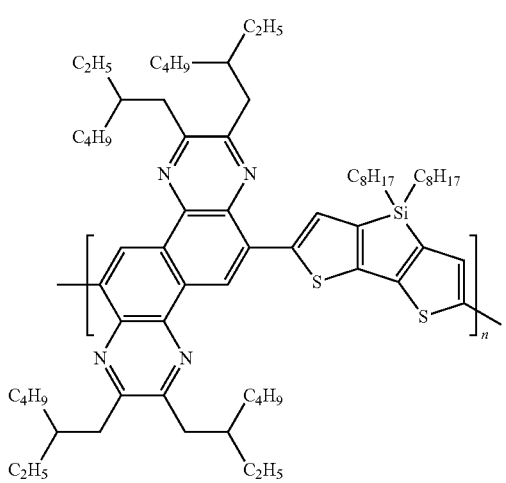

An exemplary compound 111 is obtained by a polymerization reaction of a compound (N) and the compound (B).

[Chemical Formula 55]

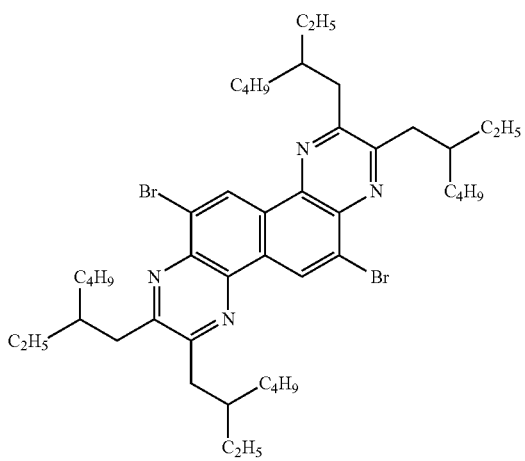

(N)

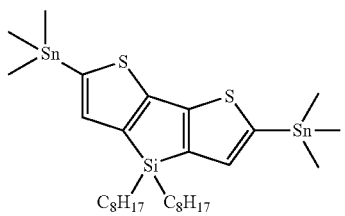

(B)

Synthesis of Compound (N)

A compound (N) was synthesized by changing 9,10-octadecanedione to 5,10-diethyl-7,8-tetradecanedione (synthesized by making reference to Organic Letters, 2008, p. 3513) in the synthesis of the compound (K).

Synthesis of Exemplary Compound 111

In a 100-ml three-necked flask that had been sufficiently purged with nitrogen, 0.70 of the compound (N) and 0.75 g of the compound (B) were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was recovered. The precipitate thus recovered was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.12 g of an exemplary compound 111 was obtained.

The molecular weight of the exemplary compound 111 was measured, and the Mw was 25,000, while the PDI was 2.0.

Synthesis Example 12-1

Synthesis of Exemplary Compound 112 (P112)

[Chemical Formula 56]

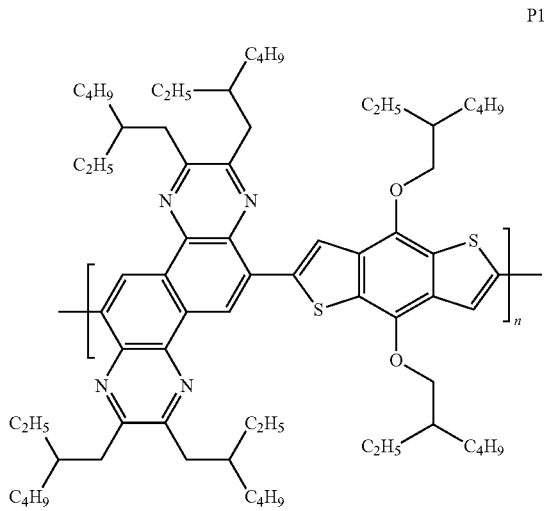

P112

An exemplary compound P112 is obtained by a polymerization reaction of the compound (N) and the compound (E).

[Chemical Formula 57]

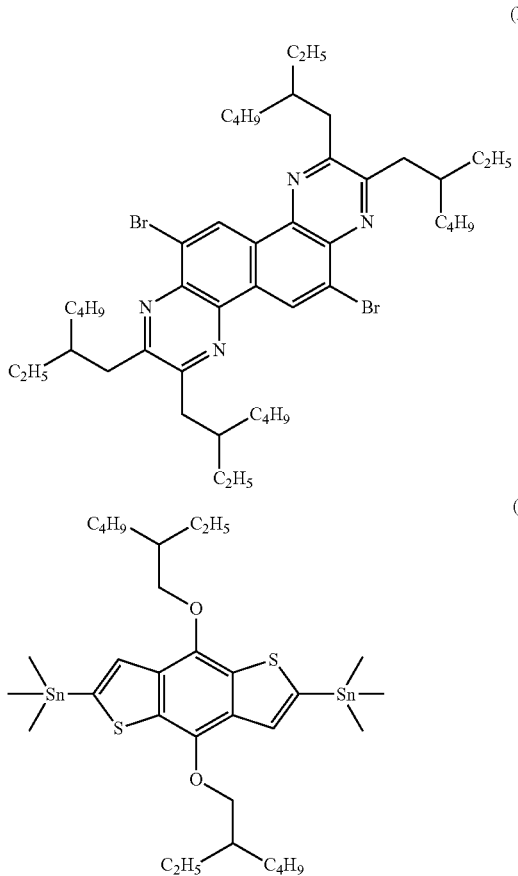

(N)

(E)

Synthesis of Exemplary Compound P112

In a 100-ml three-necked flask that had been sufficiently purged with nitrogen, 0.70 g of the compound (N) and 0.77 g of the compound (E) were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was recovered. The precipitate thus recovered was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.51 g of an exemplary compound 112 was obtained.

The molecular weight of the exemplary compound 112 was measured, and the Mw was 30,000, while the PDI was 2.4.

Synthesis Example 13-1

Synthesis of Exemplary Compound 113 (P113)

[Chemical Formula 58]

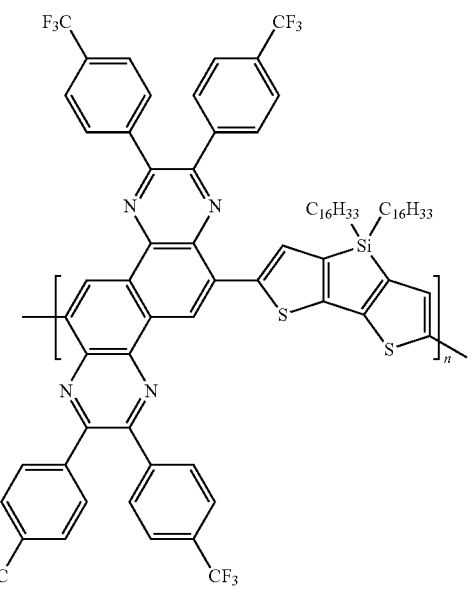

P113

An exemplary compound P113 is obtained by a polymerization reaction of a compound (M) and the compound (B').

[Chemical Formula 59]

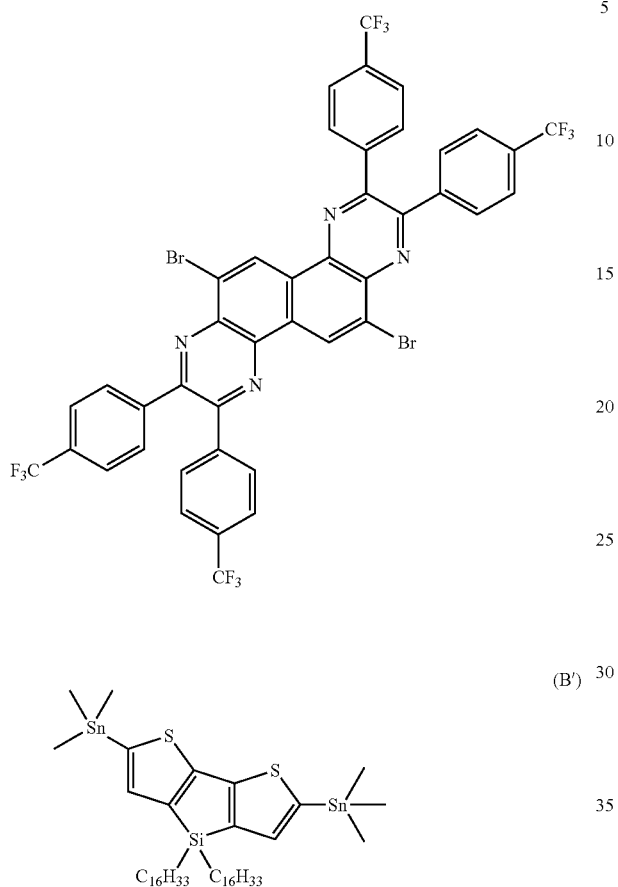

(M)

(B')

Synthesis of Compound (M)

A compound (M) was synthesized by changing 9,10-octadecanedione to ditrifluoromethylbenzil in the synthesis of the compound (K).

Synthesis of Exemplary Compound 113

In a 100-ml three-necked flask that had been sufficiently purged with nitrogen, 0.97 g of the compound (M) and 0.97 g of the compound (B') were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was recovered. The precipitate thus recovered was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.71 g of an exemplary compound 113 was obtained.

The molecular weight of the exemplary compound 113 was measured, and the Mw was 24,000, while the PDI was 1.8.

Synthesis Example 14-1

Synthesis of Exemplary Compound 114 (P114)

[Chemical Formula 60]

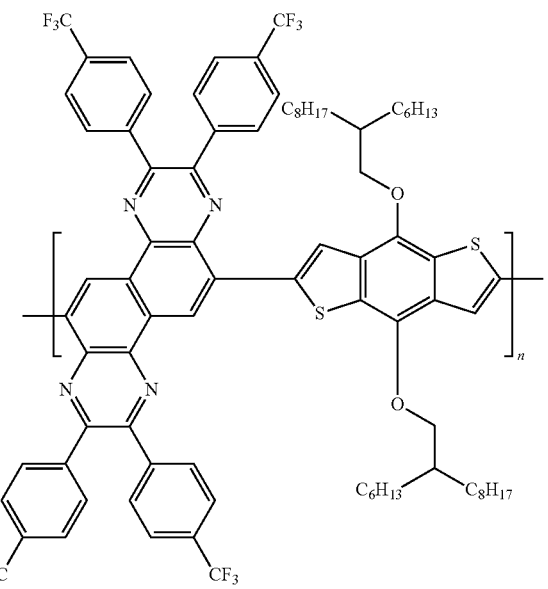

P114

An exemplary compound P114 is obtained by a polymerization reaction of the compound (M) and the compound (E').

[Chemical Formula 61]

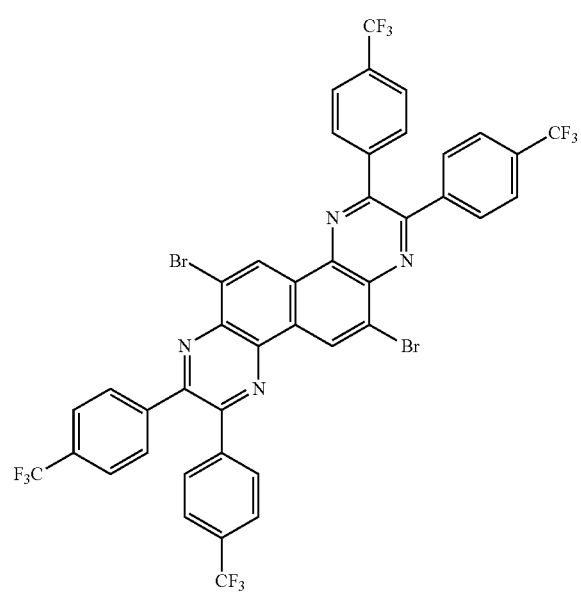

(M)

-continued

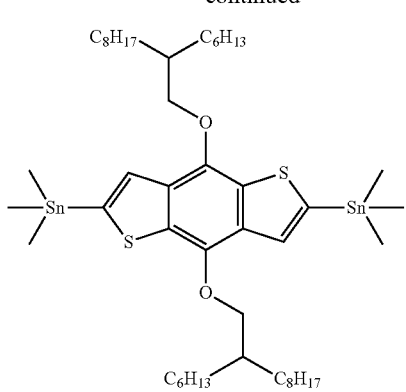
(E')

Synthesis of Exemplary Compound 114

In a 100-ml three-necked flask that had been sufficiently purged with nitrogen, 0.75 g of the compound (M) and 0.99 g of the compound (E') were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was recovered. The precipitate thus recovered was treated by extracting soluble components by Soxhlet extraction using heptane, chloroform and then ortho-dichlorobenzene, and the ortho-dichlorobenzene extract was subjected to reprecipitation with 500 ml of methanol. Thus, 0.77 g of an exemplary compound P114 was obtained.

The molecular weight of the exemplary compound P114 was measured, and the Mw was 23,000, while the PDI was 2.4.

Synthesis Example 15-1

Synthesis of Exemplary Compound 115 (P115)

[Chemical Formula 62]

An exemplary compound 115 is obtained by a polymerization reaction of the compound (N) and a compound (O).

[Chemical Formula 63]

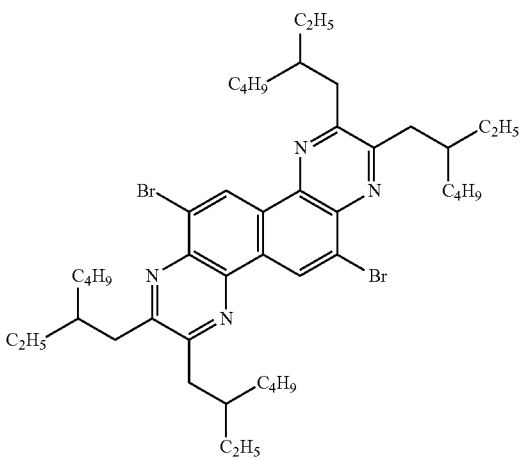
(N)

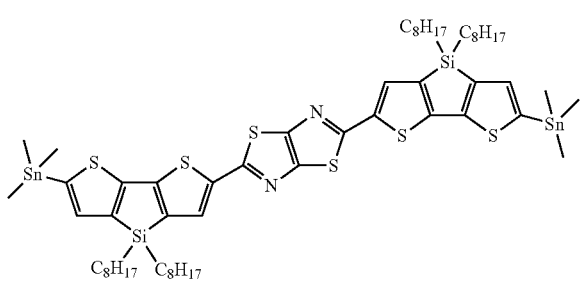
(O)

The compound (O) can be synthesized by making reference to Macromolecules 2011, 44, 6245.

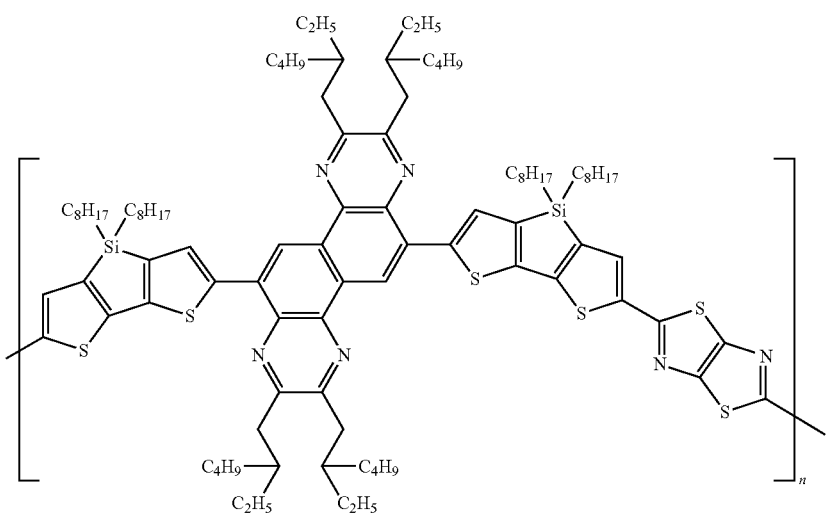
P115

Synthesis of Exemplary Compound P115

In a 100-ml three-necked flask that had been sufficiently purged with nitrogen, 0.84 g of the compound (N) and 1.3 g of the compound (O) were introduced and dissolved in 20 ml of toluene that had been degassed in advance by bubbling nitrogen gas. 0.12 g of tetrakis(triphenylphosphine)palladium was added to the solution thus obtained, and the mixture was heated to reflux for 20 hours. After completion of the reaction, the reaction liquid was cooled to near room temperature. The reaction liquid was added to 200 ml of methanol, reprecipitation was carried out, and a precipitate was recovered. The precipitate thus recovered was treated by extracting soluble components by Soxhlet extraction using heptane, chloroform and then ortho-dichlorobenzene, and the ortho-dichlorobenzene extract was subjected to reprecipitation with 500 ml of methanol. Thus, 1.0 g of an exemplary compound 115 was obtained.

The molecular weight of the exemplary compound 115 was measured, and the Mw was 39,000, while the PDI was 2.4.

Synthesis Example 16-1

Synthesis of Exemplary Compound 116 (P116)

[Chemical Formula 64]

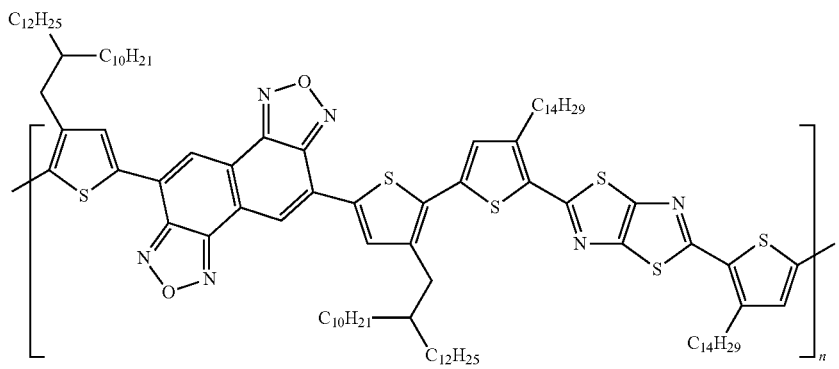

P116

An exemplary compound P116 is obtained by a polymerization reaction of a compound (Q) and a compound (R).

[Chemical Formula 65]

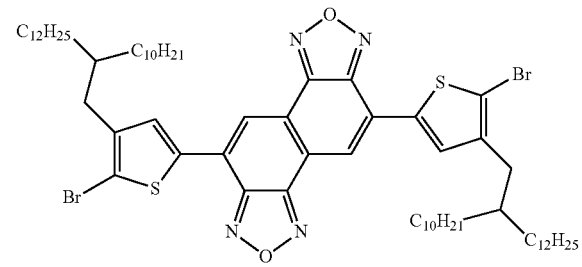

(Q)

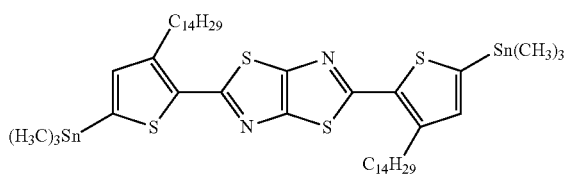

(R)

The compound (Q) can be synthesized by the following scheme.

[Chemical Formula 66]

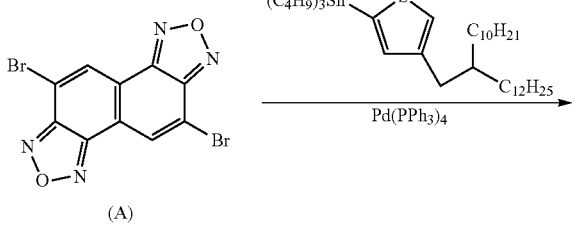

(A)

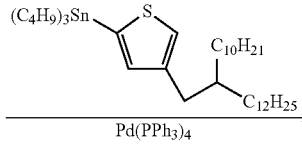

Pd(PPh₃)₄

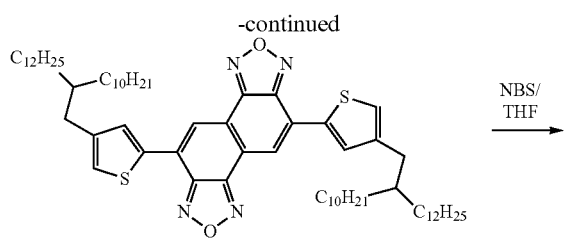

(P)

NBS/ THF

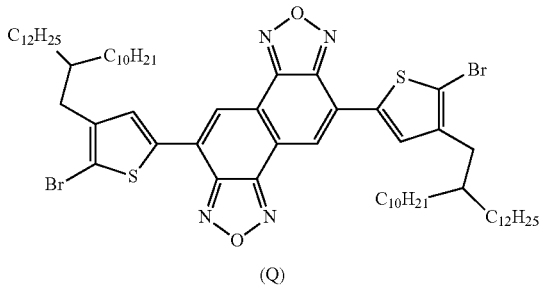

(Q)

Synthesis of Compound (P)

A compound P was synthesized by making reference to Non-Patent literature 3. 1.70 g (2.4 mmol) of 3-[2-decyltetradecyl]-1-tributylstannylthiophene and 407 mg (1.1 mmol) of the compound (A) were dissolved in 50 ml of toluene, and 95 mg of tris(dibenzylideneacetone)dipalladium (0) and 126 mg of tris(o-tolyl)phosphine were added thereto. This solution was further purged with nitrogen for 15 minutes. Thereafter, the solution was heated to 110° C. to 120° C. and was allowed to react for 4 hours. After cooling naturally, toluene was distilled off, and purification was carried out by silica gel column chromatography using an eluent of toluene:heptane=100:0 to 100:10. Thereby, 335 mg (yield 29%) of the compound (P) was obtained.

Synthesis of Compound (Q)

335 mg (0.32 mmol) of the compound (P) was dissolved in 20 ml of THF, 125 mg (0.70 mmol) of N-bromosuccinimide (NBS) was added thereto, and the mixture was stirred for 3.5 hours at 50° C. After completion of the reaction, the solvent was distilled off, and purification was carried out by silica gel column chromatography using an eluent of toluene:heptane=100:0 to 100:10. Thus, 330 mg (yield 85%) of the compound (Q) was obtained.

Synthesis of Compound (R)

A compound (R) was synthesized according to the descriptions of WO 2011/85004.

Synthesis of Exemplary Compound P116

300 mg (0.25 mmol) of the compound (Q) and 256 mg (0.25 mmol) of the compound (R) were dissolved in 20 ml of anhydrous toluene. This solution was purged with nitrogen, and then 6.3 mg (0.007 mmol) of tris(dibenzylideneacetone) dipalladium (0) and 16.7 mg (0.055 mmol) of tris(o-tolyl) phosphine were added thereto. This solution was further purged with argon for 15 minutes. Thereafter, the solution was heated to 110° C. to 120° C. and was allowed to react for 72 hours. Furthermore, in order to perform end-capping, 2-tributyltin thiophene (11 mg, 0.03 mmol) was added thereto, and the mixture was heated to reflux for 10 hours. Furthermore, 2-bromothiophene (10 mg, 0.06 mmol) was added thereto, and the mixture was heated to reflux for 10 hours. After completion of the reaction, the mixture was reprecipitated with methanol (500 ml), and a polymer product collected by filtration was treated by extracting soluble components by Soxhlet extraction using methanol, acetone, heptane, chloroform, and then ortho-dichlorobenzene, and reprecipitating with methanol. Thus, 220 mg of a pure polymer (exemplary compound 116) was obtained.

The molecular weight of the exemplary compound 116 was measured, and the Mw was 55,000, while the PDI was 2.5.

Synthesis Example 17-1

Synthesis of Exemplary Compound 117 (P117)

[Chemical Formula 67]

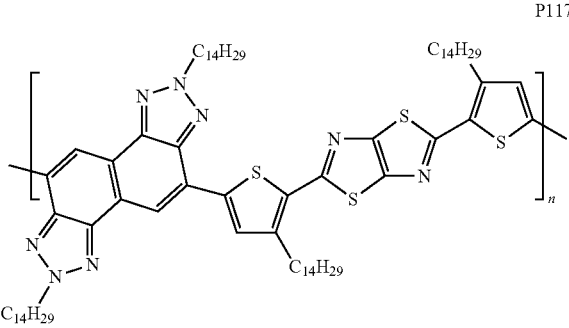

An exemplary compound P117 is obtained by a polymerization reaction of a compound (F') and the compound (R).

[Chemical Formula 68]

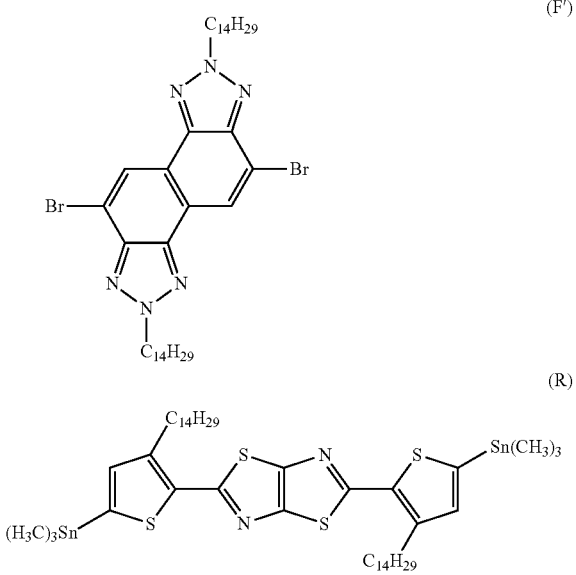

Synthesis of Compound (F')

The compound (F') was synthesized by changing octyl iodide to tetradecyl iodide in the synthesis of the compound (F).

Synthesis of Exemplary Compound 117

An exemplary compound 117 was synthesized in the same manner as in the synthesis of the exemplary compound 116, except that the compound (Q) was changed to 190 mg of the compound (F').

The molecular weight of the exemplary compound 117 was measured, and the Mw was 35,000, while the PDI was 2.3.

Synthesis Example 18-1

Synthesis of Exemplary Compound 118 (P118)

[Chemical Formula 69]

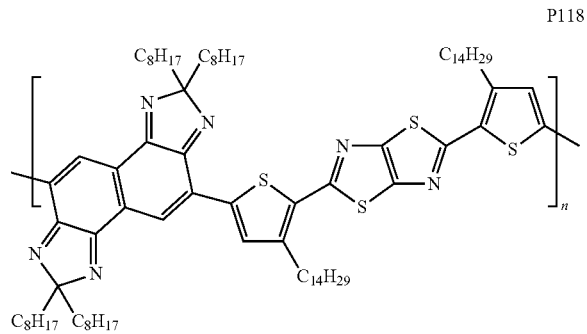

(P118)

An exemplary compound P118 is obtained by a polymerization reaction of the compound (J) and the compound (R).

[Chemical Formula 70]

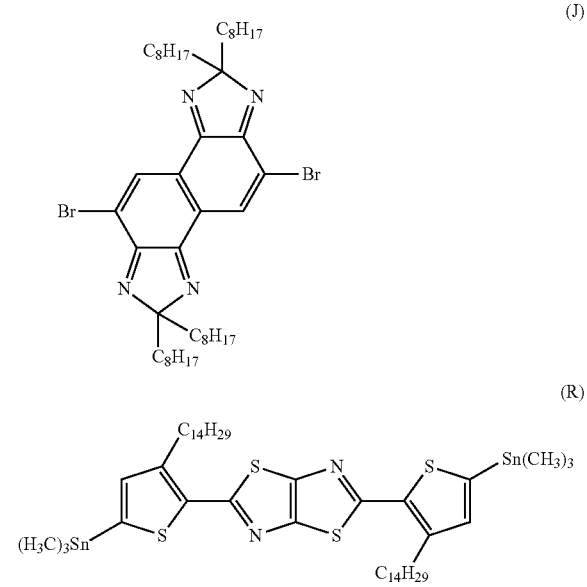

(J)

(R)

Synthesis of Exemplary Compound 118

The exemplary compound 117 was synthesized in the same manner as in the synthesis of the exemplary compound 116, except that the compound (Q) was changed to 205 mg of the compound (J).

The molecular weight of the exemplary compound 118 was measured, and the Mw was 47,000, while the PDI was 2.7.

Example 1-2

Production of Inversion Layer Organic Photoelectric Conversion Element

An inversion layer organic photoelectric conversion element was produced as follows, by making reference to the description of JP-A No. 2009-146981.

(Formation of Transparent Electrode (Negative Electrode))

On a glass substrate, an indium tin oxide (ITO) transparent conductive film was deposited to a thickness of 110 nm (surface resistivity: 13Ω/□), and this was subjected to patterning at a width of 2 mm using photolithography and hydrochloric acid etching. This was subjected to ultrasonic cleaning using a mixed liquid of a surfactant and ultrapure water, and then was further subjected to ultrasonic cleaning using ultrapure water. The transparent conductive film was dried by nitrogen blowing, and was finally subjected to ultraviolet-ozone cleaning. Thus, a transparent electrode (negative electrode) was formed.

(Formation of Electron Transport Layer)

The substrate on which the transparent electrode was formed was introduced into a glove box (oxygen concentration: 10 ppm, dew point: −80° C.), and in a nitrogen atmosphere, a 150 mM TiOx precursor solution was spin coated on the transparent electrode (speed of rotation: 2000 rpm, rotation time: 60 seconds), and the precursor solution was wiped off into a predetermined pattern. This was left to stand in air for 2 hours to hydrolyze the TiOx precursor, and then the film was heat treated for one hour at 150° C. Thereby, an electron transport layer formed from a TiOx layer having a thickness of 30 nm was formed.

Meanwhile, the 150 mM TiOx precursor solution was prepared by the following method (sol-gel method). In a 100-mL three-necked flask, 12.5 mL of 2-methoxyethanol and 6.25 mmol of titanium tetraisopropoxide were introduced, and the mixture was cooled for 10 minutes in an ice bath. Next, 12.5 mmol of acetylacetone was slowly added thereto, and the mixture was stirred for 10 minutes in an ice bath. Next, this mixed solution was heated at 80° C. for 2 hours, and then was heated to reflux for one hour. This was cooled to room temperature (25° C.), and the concentration was adjusted to 150 mM using 2-methoxyethanol. Thus, a TiOx precursor solution was obtained. Meanwhile, the above-described process was entirely carried out in a nitrogen atmosphere.

(Formation of Photoelectric Conversion Layer)

A mixed solution was prepared by dissolving 1.0% by mass of the compound 101 synthesized in Synthesis Example 1-1 as a p-type organic semiconductor, and 0.8% by mass of PCBM (NANOM SPECTRA E100, manufactured by Frontier Carbon, Ltd.) as an n-type organic semiconductor in chlorobenzene. While this mixed solution was filtered using a filter having a pore size of 0.45 μm, the mixed solution was spin coated (at 700 rpm for 60 seconds, and then at 2200 rpm for 1 second) on the electron transport layer to obtain a film thickness after drying of 160 nm. Thereafter, this was dried for 30 minutes at room temperature (25° C.), and thereby a photoelectric conversion layer was formed. The substrate was taken out from the glove box.

(Formation of Hole Transport Layer)

In an air atmosphere (relative humidity: 40%), an organic solvent-based dispersion liquid of PEDOT:PSS (ENOCOAT HC200, manufactured by Kaken Industry Co., Ltd.) was spin coated (2000 rpm, for 60 seconds) on the photoelectric conversion layer, and this was dried in air. Thus, a hole transport layer was formed.

(Formation of Counter Electrode (Positive Electrode))

On the hole transport layer, a silver electrode layer was vapor deposited to a film thickness of about 100 nm, and was subsequently heat treated for 10 minutes at 150° C. Thus, a counter electrode (positive electrode) was formed. Thus, an inversion layer organic photoelectric conversion element 1-2 was completed by the above-described process.

Examples 2-2 to 18-2

Inversion layer organic photoelectric conversion elements were produced by the same method as that used in Example 1-2, except that the compounds 102 to 118 synthesized in Synthesis Examples 2-1 to 18-1, respectively, were used as the p-type organic semiconductor for the formation of the photoelectric conversion layer.

Comparative Examples 1-2 to 2-2

Comparative Compounds 1 and 2 were synthesized by making reference to Non-Patent literature J. Am. Chem. Soc., 2011, 133(25), pp. 9638-9641; J. Am. Chem. Soc., 2008, 130, 16144-16145; and J. Am. Chem. Soc., 2009, 131, 7792-7799.

[Chemical Formula 71]

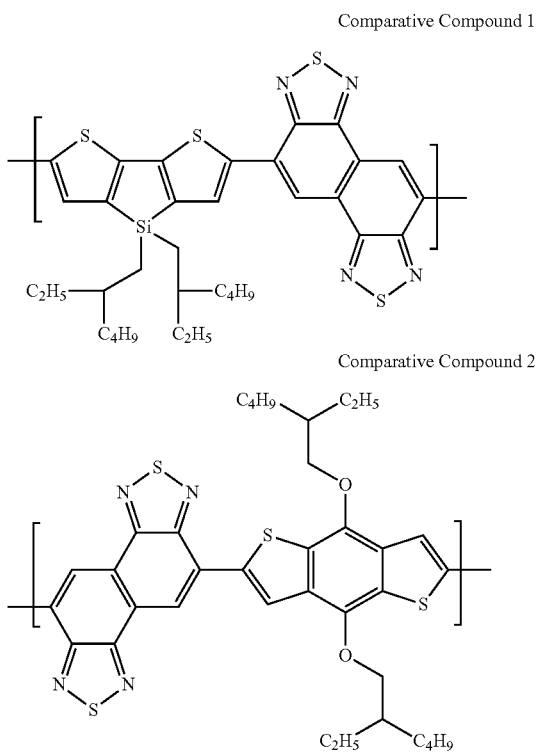

Comparative Compound 1

Comparative Compound 2

Inversion layer organic photoelectric conversion elements were produced by the same method as that used in Example 1-2, except that the Comparative Compounds 1 and 2 were used as the p-type organic semiconductor for the formation of the photoelectric conversion layer.

Examples 1-3 to 18-3 and Comparative Examples 1-3 to 2-3

Production of inversion layer organic photoelectric conversion elements of Examples 1-3 to 18-3 and Comparative Examples 1-3 to 2-3 was carried out by a similar method to Examples 1-2 to 15-2 and Comparative Examples 1-2 to 2-2, except that, after photoelectric conversion layers were produced, hole transport layers were formed directly in the glove box, without taking out the elements from the glove box (GB) in a nitrogen atmosphere (oxygen concentration: 10 ppm, dew point: −80° C.)

<Evaluation of Inversion Layer Organic Photoelectric Conversion Elements>

(Evaluation of Open Circuit Voltage, Fill Factor, and Photoelectric Conversion Efficiency)

Each of the organic photoelectric conversion elements was sealed with an epoxy resin and a glass cap. This was irradiated with light with an intensity of 100 mW/cm$^2$ using a solar simulator (AM 1.5 G filter), a mask having an effective area of 1 cm$^2$ was stacked over the light receiving area, and the IV characteristics were evaluated. Thus, the short circuit current density $J_{sc}$ (mA/cm$^2$), the open circuit voltage $V_{oc}$ (V), and the fill factor (FF) were measured. From the values of $J_{sc}$, $V_{oc}$ and FF thus obtained, the photoelectric conversion efficiency η [%] was calculated by the following formula (1). The results are presented in Table 2.

[Mathematical Formula 1]

$$\eta\ [\%] = J_{sc}\ [mA/cm^2] \times V_{oc}\ [V] \times FF\ [\%] \quad\quad [Formula\ (1)]$$

(Evaluation of Durability)

All of the organic photoelectric conversion elements thus produced were stored in a vessel maintained at a temperature of 80° C. and a humidity of 80%, and the elements were taken out regularly to measure the IV characteristics. The time taken by the initial photoelectric conversion efficiency, which was taken as 100, to decrease to an efficiency of 80%, was evaluated as LT80 [hours]. A larger value of the LT80 means more satisfactory durability. The results are presented in Table 2.

TABLE 2

| | p-type organic semiconductor | Formation of hole transport layer Coating environment | $V_{oc}$ | FF | Photoelectric conversion efficiency [%] | LT80 [h] |
|---|---|---|---|---|---|---|
| Example 1-2 | Compound 101 | In air | 0.67 | 0.55 | 4.8 | 200 |
| Example 1-3 | | In GB | 0.67 | 0.6 | 5.0 | 600 |
| Example 2-2 | Compound 102 | In air | 0.66 | 0.55 | 4.8 | 210 |
| Example 2-3 | | In GB | 0.67 | 0.61 | 5.0 | 700 |

TABLE 2-continued

| | p-type organic semiconductor | Formation of hole transport layer Coating environment | $V_{oc}$ | FF | Photoelectric conversion efficiency [%] | LT80 [h] |
|---|---|---|---|---|---|---|
| Example 3-2 | Compound 103 | In air | 0.67 | 0.59 | 4.9 | 220 |
| Example 3-3 | | In GB | 0.67 | 0.64 | 5.3 | 650 |
| Example 4-2 | Compound 104 | In air | 0.69 | 0.58 | 5.0 | 190 |
| Example 4-3 | | In GB | 0.7 | 0.63 | 5.1 | 590 |
| Example 5-2 | Compound 105 | In air | 0.68 | 0.59 | 5.1 | 200 |
| Example 5-3 | | In GB | 0.69 | 0.63 | 5.5 | 640 |
| Example 6-2 | Compound 106 | In air | 0.69 | 0.59 | 5.1 | 220 |
| Example 6-3 | | In GB | 0.7 | 0.6 | 5.3 | 700 |
| Example 7-2 | Compound 107 | In air | 0.74 | 0.61 | 5.3 | 260 |
| Example 7-3 | | In GB | 0.75 | 0.61 | 5.6 | 700 |
| Example 8-2 | Compound 108 | In air | 0.7 | 0.59 | 5.2 | 290 |
| Example 8-3 | | In GB | 0.71 | 0.61 | 5.4 | 750 |
| Example 9-2 | Compound 109 | In air | 0.7 | 0.58 | 5.1 | 300 |
| Example 9-3 | | In GB | 0.71 | 0.61 | 5.3 | 800 |
| Example 10-2 | Compound 110 | In air | 0.72 | 0.61 | 5.3 | 300 |
| Example 10-3 | | In GB | 0.74 | 0.62 | 5.7 | 850 |
| Example 11-2 | Compound 111 | In air | 0.74 | 0.61 | 5.5 | 310 |
| Example 11-3 | | In GB | 0.75 | 0.64 | 5.6 | 890 |
| Example 12-2 | Compound 112 | In air | 0.74 | 0.61 | 5.4 | 300 |
| Example 12-3 | | In GB | 0.75 | 0.65 | 5.6 | 900 |
| Example 13-2 | Compound 113 | In air | 0.75 | 0.61 | 5.5 | 290 |
| Example 13-3 | | In GB | 0.77 | 0.65 | 5.7 | 910 |
| Example 14-2 | Compound 114 | In air | 0.77 | 0.61 | 5.5 | 330 |
| Example 14-3 | | In GB | 0.78 | 0.63 | 5.6 | 960 |
| Example 15-2 | Compound 115 | In air | 0.75 | 0.61 | 5.9 | 400 |
| Example 15-3 | | In GB | 0.78 | 0.63 | 6.1 | 1200 |
| Example 16-2 | Compound 116 | In air | 0.8 | 0.6 | 5.3 | 300 |
| Example 16-3 | | In GB | 0.8 | 0.58 | 5.7 | 500 |
| Example 17-2 | Compound 117 | In air | 0.71 | 0.56 | 5.9 | 400 |
| Example 17-3 | | In GB | 0.72 | 0.54 | 6.1 | 600 |
| Example 18-2 | Compound 118 | In air | 0.76 | 0.55 | 6.1 | 350 |
| Example 18-3 | | In GB | 0.76 | 0.53 | 6.3 | 550 |
| Comparative Example 1-2 | Comparative Compound 1 | In air | 0.5 | 0.51 | 3.1 | 80 |
| Comparative Example 1-3 | | In GB | 0.51 | 0.55 | 3.3 | 100 |
| Comparative Example 2-2 | Comparative Compound 2 | In air | 0.51 | 0.49 | 2.7 | 85 |
| Comparative Example 2-3 | | In GB | 0.54 | 0.52 | 3.3 | 95 |

From the results of Table 2, it was found that in the Examples using the conjugated polymer compounds of the present invention, higher photoelectric conversion efficiency is obtained as compared with Comparative Examples. Furthermore, also for the Voc (open circuit voltage) and FF (fill factor), higher values were obtained in the Examples, compared with the Comparative Examples.

Furthermore, in regard to the evaluation of durability of the elements, durability was markedly increased in the Examples, both in the case of forming the hole transport layer in air and in the case of forming the hole transport layer in a glove box, as compared with the Comparative Examples (LT80 was increased to 2.4 to 5 times in air, and 6.2 to 12.6 times in GB). The extent of enhancement in durability in these inversion layer type elements was larger than the extent of enhancement in durability in the ordered layer type elements that will be described below.

Furthermore, it was found that in the examples in which the hole transport layer was formed in a glove box with less oxygen and moisture, the photoelectric conversion efficiency, FF (fill factor), and durability of the element were further enhanced as compared with the examples in which the hole transport layer was formed in air.

Production of Ordered Layer Organic Photoelectric Conversion Element

Example 7-4

Formation of Transparent Electrode (Positive Electrode)

A transparent electrode functioning as a positive electrode was formed by the same method as that used in Example 1-2 "Formation of transparent electrode (negative electrode)."

(Formation of Hole Transport Layer)

On the transparent electrode, conductive polymer BAYTRON (registered trademark) P4083 (manufactured by Starck Vtech, Ltd.) was spin coated to a film thickness of 30 nm, and then the film was heated and dried for 10 minutes in air at 140° C. This was introduced into a glove box and was heat treated again for 10 minutes in a nitrogen atmosphere at 140° C. Thus, a hole transport layer was formed.

Furthermore, the subsequent operation was also carried out in a glove box in a nitrogen atmosphere.

(Formation of Photoelectric Conversion Layer)

A mixed solution was prepared by dissolving 0.6% by mass of the compound 107 synthesized in Synthesis Example 7-1 as a p-type organic semiconductor and 0.9% by mass of PCBM as an n-type organic semiconductor in chlorobenzene.

While this mixed solution was filtered using a filter having a pore size of 0.45 μm, the mixed solution was spin coated (at 700 rpm for 60 seconds, and then at 2200 rpm for one second) to a film thickness after drying of 160 nm. Thereafter, this was dried for 30 minutes at room temperature (25° C.), and thereby a photoelectric conversion layer was formed.

[Synthesis of Electron Transport Layer Compound T]

A compound S was synthesized by making reference to Adv. Mater., 2007, 19, 2010. The weight average molecular weight of the compound S was 4400.

1.0 g of this compound S, and 9.0 g of 3,3'-iminobis(N,N-dimethylpropylamine) manufactured by Sigma-Aldrich Co. LLC. were dissolved in 100 ml of tetrahydrofuran and 100 ml of N,N-dimethylformamide, and the solution was stirred for 48 hours at room temperature. After completion of the reaction, the solvent was distilled off under reduced pressure, and was further reprecipitated in water. Thus, 1.3 g of a compound T was obtained (yield: 90%). For the compound thus obtained, the structure was characterized by $^1$H-NMR. The results are presented as follows.

7.6 to 8.0 ppm (br), 2.88 ppm (br), 2.18 ppm (m), 2.08 ppm (s), 1.50 ppm (m), 1.05 ppm (br).

[Chemical Formula 72]

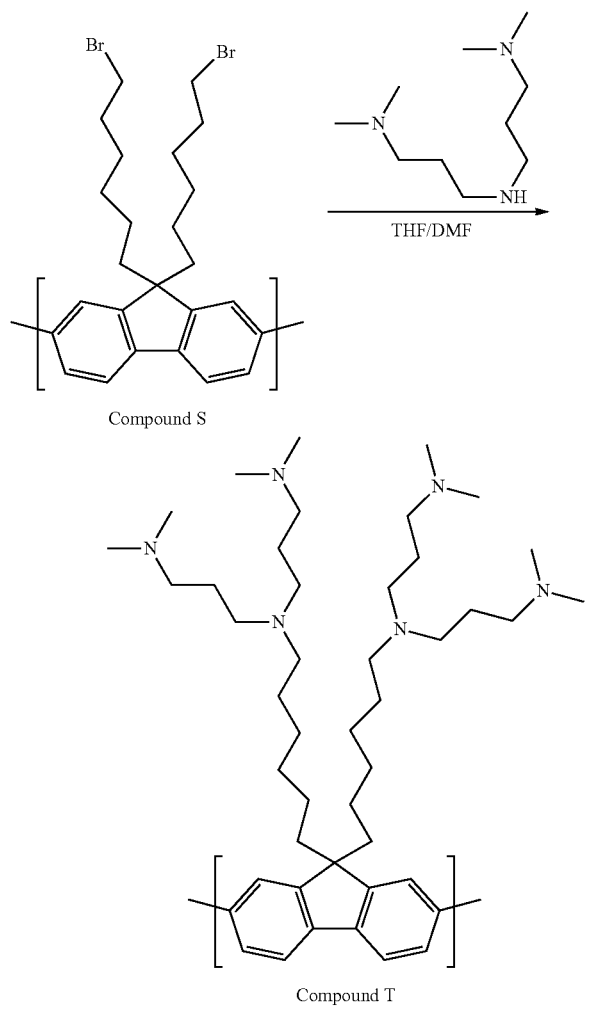

Compound S

Compound T (Formation of Electron Transport Layer)

Subsequently, the compound T was dissolved in hexafluoroisopropanol to a concentration of 0.02% by mass to prepare a solution, and the solution was applied and dried on the photoelectric conversion layer using a blade coater such that the dried film thickness would be about 5 nm. Thereafter, the film was heat treated for 2 minutes with hot air at 100° C., and thus an electron transport layer was produced.

(Formation of Counter Electrode (Negative Electrode) and Sealing)

The laminate thus obtained was placed in a vacuum deposition apparatus without exposing the laminate to air. The laminate was mounted such that a shadow mask having a width of 2 mm would be disposed perpendicularly to the transparent electrode, the interior of the vacuum deposition apparatus was depressurized to $10^{-3}$ Pa or less, and then silver was vapor deposited to a thickness of 100 nm as a counter electrode. Furthermore, the rate of vapor deposition was set to 2 nm/second, and the deposition was achieved to a size of 2 mm on each edge. Finally, the laminate was subjected to heating for 30 minutes at 120° C., and thus an electron transport layer and a counter electrode were formed.

The laminate thus obtained was bonded with a transparent barrier film GX (water vapor permeability: 0.05 g/m²/d, manufactured by Toppan Printing Co., Ltd.) and sealed using a UV-curable resin (UV RESIN XNR 5570-B1, manufactured by Nagase ChemteX Corp.) in a nitrogen atmosphere. Thereby, an organic photoelectric conversion element was completed and was taken out in air.

Examples 11-4, 14-4 and 15-4

Ordered layer organic photoelectric conversion elements were produced by the same method as that used in Example 7-4, except that the compounds 111, 114 and 115 synthesized in Synthesis Examples 11-1, 14-1 and 15-1, respectively, were used as p-type organic semiconductors in the formation of the photoelectric conversion layer.

Comparative Examples 1-4 to 2-4

Ordered layer organic photoelectric conversion elements were produced by the same method as that used in Example 7-4, except that the Comparative Compounds 1 and 2 were respectively used as the p-type organic semiconductors in the formation of the photoelectric conversion layer.

<Evaluation of Ordered Organic Photoelectric Conversion Elements>

(Evaluation of Open Circuit Voltage, Fill Factor and Photoelectric Conversion Efficiency)

Evaluations of the open circuit voltage, fill factor and photoelectric conversion efficiency were carried out by the same method as that used for the <Evaluation of inversion layer organic photoelectric conversion elements>. The results are presented in Table 3.

(Evaluation of Durability)

An evaluation of durability was carried out by the same method as that used for the <Evaluation of inversion layer organic photoelectric conversion elements>. The results are presented in Table 3.

TABLE 3

| | p-type organic semiconductor | $V_{oc}$ | FF | Photoelectric conversion efficiency [%] | LT80 [h] |
|---|---|---|---|---|---|
| Example 7-4 | Compound 107 | 0.68 | 0.59 | 5.3 | 100 |
| Example 11-4 | Compound 111 | 0.71 | 0.59 | 5.9 | 120 |
| Example 14-4 | Compound 114 | 0.72 | 0.6 | 6.1 | 130 |

TABLE 3-continued

| | p-type organic semiconductor | $V_{oc}$ | FF | Photoelectric conversion efficiency [%] | LT80 [h] |
|---|---|---|---|---|---|
| Example 15-4 | Compound 115 | 0.77 | 0.6 | 6.1 | 200 |
| Comparative Example 1-4 | Comparative Compound 1 | 0.56 | 0.55 | 3.8 | 20 |
| Comparative Example 2-4 | Comparative Compound 2 | 0.56 | 0.55 | 3.8 | 20 |

From the results of Table 3, it was found that the ordered layer organic photoelectric conversion elements of the Examples using the conjugated polymer compounds of the present embodiment can give higher photoelectric conversion efficiency than Comparative Examples. Furthermore, also for the $V_{oc}$ (open circuit voltage) and FF (fill factor), higher values were obtained in the ordered layer organic photoelectric conversion elements of the Examples than in the Comparative Examples. Furthermore, it was found that the ordered layer organic photoelectric conversion elements of the Examples had enhanced durability of the elements (LT80 was increased to 5 to 10 times), as compared with Comparative Examples.

The present application is based on Japanese Patent Application No. 2011-250144 filed Nov. 15, 2011, the disclosure of which is incorporated herein by reference in its entirety.

DESCRIPTION OF REFERENCE SYMBOLS

10 ORGANIC PHOTOELECTRIC CONVERSION ELEMENT
11 SUBSTRATE
12 TRANSPARENT ELECTRODE
13 COUNTER ELECTRODE
14 PHOTOELECTRIC CONVERSION LAYER
14' FIRST PHOTOELECTRIC CONVERSION LAYER
15 CHARGE RECOMBINATION LAYER
16 SECOND PHOTOELECTRIC CONVERSION LAYER
17 HOLE TRANSPORT LAYER
18 ELECTRON TRANSPORT LAYER
20 PHOTOSENSOR ARRAY
21 SUBSTRATE
22 POSITIVE ELECTRODE
23 NEGATIVE ELECTRODE
24 PHOTOELECTRIC CONVERSION UNIT
24a BUFFER LAYER
24b PHOTOELECTRIC CONVERSION LAYER

What is claimed is:

1. An organic photoelectric conversion element comprising, on a transparent substrate, a transparent first electrode; a photoelectric conversion layer containing a p-type organic semiconductor material and an n-type organic semiconductor material; and a second electrode in this sequence,
   wherein the photoelectric conversion layer comprises a conjugated polymer compound having a partial structure represented by the following formula (1) as the p-type organic semiconductor material:

[Chemical Formula 1]

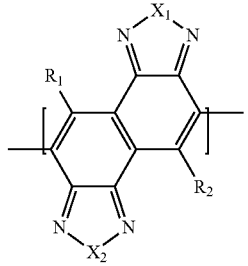

Formula (1)

wherein R1 and R2 each independently represent a hydrogen atom, an alkyl group having 1 to 30 carbon atoms which may be substituted, an alkoxy group having 1 to 30 carbon atoms which may be substituted, an alkyl ester group having 2 to 30 carbon atoms which may be substituted, a halogen atom, an alkoxycarbonyl group having 2 to 30 carbon atoms which may be substituted, an alkylaminocarbonyl group having 2 to 40 carbon atoms which may be substituted, an acyl group having 2 to 30 carbon atoms which may be substituted, an amino group which may be substituted, an acylamino group having 2 to 30 carbon atoms which may be substituted, an aryl group having 6 to 30 carbon atoms which may be substituted, or a heterocyclic group having 3 to 30 carbon atoms which may be substituted;

X1 and X2 each independently represent:

[Chemical Formula 2]

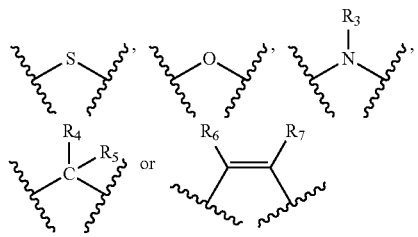

wherein R3 to R7 each independently represent a hydrogen atom, an alkyl group having 1 to 30 carbon atoms which may be substituted, an alkoxy group having 1 to 30 carbon atoms which may be substituted, an alkyl ester group having 2 to 30 carbon atoms which may be substituted, a halogen atom, an alkoxycarbonyl group having 2 to 30 carbon atoms which may be substituted, an alkylaminocarbonyl group having 2 to 40 carbon atoms which may be substituted, an acyl group having 2 to 30 carbon atoms which may be substituted, an amino group which may be substituted, an acylamino group having 2 to 30 carbon atoms which may be substituted, an aryl group having 6 to 30 carbon atoms which may be substituted, or a heterocyclic group having 3 to 30 carbon atoms which may be substituted; and when R6 and R7 are aryl groups, they may be bonded to each other and form a ring;

provided that X1 and X2 do not simultaneously represent:

[Chemical Formula 3]

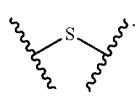

2. The organic photoelectric conversion element according to claim 1, wherein at least one of X1 and X2 represents:

[Chemical Formula 4]

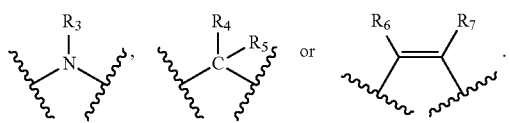

3. The organic photoelectric conversion element according to claim 2, wherein at least one of X1 and X2 represents:

[Chemical Formula 5]

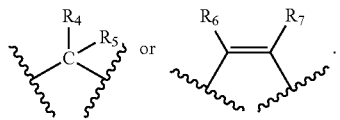

4. The organic photoelectric conversion element according to claim 3, wherein at least one of X1 and X2 represents:

[Chemical Formula 6]

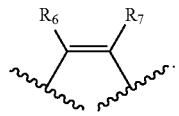

5. The organic photoelectric conversion element according to claim 1, wherein at least one of R6 and R7 represents an aryl group having 6 to 30 carbon atoms which may be substituted, or a branched alkyl group having 4 to 30 carbon atoms which may be substituted.

6. The organic photoelectric conversion element according to claim 5, wherein R6 and R7 both represent an aryl group having 6 to 30 carbon atoms which may be substituted, or a branched alkyl group having 4 to 30 carbon atoms which may be substituted.

7. The organic photoelectric conversion element according to claim 1, wherein R6 and R7 both represent a substituent substituted with a halogen atom, a halogenated alkyl group having 1 to 20 carbon atoms, a cyano group, an acyl group having 2 to 20 carbon atoms, or a nitro group.

8. The organic photoelectric conversion element according to claim 1, wherein the conjugated polymer compound having a partial structure represented by formula (1), further contains a partial structure represented by the following formula (3):

[Chemical Formula 7]

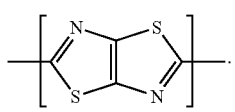

Formula (3)

9. The organic photoelectric conversion element according to claim 8, wherein the conjugated polymer compound having a partial structure represented by formula (1) further contains a partial structure represented by the following formula (3'):

[Chemical Formula 8]

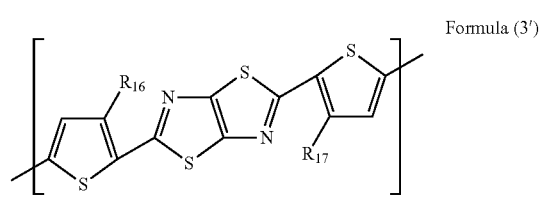

Formula (3')

wherein in formula (3'), R16 and R17 each independently represent a hydrogen atom, an alkyl group having 1 to 30 carbon atoms which may be substituted, an alkoxy group having 1 to 30 carbon atoms which may be substituted, an alkyl ester group having 2 to 30 carbon atoms which may be substituted, a halogen atom, an alkoxycarbonyl group having 2 to 30 carbon atoms which may be substituted, an alkylaminocarbonyl group having 2 to 40 carbon atoms which may be substituted, an acyl group having 2 to 30 carbon atoms which may be substituted, an amino group which may be substituted, or an acylamino group having 2 to 30 carbon atoms which may be substituted.

10. The organic photoelectric conversion element according to claim 1, wherein the conjugated polymer compound having a partial structure represented by formula (1) further comprises a partial structure represented by the following formula (2) or formula (2'):

[Chemical Formula 9]

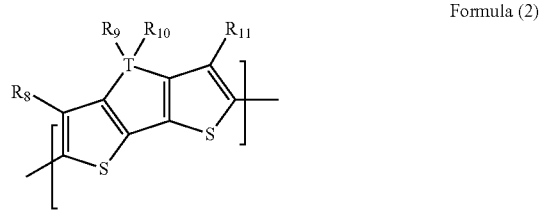

Formula (2)

wherein T represents an atom selected from carbon, silicon and germanium; R8 and R11 each independently represent a hydrogen atom, a halogen atom or an alkyl group having 1 to 20 carbon atoms which may be substituted; R9 and R10 each independently represent an alkyl group having 1 to 20 carbon atoms which may be substituted;

[Chemical Formula 10]

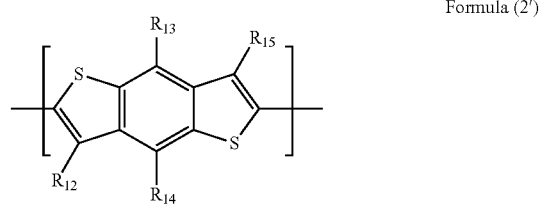

Formula (2')

wherein R12 and R15 each independently represent a hydrogen atom, a halogen atom, or an alkyl group having 1 to 20 carbon atoms which may be substituted; and R13 and R14 each independently represent an alkyl group having 1 to 20 carbon atoms which may be substituted, or an alkoxy group having 1 to 20 carbon atoms which may be substituted.

11. The organic photoelectric conversion element according to claim 1, wherein the photoelectric conversion layer is a photoelectric conversion layer produced by a solution coating method.

12. The organic photoelectric conversion element according to claim 1, wherein the organic photoelectric conversion element has an inversion layer configuration in which the work function of the first electrode is smaller than the work function of the second electrode.

13. A solar cell comprising the organic photoelectric conversion element according to claim 1.

14. A photosensor array comprising the organic photoelectric conversion elements according to claim 1 disposed in an array form.

* * * * *